United States Patent
Suzuki et al.

(10) Patent No.: US 6,235,438 B1
(45) Date of Patent: *May 22, 2001

(54) PROJECTION EXPOSURE METHOD AND APPARATUS

(75) Inventors: Kousuke Suzuki, Tokyo; Minoru Onda, Kawasaki, both of (JP)

(73) Assignee: Nikon Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/166,884

(22) Filed: Oct. 6, 1998

(30) Foreign Application Priority Data

Oct. 7, 1997 (JP) .................................................. 9-274173
Oct. 9, 1997 (JP) .................................................. 9-291807

(51) Int. Cl.⁷ ..................................................... G03F 9/00
(52) U.S. Cl. ............................................................ 430/30
(58) Field of Search ........................................ 430/30, 311

(56) References Cited

U.S. PATENT DOCUMENTS

| | | | |
|---|---|---|---|
| 5,307,207 | 4/1994 | Ichihara | 359/622 |
| 5,534,970 | 7/1996 | Nakashima et al. | 355/53 |
| 5,559,584 | 9/1996 | Miyaji et al. | 355/73 |
| 5,581,324 | 12/1996 | Miyai e tal. | 355/53 |
| 5,721,608 | 2/1998 | Taniguchi | 355/53 |
| 5,796,469 | 8/1998 | Ebinuma | 355/53 |
| 5,864,433 | 1/1999 | Takahashi et al. | 359/637 |
| 5,879,845 * | 3/1999 | Takahashi | 430/30 |
| 5,894,056 | 4/1999 | Kakizaki et al. | 430/5 |
| 5,945,239 * | 8/1999 | Taniguchi | 430/30 |
| 5,952,133 * | 9/1999 | Nakasuji | 430/30 |

FOREIGN PATENT DOCUMENTS

| | | |
|---|---|---|
| 0 614 124 | 9/1994 | (EP) . |
| 63-128713 | 6/1988 | (JP) . |
| 1-259533 | 10/1989 | (JP) . |
| 2-106917 | 4/1990 | (JP) . |
| 4-133414 | 5/1992 | (JP) . |
| 4-192317 | 7/1992 | (JP) . |
| 4-355419 | 12/1992 | (JP) . |
| 6-260385 | 9/1994 | (JP) . |
| 6-291016 | 10/1994 | (JP) . |
| 6-310399 | 11/1994 | (JP) . |
| 7-142354 | 6/1995 | (JP) . |
| 7-183214 | 7/1995 | (JP) . |
| 7-220989 | 8/1995 | (JP) . |
| 8-162397 | 6/1996 | (JP) . |
| 9-162106 | 6/1997 | (JP) . |
| 9-186082 | 7/1997 | (JP) . |
| 10-54932 | 2/1998 | (JP) . |

\* cited by examiner

*Primary Examiner*—Christopher G. Young
(74) *Attorney, Agent, or Firm*—Vorys, Sater, Seymour and Pease LLP

(57) ABSTRACT

A projection exposure apparatus comprises a projection optical system for projecting a pattern of a mask on a photosensitive substrate; a plane-parallel plate disposed on a side of the photosensitive substrate of the projection optical system, almost perpendicularly to an optical axis of the projection optical system; and a adjustment device for adjusting at least one of an inclination angle of a normal line of the plane-parallel plate relative to the optical axis of the projection optical system and an inclination angle of the plane-parallel plate.

91 Claims, 21 Drawing Sheets

X-MAGNIFICATION 1

X-MAGNIFICATION 2

X-MAGNIFICATION INCLINATION 1

X-MAGNIFICATION INCLINATION 2

Y-SHIFT

ROTATION

X-SHIFT

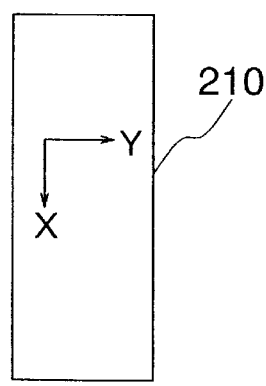
FIG. 20 a1
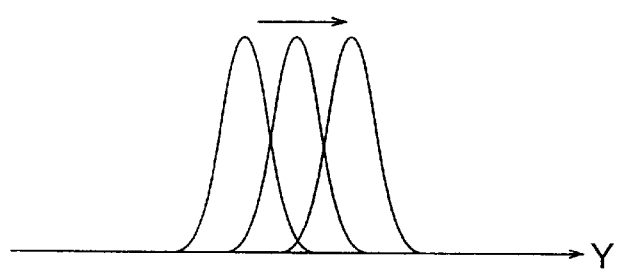
FIG. 20 b1
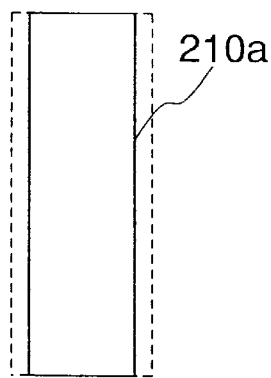
FIG. 20 a2
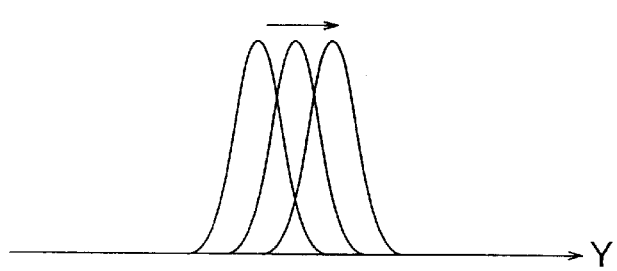
FIG. 20 b2
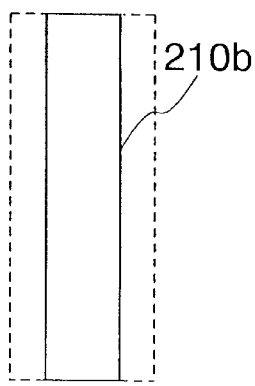
FIG. 20 a3
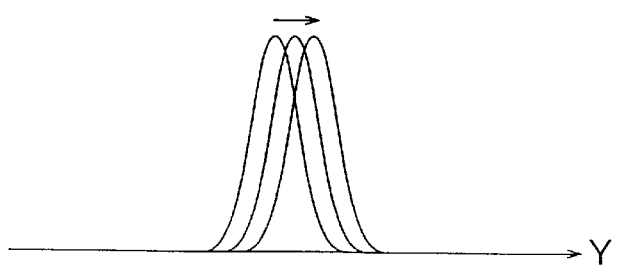
FIG. 20 b3

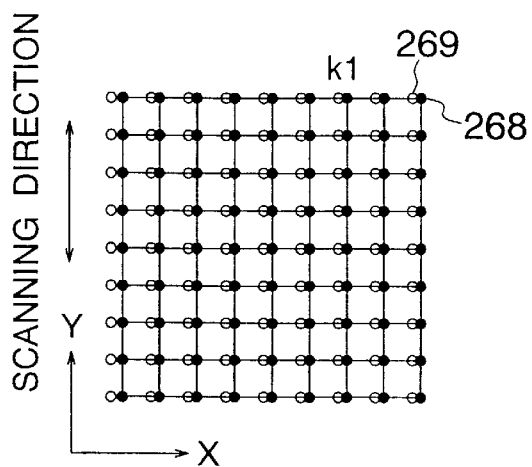
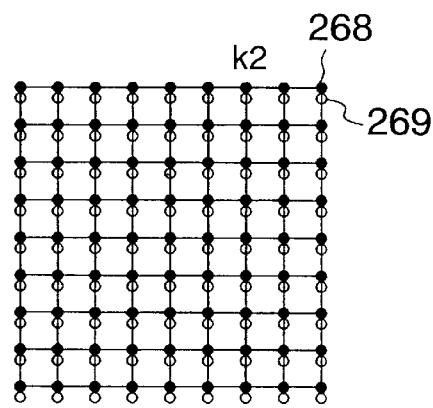
FIG. 21a  FIG. 21b
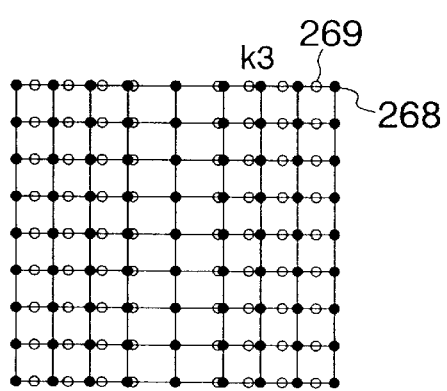
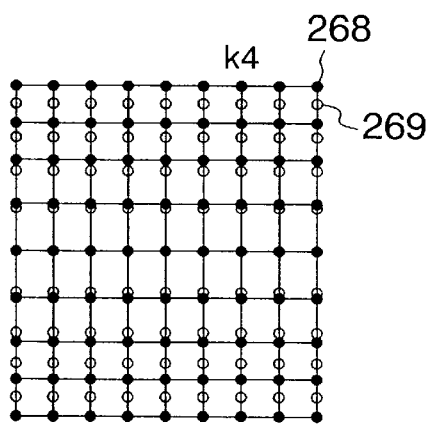
FIG. 21c  FIG. 21d
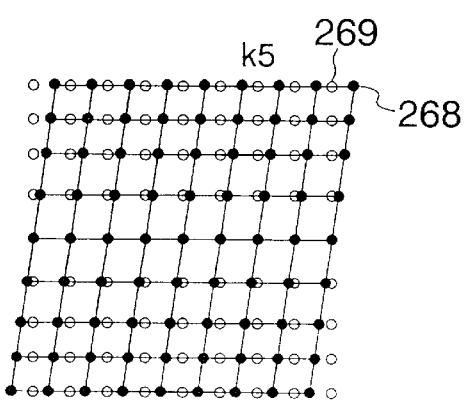
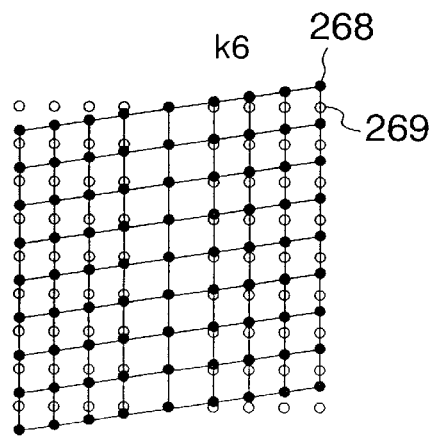
FIG. 21e  FIG. 21f

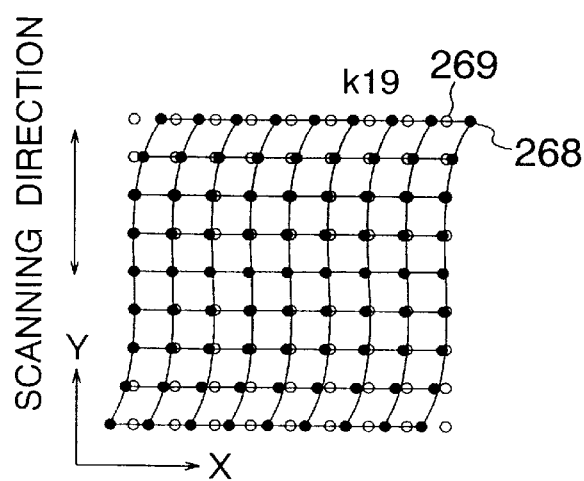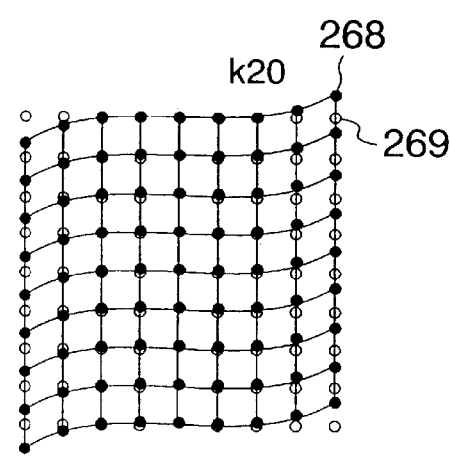
FIG. 24 a          FIG. 24 b

PROJECTION EXPOSURE METHOD AND APPARATUS

This application claims the benefit of Japanese Applications Nos. 9-274173 and 9-291807 which can hereby incorporated by reference.

BACKGROUND OF THE INVENTION

1. Field of the Invention

The present invention relates to a projection exposure method used when a mask pattern is transferred onto a substrate such as a wafer in a lithography step for manufacturing, for example, a semiconductor device, an image pick-up device (CCD and the like), and a liquid crystal display device and a thin film magnetic head and a projection exposure apparatus, and more particularly suitable used for a scan exposure type projection exposure apparatus such as step and scan system which comprises a correction mechanism for an image formation characteristic and scans a mask and a substrate in synchronization with a projection optical system to perform exposure.

2. Related Background Art

In the projection exposure apparatus which transfers a reticle pattern as a mask onto a wafer, a glass plate or the like coated with resist through a projection optical system, an exposure must be performed in a state where a high image formation characteristic is always kept. As one factor which exerts influence on the image formation characteristic, there has been thermal deformations of a reticle and optical elements of the projection optical system due to an irradiation of exposure light. In order to correct the change of the image formation characteristic resulting from the thermal deformation of the reticle by the exposure, various propositions have been heretofore made. For example, in Japanese Patent Application Laid-open No. Heisei 4(1992)-192317, a technology was proposed, in which the distribution of the quantity of deformation on a pattern plane of a reticle is computed, and the change of the image formation characteristic caused by this deformation is corrected either by driving parts of lens elements of the projection optical system toward an optical axis or by inclining them relative to the optical axis.

Furthermore, full-field type projection exposure apparatuses, that is, steppers, have been heretofore widely used. In order to perform a transfer for a reticle pattern of a large area with a high precision without increasing a size of the projection optical system, scan exposing type projection exposure apparatuses (scan type exposure apparatuses) such as a step and scan system in which the reticle and the substrate are exposed in synchronization with the projection optical system have been lately become of major interest. Also concerning the correction of the image formation characteristic due to irradiation of exposure light in this scan type exposure apparatus, a technology was proposed, in which the quantity of changes of the image formation characteristic of the projection optical system due to the irradiation is corrected by using the correction method employed in the case of the full-field type exposure apparatus, in Japanese Patent Application Laid-open No. Heisei 6(1994)-291016 and U.S. Pat. No. 5,721,608 related to this Japanese Patent Application Laid-open.

The correction method of the image formation characteristic of the scan type exposure apparatus uses almost the technology to which a system devised for the full-field type apparatus is applied. A correction method considering the change of the image formation characteristic of the whole of the apparatus which includes the reticle and the projection optical system particular to the scan type exposure apparatus, due to irradiation of exposure light, has not been existed.

However, an original pattern illustrated in the reticle used in the scan type exposure apparatus has a large area equal to that of the reticle for use in the full-field type exposure apparatus or an area larger than that. The entire surface of the original pattern is sequentially illuminated in a slit-shaped illumination region during the scan exposure. On the contrary, since the projection optical system is made to become a state where it is always irradiated in the slit-shaped illumination region asymmetrically, in a computing method concerning the quantity of the thermal deformation of the reticle and projection optical system and in a correction method of the corresponding image formation characteristic, the difference occurs naturally. Moreover, influences on the projected image formed on the wafer are different between the case of the thermal expansion of the reticle and the case of the thermal expansion of the projection optical system.

Furthermore, also in the full-field type projection exposure apparatus, the line width of the pattern to be subjected to a projection exposure has been recently finer more and more, and it has been required to correct the image formation characteristic more precisely.

SUMMARY OF THE INVENTION

A first object of the present invention is to provide a projection exposure method which is capable of correcting an image formation characteristic with a high precision.

A second object of the present invention is, especially in a scan type exposure apparatuses, to provide a projection exposure method which is capable of precisely obtaining the quantity of a change of the image formation characteristic, either due to an exposure light absorption of a projection optical system or due to a thermal deformation of a reticle, correcting the image formation characteristic according to the quantity of the change of the image formation characteristic with a high precision, and transferring a pattern image of the reticle onto a wafer with a high precision.

A third object of the present invention is to provide a projection exposure apparatus which is capable of embodying such projection exposure method.

A projection exposure apparatus of the present invention comprises a projection optical system for projecting a mask pattern onto a photosensitive substrate; a plane-parallel plate disposed on the photosensitive substrate side of the foregoing projection optical system, substantially perpendicular to an optical axis of the foregoing projection optical system; and an adjustment device for adjusting either an inclination angle of a normal line to the foregoing plane-parallel plate relative to an optical axis of the foregoing projection optical system or an inclination direction of the foregoing plane-parallel plate with respect thereto.

According to the preferred embodiment of the present invention, the projection exposure apparatus further comprises an illumination optical system for changing a size or shape of a secondary light source according to the foregoing mask pattern, wherein the foregoing adjustment device adjusts at least one of the inclination angle and inclination direction of the foregoing plane-parallel plate in response to the change of the foregoing secondary light source.

According to another embodiment of the present invention, in a projection exposure apparatus which exposes a photosensitive substrate by a pattern of a mask, provided is a projection optical system which includes a plurality of optical elements arranged along an optical axis substantially perpendicular to the mask and the foregoing photosensitive substrate, and a plane-parallel plate arranged on the foregoing photosensitive substrate side; and an adjustment device for adjusting an aberration of the foregoing projection optical system by moving the foregoing plane-parallel plate in response to a change of exposure conditions of the foregoing photosensitive substrate.

Furthermore, according to a preferred embodiment of the present invention, the foregoing adjustment device adjusts a decentration coma aberration of the foregoing projection optical system by relatively inclining the plane-parallel plate relative to a plane perpendicular to an optical axis of the foregoing projection optical system without substantially rotating the foregoing plane-parallel plane.

Still furthermore, according to a preferred embodiment of the present invention, in order to adjust at least one of the aberration other than the decentration coma aberration, projection magnification and focus position of the projection optical system, the projection exposure apparatus further comprises a driving instrument for driving at least one of the plurality of optical elements of the foregoing projection optical system.

Still furthermore, according to a preferred embodiment of the present invention, the projection exposure apparatus further comprises an illumination optical system for changing at least one of the size and shape of a secondary light source in response to the pattern of the foregoing mask; and an aperture diaphragm for allowing a numerical aperture of the foregoing optical system to be variable, wherein exposure conditions of the foregoing photosensitive substrate include at least one of the size and shape of the foregoing secondary light source, a sort of the pattern on the foregoing mask, and an numerical aperture of the foregoing projection optical system.

Furthermore, according to another embodiment of the present invention, in a projection exposure apparatus which exposes a photosensitive substrate by a pattern of a mask, provided is a projection optical system which includes a plane-parallel plate arranged along an optical axis substantially perpendicular to the foregoing mask and the foregoing photosensitive substrate; and a driving mechanism which inclines the foregoing plane-parallel plate relative to a plane perpendicular to an optical axis of the foregoing projection optical system.

Still furthermore, according to a preferred embodiment of the present invention, the projection exposure apparatus of the present invention further comprises a stage system which synchronously moves the foregoing mask and the foregoing photosensitive substrate at a speed ratio in response to a projection magnification of the projection optical system, wherein the foregoing photosensitive substrate is subjected to a scanning exposure by the pattern of the foregoing mask, by driving the foregoing stage system.

A first projection exposure method of the present invention which exposes a photosensitive substrate by a pattern of a mask through a projection optical system, comprises: a first step for changing a light intensity distribution on a pupil plane of the foregoing projection optical system of a beam of light which is emitted from a secondary light source and passes through the foregoing mask; and a second step for moving a plane-parallel plate in response to a change of the foregoing light intensity distribution, which is disposed on the photosensitive substrate side of the foregoing projection optical system.

Furthermore, according to a preferred embodiment of the present invention, in the foregoing first step, one of a size and a shape of the secondary light source is changed in accordance with the pattern of the foregoing mask.

Still furthermore, according to a preferred embodiment of the present invention, in the foregoing second step, the foregoing plane-parallel plate is relatively inclined relative to a plane perpendicular to an optical axis of the foregoing projection optical system without substantially rotating the foregoing plane-parallel plate and a decentration coma aberration of the foregoing projection optical system is adjusted.

A second projection exposure method according to the present invention in which by moving a mask and a substrate synchronously a pattern image of the mask is transferred onto the substrate through a projection optical system, at least one of the position of at least one of optical elements of a projection optical system in an optical axis direction, the inclination angle of at least one of the optical elements thereof in the optical axis direction, the relative scanning speed of the mask and substrate, and the parallelism of the mask and substrate in a scanning direction is adjusted before a scanning exposure or during the scanning exposure, so as to correct an image formation characteristic.

According to the projection exposure method of the present invention, before the scanning exposure or during the scanning exposure the position and inclination angle of at least one of the optical elements of the projection optical system is adjusted, whereby a magnification error of the projection optical system, a predetermined distortion thereof and the like are corrected. Moreover, by adjusting the relative scanning speed of the mask and the substrate, a magnification error of its projection image in the scanning direction can be corrected. By adjusting the parallelism of the mask and the substrate in the scanning direction, a parallelogram-shaped distortion for example, that is, so called a skew error, can be corrected. Particularly, if these adjustments are carried out during the scanning exposure, it is possible to cope with a partial thermal deformation of the mask in the scanning direction.

In a third projection exposure method of the present invention in which by moving a mask and a substrate synchronously a pattern image of the mask is transferred onto the substrate through a projection optical system, with regard to a change of an image formation characteristic due to a thermal deformation of the mask, its component in a scanning direction is corrected by adjusting a relative scanning speed of the mask and the substrate, and its component in a non-scanning direction is corrected by adjusting a projection magnification of the projection optical system.

According to such projection exposure method of the present invention, in the case where the mask is thermally expanded in the scanning direction, a scanning speed for the substrate is made to be slower than a reference speed determined by multiplying a scanning speed for the mask with the projection magnification of the projection optical system, whereby a magnification only in the scanning direction is corrected. On the other hand, in the case where the mask is thermally expanded in the non-scanning direction, that is, a direction perpendicular to the scanning direction, the projection magnification of the projection optical system is adjusted and the relative scanning speed of the mask and the substrate is adjusted so as to cancel it, whereby a magnification in the non-scanning direction is corrected.

In this case, by obtaining the quantity of heat absorption of the mask based on a thermal movement of the mask created outside a pattern region and a pattern existing rate of the mask, the quantity of the thermal deformation of the mask should be computed from the quantity of the heat absorption. With the consideration as to the thermal movement outside the pattern region and the pattern existing rate, the quantity of the thermal deformation of the mask can be obtained with a high precision, whereby the change of the image formation characteristic due to the thermal deformation can be corrected with a high precision in response to the obtained quantity of the thermal deformation of the mask.

In a fourth projection exposure method of the present invention in which by moving a mask and a substrate synchronously a pattern image of the mask is transferred onto the substrate through a projection optical system, a blind mechanism capable of adjusting a width of an illumination region of the mask is provided, and the blind mechanism is driven in accordance with a difference of the magnification changes of pattern images of the mask in scanning and non-scanning directions, which are formed on the substrate, whereby a contrast of a projection image is corrected.

According to such the projection exposure method of the present invention, if the width of the illumination region on the mask is made to be large in any of the scanning and non-scanning directions, an illuminance on the substrate in any of those directions becomes high. On the contrary, if the width of the illumination region thereon is made to be small, the illuminance in any of those directions becomes low. Moreover, if the illuminance is even on the mask, the illuminance on the substrate becomes lower, as the projection magnification becomes higher. As the projection magnification becomes lower, the illuminance on the substrate becomes higher. Therefore, when the magnifications in the scanning and non-scanning directions are different, the width of the illumination region is changes through the blind mechanism so as to cancel the difference, whereby the illuminances on the substrate in the scanning and non-scanning directions are kept uniform. As a result, contrast unevenness of the projection image can be removed.

In a fifth projection exposure method of the present invention in which by moving a mask and a substrate synchronously a pattern image of the mask is transferred onto the substrate through a projection optical system, a light transmission window of the projection optical system for use in a transmission rate measurement is provided on a mask stage for mounting the mask, and the transmission rate of the projection optical system is measured through the light transmission window.

According to such projection exposure method, by measuring the transmission rate of the projection optical system through the light transmission window on the mask stage, the change of the image formation characteristic of the projection optical system due to an exposure light absorption can be obtained, so that the image formation characteristic can be corrected based on the change thereof with a high precision.

In this case, two light transmission windows should be located interposing the mask therebetween so as to be separate from each other in the moving direction of the mask. Since either of the two light transmission windows can be used according to the scanning direction of the mask, a measurement efficiency is kept high.

In a sixth projection exposure method of the present invention in which an image of a pattern of a mask is transferred onto a substrate through a projection optical system, by driving a plurality of optical elements of the projection optical system individually, an image formation characteristic of the projection optical system is corrected, the projection optical system comprises a first plane-parallel plate on its substrate side, and the first plane-parallel plate is driven in a direction of an optical axis, whereby a predetermined image formation characteristic is corrected.

According to such projection exposure method of the present invention, by combining the drive of the plurality of optical elements of the projection optical system with the drive of the first plane-parallel plate thereof, various kinds of image formation characteristics can be corrected.

In this case, the projection optical system should comprise a second plane-parallel plate having a surface subjected to a predetermined roughening processing should be provided on its mask side, in order to correct a residual component of its aberration. It is possible to correct the remaining distortion by the second plane-parallel plate.

Moreover, an example of a structure may be adopted, in which the mask is illuminated by a beam of light from a secondary light source, and by driving the first plane-parallel plate every time when at least one of the size and shape of the secondary light source is changed, a decentration coma aberration of the projection optical system is corrected.

Furthermore, in the case where a ArF excimer laser is used as the exposure light source, it should be desirable that an atmosphere within the projection optical system is substituted with inert gas such as helium gas or nitrogen gas. In this case, in the case where the atmosphere within the projection optical system is substituted with inert gas, since oxygen showing a absorption band close to the wavelength (193 nm) of the ArF excimer laser light scarcely exists, a transmission rate for the exposure light increases. Similarly, also in the case where the atmosphere within the projection optical system is substituted with nitrogen gas, since the nitrogen gas hardly absorbs the ArF excimer laser light, the transmission rate for the exposure light increase.

Particularly, in the case where the atmosphere within the projection optical system is substituted with the inert gas, since a change of the atmospheric pressure affects scarcely on the inside of the projection optical system, the change of the image formation characteristic due to the change of the ambient pressure within the projection optical system can be controlled.

Furthermore, it is desirable that the ambient pressure within the projection optical system is measured and the image formation characteristic is corrected based on the measurement result. Since the image formation characteristic is made to change also by the change of the ambient pressure within the projection optical system, the image formation characteristic can be corrected with a higher precision by performing the correction in accordance with the change of the ambient pressure within the projection optical system.

Next, in a projection exposure apparatus of the present invention in which a pattern of a mask is transferred onto a substrate through a projection optical system, the projection optical system comprises a plurality of optical elements arranged between the mask and the substrate along an optical axis; a first plane-parallel plate disposed on the substrate side; and a second plane-parallel plate disposed on the mask side, wherein provided is a driving device which drives the first plane-parallel plate in order to adjust a decentration coma aberration of the projection optical system, and drives at least one of the plurality of optical elements without relatively moving the second plane-parallel plate with respect to the mask, in order to adjust at least one of the aberration other than the decentration coma aberration, projection magnification, and focus position of the projection optical system.

According to such projection exposure apparatus of the present invention, a sixth projection exposure method of the present invention can be embodied. In this case, the driving device moves at least three optical elements of the projection optical system, as an example. Thus, the projection magnification, the distortion and the astigmatic aberration can be adjusted.

It is also satisfactory that the driving device drives at least four optical elements of the projection optical system. Thus, the projection magnification, the distortion, the astigmatic aberration and the coma aberration can be adjusted.

Furthermore, it is also satisfactory that the driving device drives at least five optical elements of the projection optical system. Thus, the projection magnification, the distortion, the astigmatic aberration, the coma aberration and the spherical aberration can be adjusted.

In order to adjust the field curvature of the projection optical system, it is desirable that an adjustment device for changing the refractive index in at least one of a plurality of spaces formed by the mask and the plurality of optical elements is further provided.

Furthermore, when at least one of the size and shape of a secondary light source is changed in accordance with the pattern of the mask in an illumination optical system, it is desirable that at least one of the plurality of optical elements and the first plane-parallel plate is moved in response to the change of one of the size and shape of the secondary light source.

Furthermore, the projection optical apparatus further comprises a measuring instrument for measuring the ambient pressure in the projection optical system, and it is desirable that the driving device thereof moves at least one of the plurality of optical elements and the first plane-parallel plate in response to the change of the ambient pressure in the projection optical system.

Furthermore, it is desirable that the driving device relatively inclines the first plane-parallel plate relative to an image plane of the projection optical system without substantially rotating the first plane-parallel plate and adjusts a decentration coma aberration of the projection optical system.

Furthermore, it is desirable that the surface of the second plane-parallel plate is uneven so as to correct a symmetrical aberration of the projection optical system.

Furthermore, in order to perform the scanning exposure of the pattern of the mask onto the substrate, it is desirable that a stage system for synchronously moving the mask and the substrate is provided. This means that the present invention is applied to a scan exposing type projection exposure apparatus.

BRIEF DESCRIPTION OF THE DRAWINGS

For a more complete understanding of the present invention and the advantages thereof, reference is now made to the following description taken in conjunction with the accompanying drawing, in which;

FIGS. 3a and 3b are an explanatory view showing a structure of an adjustment device provided in the projection exposure apparatus of FIG. 1;

FIG. 20a1, FIG. 20a2, FIG. 20a3, FIG. 20b1, FIG. 20b2 and FIG. 20b3 are a view showing the a relation between a width of an aperture portion of the reticle blind of FIG. 7 and the quantity of a shift of a projection image;

FIGS. 21a to 21f are a view showing an example of a thermal deformation of the reticle corresponding to coefficients k1 to k6;

FIGS. 24a to 24b are a view showing an example of a thermal deformation of the reticle corresponding to coefficients k19 to k20.

DESCRIPTION OF THE PREFERRED EMBODIMENTS

FIRST EMBODIMENT

Figure 1:
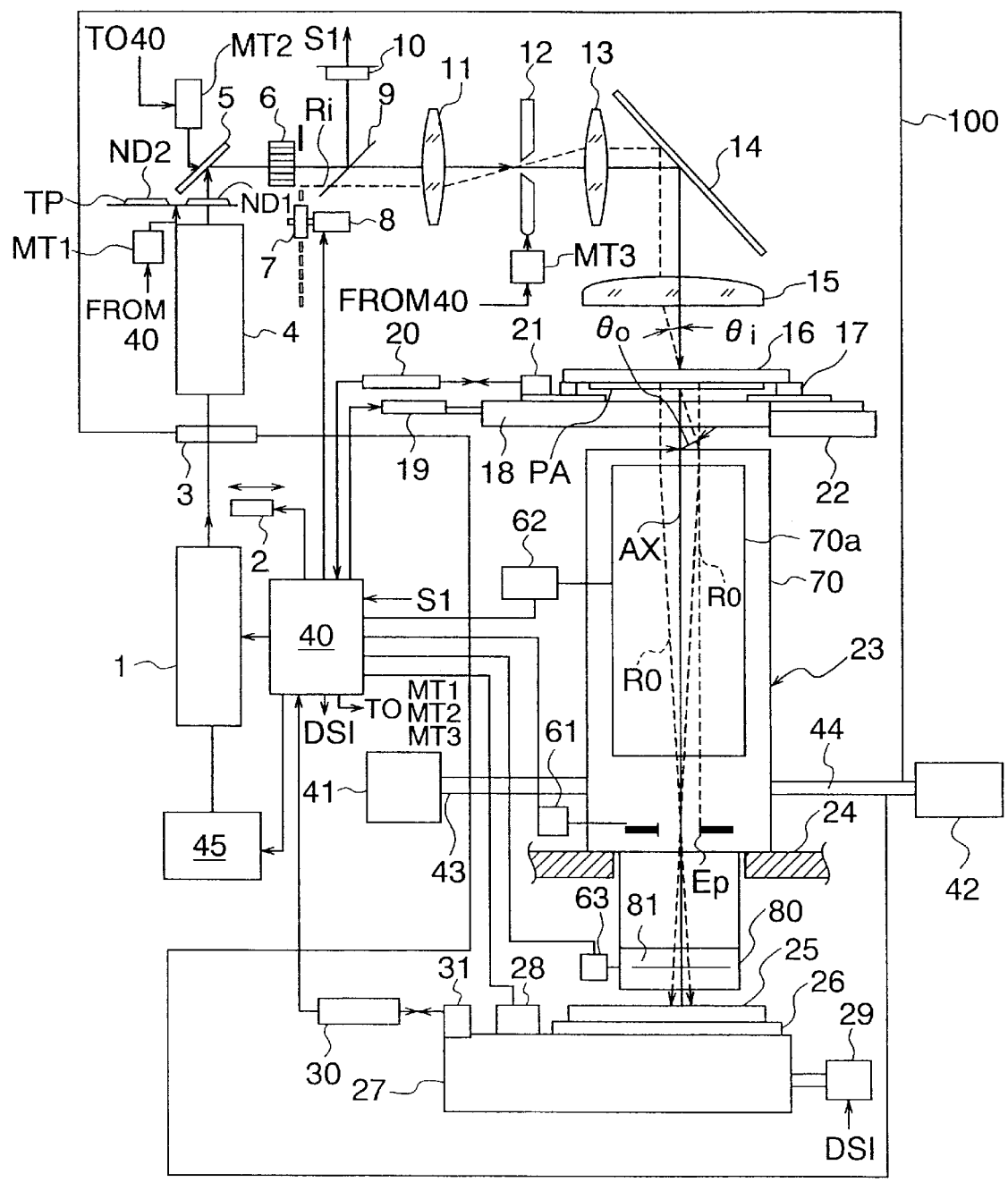
FIG. 1 is a view showing a structure of a projection exposure apparatus of a first embodiment of the present invention.

FIG. 1 is a schematic view for explaining a constitution of a projection exposure apparatus of a first embodiment of the present invention. As shown in FIG. 1, the projection exposure apparatus unit is accommodated in the chamber 100, and a temperature in the chamber 100 is controlled so as to be kept constant.

First of all, an outline of an illumination optical system for illuminating the reticle 16 that is a mask arranged at a suitable position of the chamber 100 will be briefly described. The ArF excimer laser beam source 1 provided outside the chamber 100 emits a laser beam as approximately parallel luminous flux. The laser beam from the ArF excimer light source 1 is guided to the light transmission window 3 provided in the main unit of the projection exposure apparatus unit via the shutter 2. Laser beam 3 passing through the light transmission window 3 is formed to a laser beam showing a predetermined section shape by the beam shaping optical system 4 provided in the chamber 100, and reflected by the reflection mirror 5 after passing through any one (ND1 in FIG. 1) of a plurality of ND filters provided in the turret plate TP, each of which shows a different transmittance from others. The laser beam reflected is guided to the fly eye lens 6 that is an optical integrator (homogenizer).

The luminous flux from a plurality of secondary light sources formed by the fly eye lens 6 passes through a variable aperture diaphragm of the turret plate 7 and is divided into two optical paths by the beam splitter 9. The reflected light from the beam splitter 9 is guided to the photoelectric detector 10, and the illuminance (or intensity) of the illumination light is detected by the detector 10. A signal in accordance with the detected illuminance is input to the main controller 40. On the other hand, a transmitted light from the beam splitter 9 passes through a pair of relay lenses 11 and 13 interposing the variable field diaphragm 12, and is reflected by the reflection mirror 14. Thereafter, the reflected light is collected by the condenser optical system 15 which is composed of refracting optical elements such as a plurality of lenses. Thus, the illumination region on the reticle 16, which is defined by an aperture of the variable field diaphragm 12 provided between the relay lenses 11 and 13, is approximately uniformly illuminated superposably.

Next, the projection optical system 23 for projecting a circuit pattern formed on the reticle 16 onto the wafer 25 that is a photosensitive substrate will be briefly described. The projection optical system 23 comprises a main unit section 70 composed of a plurality of lenses that are optical elements; and an adjustment device 80 for adjusting a specific aberration of the main unit section 70 by moving the plane-parallel plate 81 arranged at the lower position of the unit section 70. The reduction image of the circuit pattern on the reticle 16, which is illuminated the illumination optical system, is projected onto the wafer 25 by the projection optical system 23. The resist coated on the wafer 25 is exposed to the projected laser beam, and the image of the circuit pattern is transferred onto the wafer 25.

Details of each portions of the projection exposure apparatus will be described below. The ArF excimer laser beam source 1 generates a laser beam of a wavelength, for example, 193 nm. This ArF excimer laser beam source 1 oscillates to generate pulse light in response to trigger pulses sent from the light source control circuit 45. The light source control circuit 45 adjusts the applied voltage (charged voltage) to the ArF excimer laser beam source 1, thereby adjusting the intensity of the pulse light emitted from the ArF excimer laser beam source 1. It is noted that the light source control circuit 45 controls the ArF excimer laser beam source 1 in accordance with the instruction from the main controller 40 which controls the whole of the projection exposure apparatus.

The shutter 2 closes the illumination optical path during, for example, replacing a wafer or a reticle with new one, whereby the ArF excimer laser beam source 1 performs a self-oscillation to stabilize (adjust) the beam characteristic including at least one of the central wavelength, wavelength width and intensity of the pulse light.

The turret plate TP holds six ND filters (only ND1 and ND2 are shown in FIG. 1), and the turret plate TP is rotated by the motor MT1 controlled by the main controller 40, whereby the six filters are provided so that each of them is rotatively located in the illumination optical path. Here, the six ND filters are suitably selected in accordance with the resist sensitivity the wafer 25, the intensity variation of the ArF excimer laser beam source 1 and the number of pulse light beams to be irradiated onto one spot on the wafer 25 (the number of exposure pulses). The number of the exposure light pulses is the number of the pulse beams irradiated onto one spot on the wafer 25, while this spot runs along its scanning direction across the region conjugated with the illumination region on the reticle 16 with respect to the projection optical system 23. It is noted that the illumination region on the reticle 6 is defined by the variable field diaphragm 12, and the conjugated region is a region onto which a partial image of the pattern of the reticle 16 existing in the illumination region is projected.

Instead of the turret plate TP in FIG. 1, the structure may be adopted which is constituted in such way that two plates having a plurality of slits are arranged so as to face each other and the intensity of the pulse light is adjusted by relatively moving them in an arrangement direction of the slits.

In this embodiment, the projection exposure apparatus is designed such that the intensity of the pulse light on the reticle 16, that is, on the wafer 25 can be adjusted with at least one of the adjustments of the oscillation intensity of the ArF excimer laser beam source 1 by the light source control circuit 45 and the transmittance (light extinction rate) of the pulse light by the turret plate TP.

While the pattern image of the reticle 16 is projected onto the wafer 25 by the exposure performed by synchronously moving the reticle 16 and the wafer 25, the mirror 5 is rotated by the motor MT2. The control method of the mirror 5 was disclosed in, for example, Japanese Patent Application Laid-open No. Heisei 7(1995)-142354 and U.S. Pat. No. 5,534,970 related to this application. By the rotation of the mirror 5, interference fringes such as speckles move in the illumination region on the reticle 16 during the scanning exposure, which illumination region is defined by the variable field diaphragm 12, and whereby the distribution of the totaling quantity of the pulse light on the wafer 25 is made to be approximately uniformalized.

In this method, along with the rotation of the mirror 5 controlled by the main controller 40, the interference fringes are made to rotate once while one spot on the reticle 16 runs across the illumination region along the scanning direction. Moreover, it is desirable that the reflection mirror 5 is made to vibrate so that in the illumination region the interference fringes moves in the scanning direction and the direction perpendicular to the scanning direction. It should be noted that when the interference fringes are moved along the scanning direction of the reticle 16 in the illumination region, the angle of the reflection mirror 5 between a pair of the front and rear pulse light beams, that is, the quantity of the movement of the interference fringes, is determined with consideration of the movement distance of the reticle 16 relative to the illumination region between the pair of the pulse lights, so that the positional relation between one spot on the reticle 16 and the interference fringes suitably changes while one spot on the reticle 16 runs across the illumination region.

The fly eye lens 6 is constituted by a large number of lens elements which are tied up in a bundle. A large number of light source images (secondary light source) corresponding to the number of the lens elements are formed on the emission end plane side of the fly eye lens 6.

Although the one fly eye lens is provided in this embodiment, a second fly eye lens may be provided between the reflection mirror 5 and the turret plate TP, as disclosed in, for example, Japanese Patent Application Laid-open No. Heisei 1(1989)-259533 and U.S. Pat. No. 5,307,207 related to this application. Moreover, instead of the fly eye lens 6, an internal reflection type rod integrator may be employed.

In the neighborhood of the position where a large number of secondary light sources are formed by the fly eye lens 6, the turret plate 7 for adjusting at least one of the size and shape of the secondary light source as a whole is provided.

Figure 2:
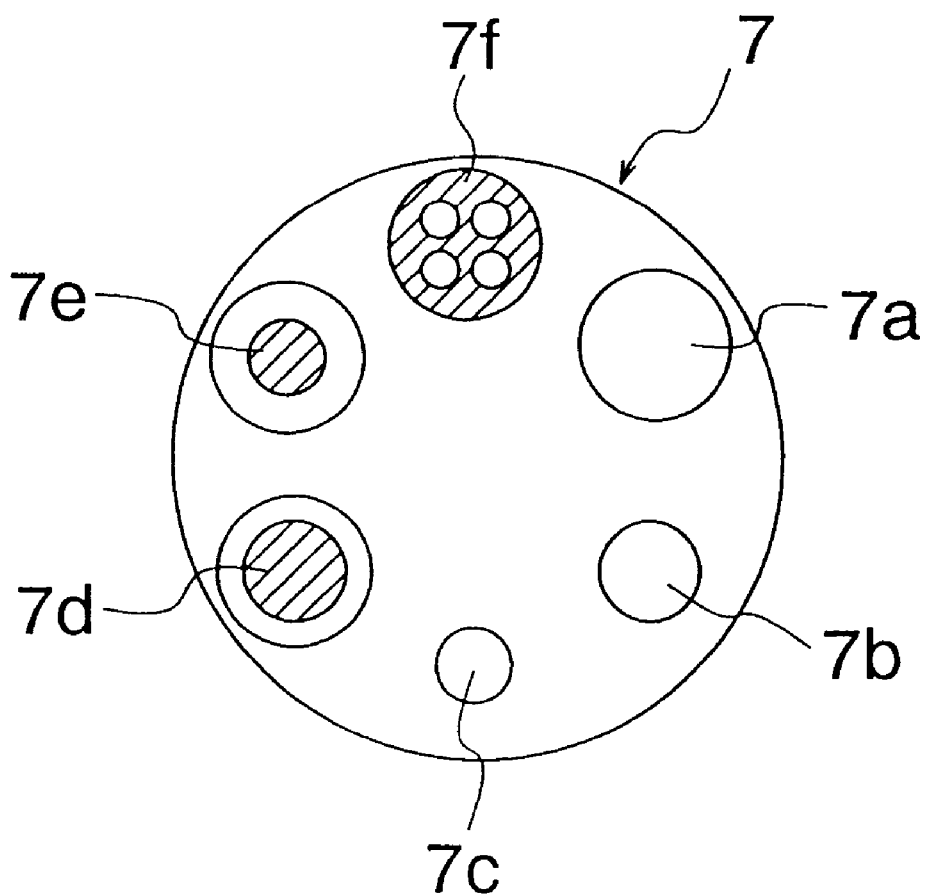
FIG. 2 is an explanatory view showing a structure of a turret plate incorporated into the projection exposure apparatus of FIG. 1.

The turret plate 7 is composed of a transparent substrate made of quarts. As shown in FIG. 2, a plurality of aperture diaphragm 7a to 7f, each of which is different from others in at least one of its size and shape, are formed. Among these, the three aperture diaphragms 7a to 7c having a circular aperture are for actively changing the values (coherent factor). Moreover, the remaining three aperture diaphragms 7d to 7f are for increasing the resolution (focal depth) of the projection optical system. The aperture diaphragm 7d and 7e are the ones, each of which has a different ring zone ratio, that is, a ratio of the internal diameter to the external diameter of the ring zone aperture. The remaining one aperture diaphragm 7f is the one which has four eccentric apertures to form four eccentric secondary light source regions.

Here, the brief description for the value will be given. As shown in FIG. 1, when the numerical aperture of the illumination optical system is denoted as NAi (=sin θi), which is determined by the principal ray Ri travelling in parallel with the optical axis AX from the outermost periphery (outermost diameter) of the aperture diaphragm on the turret plate 7 inserted on the optical path of the illumination optical system, and moreover when the numerical aperture on the illumination optical system side (reticle side) of the projection optical system 23 is denoted as NAO (=sin θ0), which is determined by the primary ray RO travelling in parallel with the optical axis AX from the outermost periphery of the aperture diaphragm Ep of the projection optical system 23, the value is defined as σ=NAi/NA0. Generally, the projection exposure apparatus is constituted such that its value in photolithography steps is set to a range of 0.3 to 0.8.

The turret plate 7 is rotatively driven by the motor 8 which is controlled by the main controller 40, and inserted on the optical path of the illumination optical system by selecting one aperture diaphragm in accordance with the pattern of the reticle 16 to be transferred onto the wafer 25.

The variable field diaphragm 12 defines the illumination region on the reticle 16, and the width of the illumination region in the scanning direction of the reticle 16 is narrower than the pattern region. Moreover, the width of the illumination region in the direction perpendicular to the scanning direction thereof is wider than the pattern region. The illumination region has a center at the optical AX of the projection optical system 23, and extends in the circular image field of the projection optical system 23 along its diameter.

Moreover, at least one blade constituting the variable field diaphragm 12 is moved by the motor MT3 controlled by the main controller 40, whereby the shape and size of the rectangular aperture 12 can be changed. Particularly, when the width of the rectangular aperture in the lateral direction is changed, the width of the illumination region on the reticle 16 in the scanning direction changes, whereby it becomes possible to adjust the totaling quantity (exposure dose) of the plurality of pulse light beams irradiated onto each point on the wafer 25 during the scanning exposure. This is because the number of the pulse light beams irradiated onto one spot on the wafer 25 is changed resultingly while one spot on the wafer 25 runs along its scanning direction across the rectangular region conjugated with the illumination region on the reticle 16 with respect to the projection optical system 23.

In this embodiment, the oscillation frequency of the ArF excimer laser beam source 1 can be changed by trigger pulses sent from the light source control circuit 45 as described above, whereby the totaling quantum of the light including the plural pulse light beams irradiated onto one spot on the wafer 25 during the scanning exposure can be adjusted. Moreover, also by changing the scanning speed of the wafer 25 and reticle 16, the totaling quantity of the plurality of pulse lights irradiated onto one spot on the wafer 25 during the scanning exposure can be adjusted. Similarly to the case described above, this is because the number of the pulse lights irradiated onto one spot on the wafer 25 is changed by changing the oscillation frequency or the scanning speed while one spot on the wafer 25 runs across the projection region conjugated with the illumination region on the reticle 16.

As is apparent from the above descriptions, in such scanning type exposure apparatus, at least one of the intensity of the pulse light beams on the wafer 25 and the number of the pulse light beams irradiated onto the corresponding spots on the wafer 25 during the scanning exposure is adjusted, whereby the totaling quantity of light of the pulse light beams irradiated onto the corresponding spots on the wafer 25, onto which the pattern image of the reticle 16 is transferred, is controlled to an optimized value in accordance with a sensitivity of the photoresist on the wafer 25. Specifically, in this embodiment, at least one of the oscillation intensity of the ArF excimer laser beam source 1, the transmittance (light extinction rate) of the pulse light, the width of the pulse light region on the wafer 25, the oscillation frequency of the beam source 1 and the scanning speed of the wafer 25 is adjusted, whereby the exposure dose on each spot on the wafer 25 can be set a optimized value or the control precision of the exposure dose can be set within the demanded precision, for example, ±1 to 2%.

All of the unit section 70 of the projection optical system 23 are composed of refraction optical elements such as a lens, and the aperture diaphragm Ep is disposed at the position of the pupil (entrance pupil) of the projection optical system 23. In order to change the numerical aperture of the projection optical system 23, this aperture diaphragm Ep has a structure such that a size of the aperture can be suitably changed by the driving device 61 controlled by the main controller 40. It should be noted that the aperture diaphragm Ep and variable aperture diaphragm 7a to 7g of the projection optical system 23 are disposed at positions which are optically conjugated.

The specific lens 70a disposed in the unit section 70 of the projection optical system 23 is constituted such that it can suitably be moved by the lens driving device 62 controlled by the main controller 40. By moving such lens 70a, at least one of the aberration other than the decentration coma aberration (curvature of field, astigmatic aberration, coma aberration, distribution, spherical aberration and so on), the projection magnification, and the focus position is adjusted.

The adjustment device 80 constituting the projection optical system 23 is disposed between the unit section 70 and the wafer 25, and comprises the plane-parallel plate 81 for correcting the decentration coma aberration of the projection optical system 23. This plane-parallel plate 81 is disposed approximately perpendicular to the optical axis AX of the projection optical system 23, and can suitably be moved by the plane-parallel plate driving device 63 controlled by the main controller 40. For example, by inclining the plane-parallel plate 81 from the plane perpendicular to the optical axis AX, it is possible to correct only the decentration coma aberration produced in the unit section 70 independently from others. Specifically, by adjusting at least one of the inclination angle of the normal line to the plane-parallel plate 81 relative to the optical axis AX and the direction of the inclination of the plane-parallel plate 81, it is possible to correct only the decentration coma aberration of the projection optical system 23 independently from other aberrations and the like. The correction result of the decentration coma aberration is readjusted suitably in response to the change of exposure conditions of the wafer 25. Concretely, when at least one of the size and shape of the secondary light source, the aperture diaphragms 7a to 7f of the turret plate 7, the sort of the pattern on the reticle 16 and the numerical aperture of the projection optical system 23 is changed as the exposure conditions, the decentration coma aberration of the projection optical system 23 is corrected by driving the plane-parallel plate driving device 63 so that it becomes minimum.

The reticle 16 is fixed to the reticle stage 18 by the reticle holder 17. The reticle holder 18 is fitted to the base 22 so that the stage 18 can move two-dimensionally along the plane perpendicular to the paper plane of FIG. 1. The mirror 21 is provided in the reticle holder 17, and the laser beam from the laser interferometer 20 is reflected by the mirror 21 and incident onto the laser interferometer 20. The position of the reticle stage 18 is measured by such laser interferometer 20. This position information is input to the main controller 40, and the main controller 40 drives the reticle stage driving motor 19 based on the position information, thereby controlling the position of the reticle 16, the speed of the reticle 16 during the scanning exposure and the like.

The wafer 25 fixed to the wafer stage 27 by the wafer holder 26. The wafer stage 27 is provided so that it can move two-dimensionally along the plane perpendicular to the paper plane of FIG. 1. The mirror 31 is provided in the wafer stage 27, and the laser beam from the laser interferometer 30 is reflected by the mirror 31 and incident onto the laser interferometer 30. The position of the wafer stage 27 is measured by such laser interferometer 30. The position information is input to the main controller 40, and the main controller 40 drives the wafer stage driving motor 29 based on the position information, thereby controlling the position of the wafer 25, the speed of the wafer 25 during the scanning exposure and the like. The illuminance sensor (photoelectric detector) 28 is provided on the wafer stage 27, and illuminance of the exposure light irradiated onto the wafer 25 is detected. The detection signal from the illuminance sensor 28 is input to the main controller 40.

In the projection exposure apparatus of this embodiment of the present invention, a plurality of optical elements constituting of the illumination optical system is disposed in the atmosphere of inert gas such as nitrogen gas and helium gas. For this reason, as disclosed in Japanese Patent Application Laid-open No. Heisei 6(1994)-260385 and U.S. Pat. No. 5,559,584 related to this application, provided are an inert gas supply device for supplying inert gas to a box (not shown) of the illumination optical system and a inert gas discharge device for discharging the contaminated inert gas from the box. Moreover, inert gas such as nitrogen gas is supplied to a plurality of spaces formed among a plurality of optical elements constituting the projection optical system 23, and the contaminated inert gas is discharged from the plurality of spaces. For this reason, the inert gas supplying device 41 and the inert gas discharging device 42 are provided. The gas supplying device 41 supplies the inert gas such as dried nitrogen gas to the inside of the projection optical system 23 via the pipe 43. The discharging device 42 discharges the gas in the projection optical system 23 to the outside via the pipe 44.

FIGS. 3a and 3b are an explanatory view showing the structure of the adjustment device 80 disposed at the lower end portion of the projection optical system 23. FIG. 3a schematically shows the sectional structure of the adjustment device 80 when viewed from the side direction thereof, and FIG. 3b shows the structure of the adjustment device 80 when viewed from the side direction thereof. As shown in FIGS. 3a and 3b, the adjustment device 80 comprises a first member 82 that is a metallic part for fixedly holding the plane-parallel plate 81 therein and a second member 83 that is a metallic part disposed between the first member 82 and the unit section 70.

The first and second members 82 and 83 are connected so as to be freely slidable interposing the sliding plane 86 which slightly inclines from a plane perpendicular to the optical axis AX. By relatively rotating both of the members 82 and 83 around the optical axis AX, the inclination angle of the normal line to the plane-parallel plate 81 can be adjusted. It should be noted that the inclination angle of the optical axis AX from the sliding plane 86 is set to half of the maximum inclination angle of the normal line to the plane-parallel plate 81 relative to the optical axis AX. In other words, when the first member 82 rotates from the second member 83 by 180° in the illustrated situation, the inclination angle of the normal line to the plane-parallel plate 81 relative to the optical axis AX becomes twice the inclination of the optical axis AX from the sliding plane 86.

The second member 83 and the unit section 70 are connected so as to be freely slidable via the sliding plane 87 perpendicular to the optical axis AX. By relatively rotating the second member 83 and the unit section 70 around the optical axis AX, the inclination angle of the normal line to the plane-parallel plate 81 relative to the optical axis AX can be adjustable.

The rotation position of the first member 82 relative to the second member 83 can be visually detected by reading out the scale ring 84 provided in the periphery of the uppermost end of the first member 82 using the index 89 provided in one spot of the lowermost end of the second member 83. Moreover, the rotation position of the second member 83 relative to the unit section 70 can be visually detected by reading out the scale ring 87 provided in the periphery of the uppermost end of the second member 83 using the index 89 provided in one spot of the lowermost end of the unit section 70.

The first driving section 63a provided in the driving device 63 adjusts the rotation position of the first member 82 relative to the second member 83, and inclines the plane-parallel plate 81 by a predetermined angle from a plane perpendicular to the optical axis AX. Thus, it is possible to independently correct only the decentration coma aberration in a specified direction, which are created in the unit section 70. On the other hand, the second driving section 63b adjusts the rotation position of the fist member 82 relative to the unit section 70, and appropriately sets the inclination direction of the plain-parallel plate 81. Thus, it is possible to adjust the correction direction of the decentration coma aberration. The rotation position of the first member 82 relative to the second member 83 and the rotation position of the first member 82 relative to the unit section 70 can also be electrically detected by monitoring the quantity of the driving by both of the driving sections 63a and 63b. For example, the rotation position of the first member 82 relative to the second member 83 is detected based on the driving amount of both of the driving sections 63a and 63b, whereby this rotation position can be converted to the inclination angle of the first member 82.

A fixing screw long hole (not shown) is formed in the first member 82 by working it, so that the first and second members 82 and 83 can be securely fixed to each other with the desired angle around the optical axis AX. Moreover, a fixing screw long hole (not shown) is formed in the second member 83 by working it, so that the second members 83 and the unit section 70 can be securely fixed to each other with the desired angle around the optical axis AX.

Figure 4:
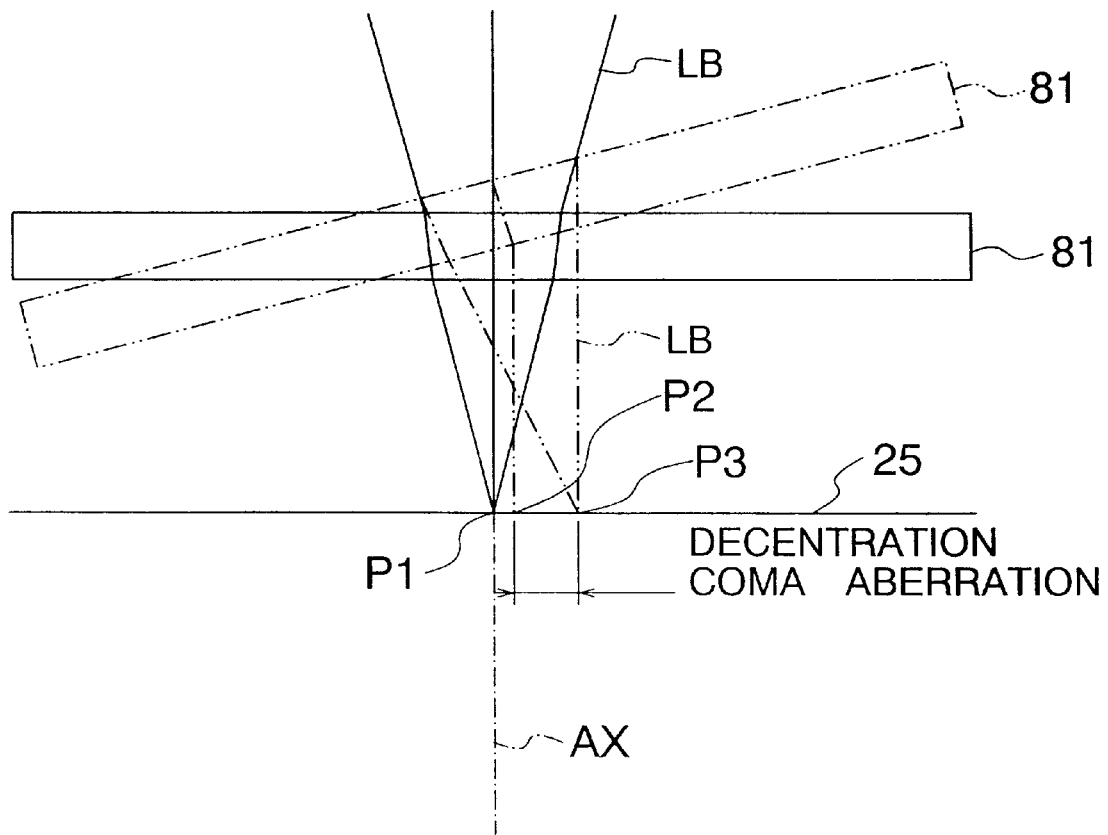
FIG. 4 is an explanatory view showing the relation between the inclination and decentration coma aberration of a plane-parallel plate held fixedly to the adjustment device of FIGS. 3a and 3b.

FIG. 4 is an explanatory view schematically showing the relation among the inclination angle of the plane-parallel plate 81 held by the first member 82, the generation of the decentration coma aberration and the correction for it. For example, in the case where the plane-parallel plate 81 and the wafer 25 are made to be parallel with each other as shown by the solid line, it is assumed that the laser beam LB for exposing form the unit section 70 is allowed to form its image at the point P1 on the wafer 25. From this situation, when the plane-parallel plate 81 is slightly inclined as shown with the two-dot chained line, the laser beam LB for exposing comes to form no image thereof at the point P1 by the decentration coma aberration. Concretely, the light coming along the optical axis AX among the laser beam LB is made to be moved parallel by the plane-parallel plate 81 and forms it image in the point P2 in the vicinity of the point P1. The light coming with an angular aperture among the laser beam LB undergoes a comparatively large effect of the plane-parallel plate 81, makes a parallel movement, and forms its image in the point P3 which is remoter than the point P2 from the point P1. Specifically, if no decentration coma aberration were produced by the unit section 70, the decentration coma aberration is generated by inclining the plane-parallel plate 81. This implies that when the decentation coma aberration is generated as in the laser beam LB shown by two-dots chained line, the decentration coma aberration can be corrected by rotating the plane-parallel plate clockwise.

(Modification of the First Embodiment)

Figure 5:
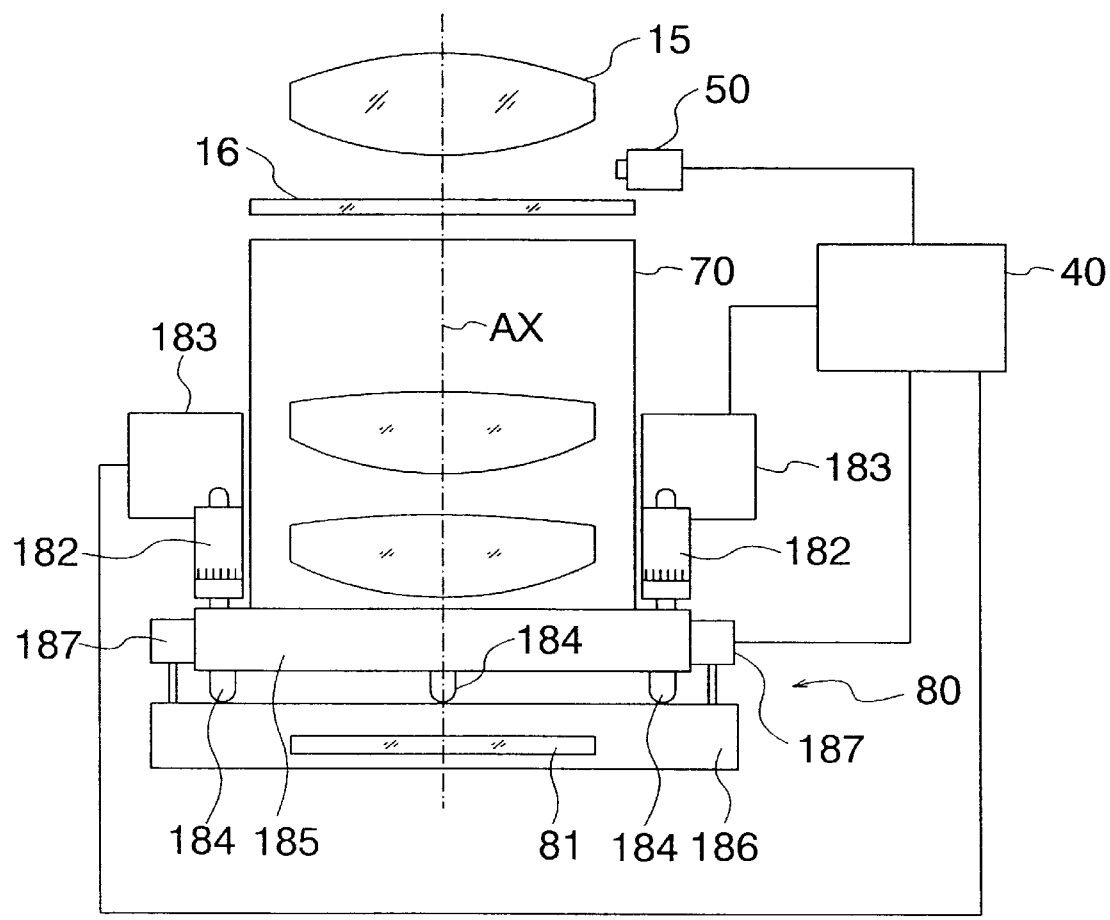
FIG. 5 is a view showing a modification of the structure of the projection exposure apparatus of the first embodiment.

FIG. 5 is a explanatory view schematically showing the principal portion of a projection exposure apparatus of this embodiment. In the projection exposure apparatus of FIG. 5, since the plane-parallel plate 81 provided in the adjustment device 80 is inclined relative to the plane perpendicular to the optical AX, a fine adjustment mechanism composed of the micrometer head 182 and the actuator 183 is provided. This fine adjustment device is capable of reducing a possibility of producing other aberrations, without rotating the plane-parallel plate 81 around the optical axis AX of the unit section.

The pedestal 185 fixed to the lower portion of the unit section 70 which constitutes the projection exposure apparatus is designed such that the pedestal 185 is guided by a device (not shown) so as to be movable in the direction of the optical axis relative to the plane-parallel plate holding chamber 186. The distance between the pedestal 185 and the plane-parallel plate holding chamber 186 can be adjusted by manipulating the three micrometer heads 182 fixed to the peripheral of the pedestal 185 using the actuator 183. At this time, if each of the spindles is allowed to project from the lower surface of the pedestal 185 by the quantity different from others by making the quantities of the manipulation of the micrometer heads 182 uneven, the plane-parallel plate 81 which is fixedly held by the plane-parallel plate holding chamber 186 can be inclined toward a desired direction by a desired angle relative to the plane perpendicular to the optical axis AX. Since the manipulation quantities of the micrometer heads, the inclination angle and direction of the plane-parallel plate 81 have a predetermined relation, the desired inclination angle and direction of the plane-parallel plate 81 are set in the main controller 40, whereby the manipulation quantity of each of the micrometer heads 182 can be computed following a beforehand obtained computational formula.

Figure 6:
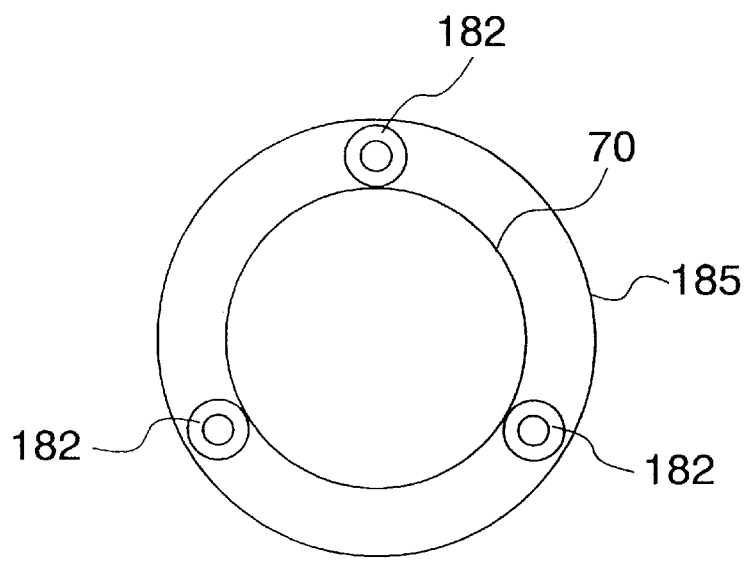
FIGS. 6a and 6b are an explanatory view showing a structure of a principal portion of an adjustment device of the projection exposure apparatus of FIG. 5.
Figure 6:
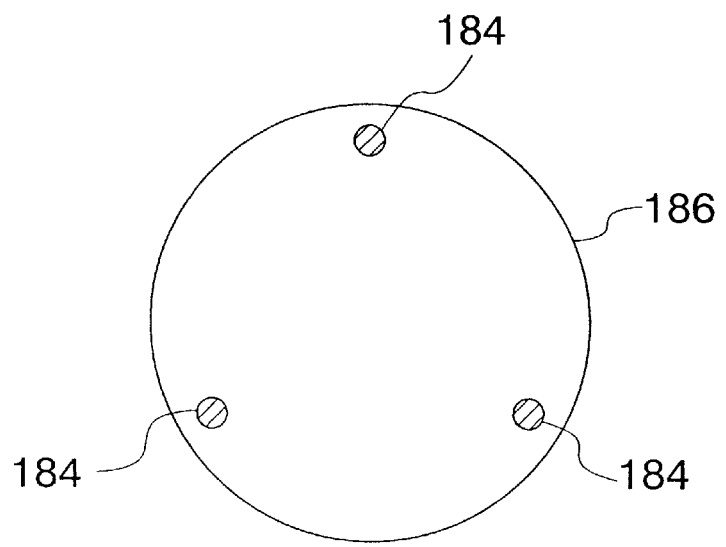

FIG. 6a is a plan view of the projection optical system shown in FIG. 5, and FIG. 6b is a plan view provided in the lower portion of the projection optical apparatus. As shown in FIG. 6a, each of the micrometer heads 182 is disposed at regular intervals in the periphery of the pedestal 185 fixed the lowermost portion of the unit section 70. The spindles 184 of the micrometer head 182 contact the plane-parallel plate holding chamber 186 at the positions shown in FIG. 6b. Specifically, the pedestal 185 and the unit section 70 are mounted on the plane-parallel holding chamber 186, with their three positions supported by the spindles 184.

Returning to FIG. 5, the sensors for detecting the light quantity and other illumination conditions is arranged between the condenser optical system 15 and the reticle 16. The change of the illumination conditions is transmitted to the main controller 40. The main controller 40 drives the acutuator 183 in response to the change of the illumination conditions detected by the sensor 14, and appropriately adjusts the inclination angle and direction of the plane-parallel plate 81.

In FIG. 1, an operator can make the first and second members 82 and 83 for adjusting the inclination angle and direction of the plane-parallel plate 81 to rotate by hand, and in FIG. 5, the operator can drive the micrometer head 182 by hand. However, as in the above-described embodiment, the aberration correction by automatically inclining the plane-parallel plate 81 in accordance with the change of the exposure conditions without the operator is more advantageous in that the exposure can be performed without causing a reduction of the throughput.

In the above-described embodiment of the present invention, the projection exposure apparatus comprises the plane-parallel plate arranged approximately perpendicularly to the optical axis of the projection optical system which plate is disposed on the photosensitive substrate side of the projection optical system, and the adjustment device for adjusting at least one of the inclination angle of the normal line of the plane-parallel plate to the optical axis of the projection optical system and the inclination angle of the plane-parallel plane. For this reason, the decentation coma aberration of the projection optical system can be simply corrected independently from other aberrations, whereby a secondary effect that relatively deteriorates other aberrations due to the correction of the decentration coma aberration hardly to occur.

Moreover, according to another embodiment of the present invention, the illumination optical system is further comprised, which changes at least one of the size and shape of the secondary light source in accordance with the pattern of the mask, and the adjustment device adjusts at least one of the inclination angle and inclination direction of the foregoing plane-parallel plate in response to the change of the secondary light source. For this reason, when the illumination conditions change and prior conditions of the correction of the decentration coma aberration changes following the change of the secondary light source, the decentation coma aberration can be corrected most suitably in response to the change of such prior conditions, so that the deterioration of the exposure performance of the exposure device can be effectively prevented.

According to another embodiment of the present invention, in a projection exposure apparatus which exposes a photosensitive substrate by a pattern of a mask, provided is a projection optical system which includes a plurality of optical elements arranged along an optical axis substantially perpendicular to the mask and the foregoing photosensitive substrate, and a plane-parallel plate arranged on the foregoing photosensitive substrate side; and an adjustment device for adjusting an aberration of the foregoing projection optical system by moving the foregoing plane-parallel plate in response to a change of exposure conditions of the foregoing photosensitive substrate.

Moreover, according to the preferred embodiment of the present invention, the adjustment device inclines the plane-parallel plate relative to the plane perpendicular to the optical axis of the projection optical system without substantially rotating the plane-parallel plate, and adjusts the decentratioon coma aberration of the projection optical system. Therefore, when the prior conditions of the correction of the decentration coma aberration changes following the change of the exposure conditions, the adjustment device can correct the decentration coma aberration in response to the changes of the prior conditions most suitably, so that the deterioration of the exposure performance of the exposure device can be effectively prevented.

Moreover, according the preferred embodiment of the present invention, in order to adjust at least one of the aberration other than the decentration coma aberration, projection magnification and focus position of the projection optical system, the driving device for moving at least one of a plurality of optical elements of the projection optical system is further comprised. Therefore, the image formation by the projection optical system can be conducted in the best condition while correcting the decentration coma aberration suitably.

Furthermore, according to the preferred embodiment of the present invention, the projection exposure apparatus further comprises the illumination optical system for changing the size and shape of the secondary light source in accordance with the pattern of the mask, and the aperture diaphragm for allowing the numerical aperture of the illumination optical system to be variable. Since at least one of the size and shape of the secondary light source, the sort of the pattern of the mask, and the numerical aperture of the projection optical system is included in the exposure conditions of the photosensitive substrate, the above-described various kinds of the exposure conditions can be suitably changed, while correcting the decentration coma aberration most suitably.

Moreover, according to another embodiment of the present invention, the projection exposure device for exposing the photosensitive substrate with the pattern of the mask comprises the projection optical system which has a plane-parallel plate arranged along the optical axis approximately perpendicular to the mask and the photosensitive substrate, and the driving mechanism which inclines the plane-parallel plate relative to the plane perpendicular to the optical axis of the projection optical system. Therefore, when the prior conditions of the correction of the decentration coma aberration changes following the change of the exposure conditions, the adjustment device can correct the decentration coma aberration in response to the changes of the prior conditions most suitably, so that the deterioration of the exposure performance of the exposure device can be effectively prevented.

Next, a second embodiment of the present invention will be described with reference to the accompanying drawings. The following embodiment of the present invention concerns the case where the present invention is applied when an exposure is performed using a step and scan type projection exposure apparatus.

SECOND EMBODIMENT

Figure 7:
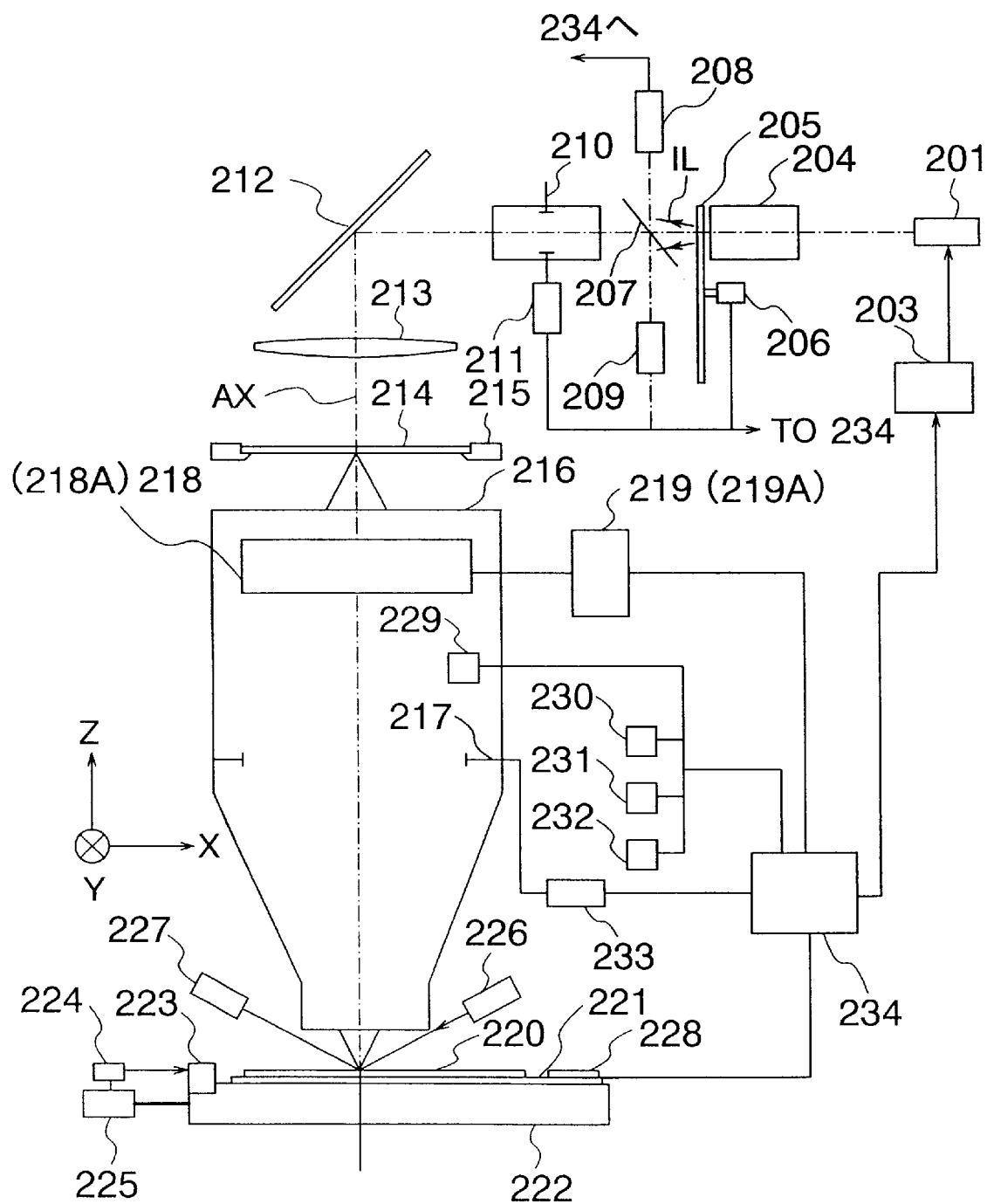
FIG. 7 is a view showing the outline of a structure of a projection exposure apparatus used in a second embodiment.
Figure 10:
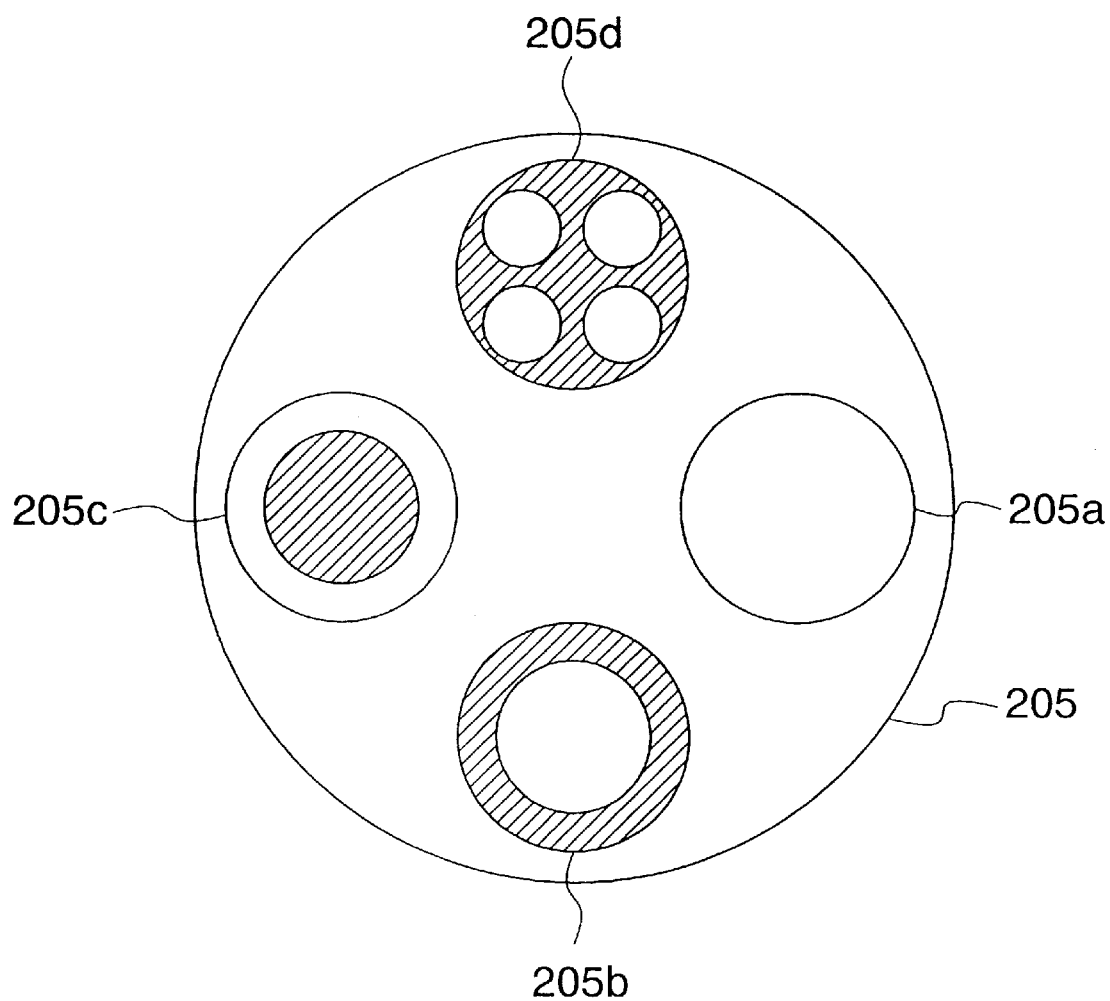
FIG. 10 is a view showing a plurality of aperture diaphragms provided in an aperture diaphragm plate of an illumination system of FIG. 7.

FIG. 7 shows a step and scan type projection exposure apparatus. Referring to FIG. 7, the exposure light formed of ultraviolet light emitted from the exposure light source 201 composed of a KrF excimer laser light source or an ArF excimer laser light source is incident onto the fly eye lens 204 via the beam shaping optical system and the light quantity attenuator (both are not shown). The aperture diaphragm plate 205 of the illumination system is disposed rotatively on the emission plane of the fly eye lens 204. Around the rotation shaft of the aperture diaphragm plate 205, disposed are the circular aperture diaphragm 205a for normal illumination, the small circular aperture diaphragm 205b for small coherent factor (σ value), the ring-shaped aperture diaphragm 205c for zone illumination, and the aperture diaphragm 205b for modification illumination, which diaphragm is composed of a plurality of eccentric small openings, as shown in FIG. 10. It should be noted that many illumination system aperture diaphragm may further be provided according to demand.

Returning to FIG. 7, the main control system 234 for collectively controlling the operation of the whole of the projection exposure apparatus is constituted such that by rotating the aperture diaphragm plate 205 via the driving motor 206, a desired illumination system aperture diaphragm can be disposed on the emission plane of the fly eye lens 204. The main control system 234 includes also a computer for computing the deformation quantity of the reticle and the correction quantity of the image formation characteristic of the projection optical system as described later. A part of the exposure light IL passing through the aperture diaphragm on the emission plane of the fly eye lens 204 is reflected by the beam splitter 207, and thereafter incident onto the integrator sensor 208 composed of a photoelectric detector. The detection signal of the integrator sensor 208 is supplied to the main control system 234, and the main control system 234 indirectly monitors the illuminance (pulse energy) of the exposure light IL on the surface of the wafer 220 and the totaling quantity of the exposure light on each spot of the wafer 220 based on the detection signal. The main control system 234 controls the output from the exposure light source-201 via the power source device 203 and controls the attenuation rate of the exposure light by a light attnuator (not shown) so that the illuminance monitored in such manner and the totaling quantity of the exposure light attain the target values.

On the other hand, the exposure light IL passing transmitting through the beam splitter 207 travels through a relay lens (not shown), the reticle blind 210, the mirror 212 for use in bending an optical path, and the condenser lens 213, and then illuminates the rectangular illumination region in the pattern region, which is provided in the pattern plane (lower plane) of the reticle 214. The pattern in the illumination region of the reticle 214 is projected reductively onto the exposure region on the wafer 220 with a predetermined projection magnification β (β: ¼, 1/5 etc.), on which resist is coated. In the projection optical system 216, the aperture diaphragm 217 is disposed on an optical Fourier transform plane (pupil plane) for the pattern plane of the reticle 216. The main control system 234 makes the driving system 233 to control the aperture diameter of the aperture diaphragm 217, whereby the numerical aperture NA of the projection optical system 216 is determined.

The plane where the reticle blind 210 is disposed is approximately conjugated with the pattern plane of the reticle 214, the shape and size of the rectangular illumination region on the reticle 214 are set by the aperture shape of the reticle blind 210. In this embodiment of the present invention, the main control system 234 can make the driving system 211 to control the aperture shape of the reticle blind 210, whereby the width in the illumination region on the reticle 214 in the scanned direction and the width therein in the non-scanned direction perpendicular to the scanned direction can be adjusted. The control of the widths of the illumination region enables the illuminances on the wafer 220 in the scanned and non-scanned directions to be adjusted. Moreover, in order to prevent the exposure onto unnecessary portions immediately after the start of the scanning exposure and immediately before completion of the scanning exposure, the movable blind (not shown) to cover the aperture portion of the reticle blind 210 is also provided in the vicinity of the reticle blind (fixed blind) 210. However, the reticle blind 210 may exert also the function of this movable blind. In the following description, the Z-axis is taken in parallel with the optical axis AX of the projection optical system 216, Y-axis is taken along the scanning direction perpendicular to the paper plane of FIG. 7 and X-axis is taken along the direction perpendicular to the scanning direction at the time when the scanning exposure is performed on the plane perpendicular to the Z-axis.

First, the reticle 214 is in the situation where it is held on the reticle stage 215.

Figure 11:
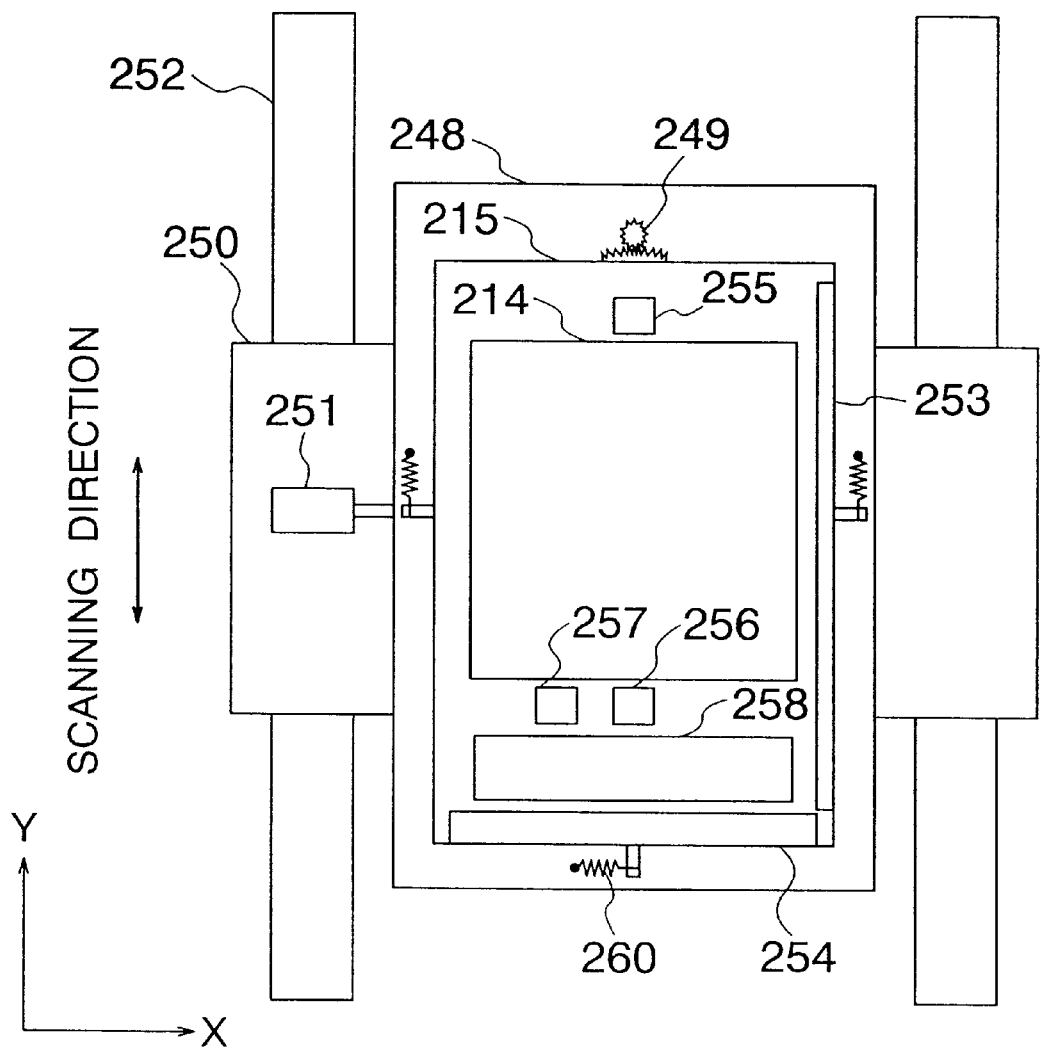
FIG. 11 is a plan view showing a driving mechanism and the like of a reticle stage of FIG. 7.

FIG. 11 shows the driving mechanism of the reticle stage 215. Referring to FIG. 11, the reticle stage 215 is mounted on the fine movement stage 248 rotatively, and the fine movement stage 248 is mounted on the coarse movement stage 250 so as to slightly move in the X-direction by the driving motor 251. The coarse movement stage 250 are provided on a pair of guides 252 interposing an air bearing, which is disposed along the Y-direction (Scanning direction), and the coarse movement stage 250 is made to continuously move along the pair of guides 252 in the Y-direction by, for example, a linear motor. The reticle stage 215 is connected to the fine movement stage 248 interposing the rotation mechanism 249, and the reticle stage 215 is energized toward the rotation mechanism 249 by the pulling coil spring 260 provided in three spots. The reticle stage 215 rotates relative to the fine movement stage 248. Specifically, the reticle stage 215 is supported so that is able to continuously move in the Y-direction and to slightly move in the X and Y-directions and rotation direction.

Moreover, the moving mirror 254 for the Y-axis and the moving mirror 253 for the X-axis are fixed to the end portion of the reticle stage in the −Y-direction and the end portion thereof in the +X-direction, respectively. A laser beam is irradiated onto the moving mirror 254 from, for example, a pair of laser interferometers (not shown) for the Y-axis, and a laser beam is irradiated onto the moving mirror 253 from, for example, a laser interferometer (not shown) for the X-axis. The X and Y-coordinates and rotation angle of the reticle stage 215 are measured by these laser interferometers. These measurement values are supplied to the main control system 234 of FIG. 7, and the main control system 234 controls the movement speed and position of the reticle stage 215 through a linear motor and the like (not shown) based on these measurement values.

Returning to FIG. 7, the wafer 220 is adsorbed onto a wafer holder (not shown) and held thereonto, which is fixed onto the sample stage 221. The irradiation quantity monitor 228 composed of a photoelectric detector is fitted in the vicinity of the wafer 220 (wafer holder) on the sample stage 221, and the detection signal of the irradiation quantity monitor 228 is supplied to the main control system 234. The sample stage 221 is fixed onto the wafer stage 222 which allows the sample stage 221 to continuously move in the Y-direction and performs a step-driving in the X and Y-directions. Also a Z stage mechanism for controlling the position (focus position) of the sample stage 221 in the Z-direction and the inclination or tilt angle thereof is built into the wafer stage 222.

Auto focus sensors (hereinafter referred to as AF sensors 226 and 227) composed of a light sending system 226 and a light receiving system 227 are disposed on the side of the projection optical system 216, and a plurality of slit images projected onto the surface of the wafer from the light sending system 226 obliquely are again subjected to an image formation by the light receiving system 227. The lateral shifting of the image which has been formed again is detected, whereby the focus positions at a plurality of measurement spots to which these slit images are projected are detected, and the detection results are supplied to the wafer stage driving system 225. The wafer stage driving system 225 drives the Z-stage mechanism in the wafer stage 222 by an auto focus method and a auto leveling method so that the plurality of focus positions detected by the AF sensors 226 and 227 coincide with a position of an image surface of the projection optical system 216 previously inputted from the main control system 234.

The moving mirror 223 having reflection planes perpendicular to each other is fixed onto the wafer stage 222, and a laser beam is irradiated onto the moving mirror 223 from the three axis laser interferometer 224 provided in the outside. The X and Y-coordinates and rotation angle of the sample stage 221 (or rotation angle of the wafer 220) are measured by these interferometer, and these measurement values are supplied to the wafer stage driving system 225 and the main control system 234. The wafer stage driving system 225 drives the wafer stage 222 in the X and Y-directions based on the measurement values and the control information from main control system 234.

At the time when the scanning exposure is performed, the reticle stage 215 is made to move the reticle 214 in the +Y-direction (or −Y-direction) at a speed VR relative to the rectangular illumination region, and in synchronization with the movement of the reticle 214, the wafer stage 222 is made to move the wafer 220 in the −Y-direction (or +Y-direction) at a speed β·VR (β: the projection magnification from the reticle 214 onto the wafer 220) relative to the exposure region, whereby the pattern image in the pattern region of the reticle 214 is sequentially transferred onto one of the shot regions on the wafer 220. Thereafter, by allowing the wafer stage 222 to step in order to move the next shot region on the wafer 220 to a scan starting position, an operation to perform the scanning exposure is repeated by the step and scanning method, and the exposure onto the shot regions on the wafer 220 is performed. At this time, based on the detection signal of the integrator sensor 208, the main control system 234 controls the exposure quantity at each spot on each shot regions toward desired target value.

When such scanning exposure is continued, each of the optical members constituting the reticle 214 and the projection optical system 216 are expanded and deformed by the irradiation heat of the exposure light IL, and the magnification of the image projected onto the wafer 220 and the image formation characteristic such as the various aberrations gradually vary in accordance with the expansions and deformations. The desired projection image will not be exposed. Moreover, the image formation characteristic varies also by environmental conditions such as atmospheric pressure. In order to avoid the variation of such image formation characteristic, a measurement mechanism for the irradiation quantity of the exposure light IL and the environmental conditions, and a correction mechanism of the image formation characteristic of the projection image are incorporated in the projection optical system of this embodiment.

[Measurement Mechanism of Irradiation Quantity of Exposure Light]

First, a part of the measurement mechanism for the irradiation quantity of the exposure light IL constitutes the irradiation quantity monitor 228 on the sample stage 221. The irradiation quantity monitor 228 is constituted such that it is capable of measuring the light quantity of the exposure light IL actually passing through the projection optical system 216, and the irradiation quantity monitor 228 is constituted such that even when the position (best focus position) of the image surface of the projection optical system 216 varies, its light receiving plane can be positioned at the best focus position of the image surface of the projection optical system 216 by driving the wafer stage 222 in the Z-direction. As the irradiation quantity monitor 228, a silicon photodiode or a photo-multiplier can be used. Though the irradiation quantity monitor 228 is provided on the wafer stage 222 in this embodiment, the structure may alternatively be adopted, in which only a light collection optical system is incorporated on the wafer stage 222 and the exposure light collected by the light collection optical system is guided to the external irradiation quantity monitor 228 via a relay optical system or an optical fiber. In this case, since the irradiation quantity monitor 228 need not to be provided on the wafer stage 222, it is possible to prevent the deterioration of the positioning precision of the wafer stage 222 due to a heat generation of the irradiation quantity monitor 228.

In this embodiment, the exposure light IL reflected by the wafer 220 returns to the beam splitter 207 via the projection optical system 216, the reticle 214, the condenser lens 213 and so on, and the luminous flux reflected by the beam splitter 207 is incident onto the reflectance sensor 209 composed of a photoelectric detector. The detection signal of the reflectance sensor 9 is supplied to the main control system 234. The main control system 234 computes the reflectance of the wafer 220 based on the detection signal of the reflectance sensor 209. Form the sum of the illuminance (pulse energy) of the exposure light IL measured by the irradiation quantity monitor 228 and the illuminance obtained by multiplying the illuminance (pulse energy) with the reflectance detected by the reflectance sensor 209, an energy per unit time of the exposure light IL passing through the projection optical system 216 is obtained.

In FIG. 7, for example, in the case where the quantity of the light passing through the projection optical system 216 is measured using the irradiation quantity monitor 228, since the reticle 214 is provided on the optical path of this light, the light is influenced by the variation of the transmittance of the reticle 214. In order to avoid the influence of the transmittance variation of the reticle 214, a transmission window is provided on the reticle stage 215.

Specifically, as shown in FIG. 11, the light transmission windows 255 and 256 are formed on two spots on the reticle stage 215, which put the reticle 214 therebetween in the scanning direction (Y-direction). The irradiation quantity monitor 228 is previously arranged in the exposure region on the side of the wafer stage 222. In the case where the reticle 214 is scanned in the +Y-direction, the light transmission window 255 on the +Y-direction side takes in the detection signal of the irradiation quantity monitor 228 at the time when the window 255 is in the illumination region of the exposure light. In the case where the reticle 214 is scanned in the −Y-direction, the light transmission window 256 on the −Y-direction side takes in the detection of the irradiation quantity monitor 228 at the time when the window 256 is in the illumination region of the exposure light. Thus, the light quantity passing through the projection optical system 216 can be detected without interposing the reticle 214.

The illuminance sensor 257 composed of a photoelectric detector is provided on the reticle stage 215 as well as in the vicinity of the light transmission window 256, and the reference reflection plate 258 of a larger area than that of the illumination region on the reticle 214 is provided in the vicinity of the illuminance sensor 257. The detection signal of the illuminance sensor 257 is supplied to the main control system 234 of FIG. 7, and the illuminance of the exposure light IL on the reticle 214 can be detected by the illuminance sensor 257 with a high precision. On the other hand, in the state where the reference reflection plate 258 is provided in the illumination region of the exposure light IL the detection signal of the reflectance sensor 209 of FIG. 7 is taken in, whereby the variations of the transmittance of the illumination optical system arranged after the beam splitter 207 can be measured without the influence of the variations of the transmittances of the reticle 214 and projection optical system 216.

A silicon photodiode, a photo-multiplier or the like can be used also as the illuminance sensor 257 of FIG. 11. For the illuminance sensor 257, the structure may be adopted, in which only a light collection optical system is incorporated in the reticle stage 215 and the exposure light collected by the light collection optical system is guided to the external illuminance sensor 257 via a relay optical system, an optical fiber or the like. In this case, since the illuminance sensor 257 needs not to be provided on the reticle stage 215, it will be possible to prevent the deterioration of the positioning precision of the reticle stage 215 due to a heat generation of the illuminance sensor 257.

Moreover, as the measurement mechanism of the environmental conditions, as shown in FIG. 7, the air pressure sensor 229 is provided inside the projection optical system 216 (inside a barrel), and the measurement value of the air pressure 229 is supplied to the main control system 234. Information concerning a temperature, air pressure and humidity of gas surrounding the projection optical system 216, which are measured by the temperature sensor 230, the air pressure sensor 231 and the humidity sensor 232 provided in the vicinity of the projection optical system 216, is supplied to the main control system 234.

[Correction Mechanism of Image Formation Characteristic]p Next, the correction mechanism of the image formation characteristic of this embodiment of the present invention will be described. Referring to FIG. 7, the correction mechanism is constructed such that the image formation characteristic correction section 218 is provided inside the projection optical system 216, the main control system 234 makes the image formation characteristic control section 219 to move a predetermined lens constituting the image formation characteristic correction section 218, so that the correction of a predetermined image formation characteristic can be conducted. The constitution of the image formation correction section 218 will be described with reference to FIG. 8, below.

Figure 8:
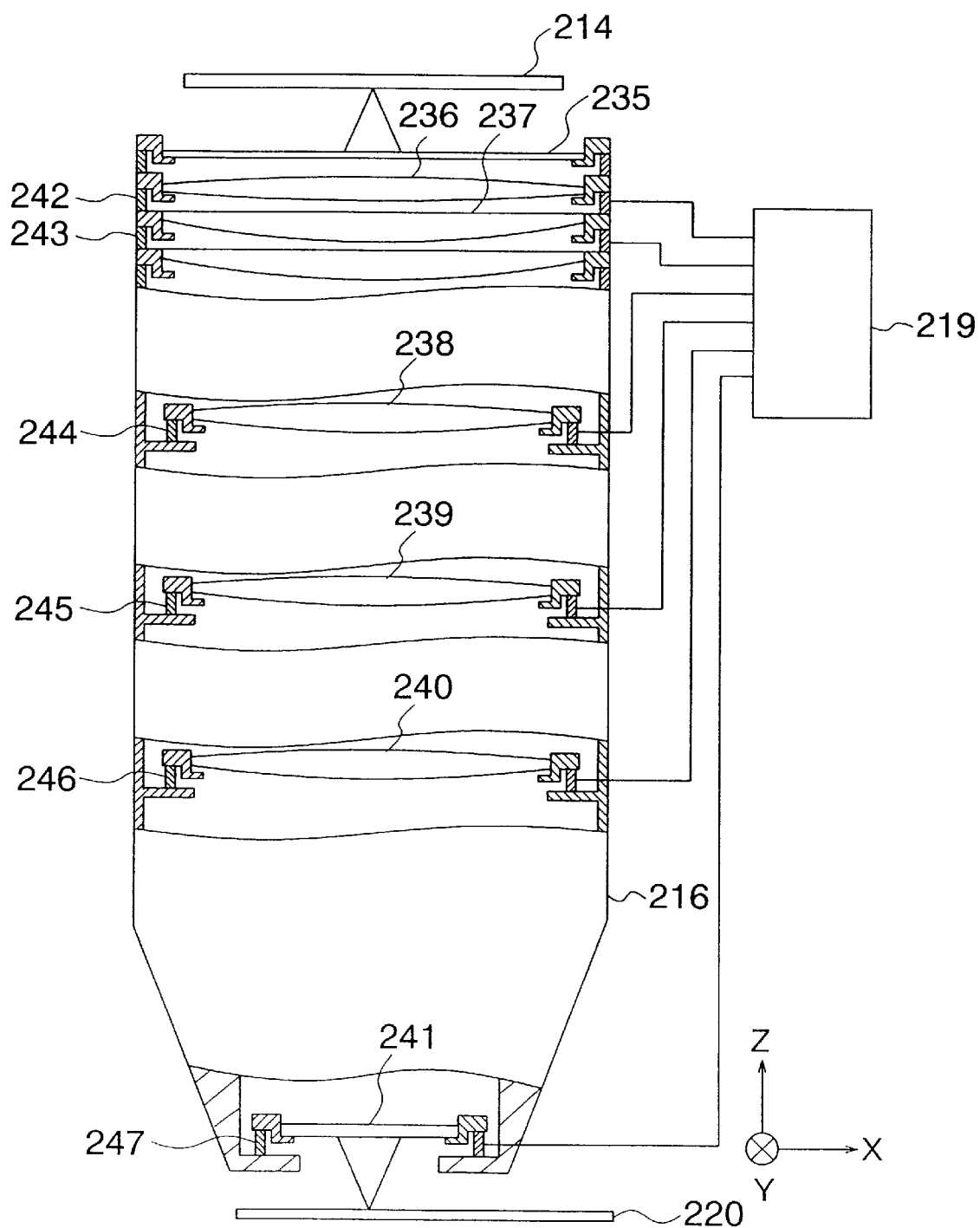
FIG. 8 is a partially cutaway view showing an internal structure of the projection optical system.

FIG. 8 shows the internal constitution in the projection optical system 216 of the projection exposure apparatus of this embodiment of the present invention. Referring to FIG. 8, five lens groups 236 to 240 among a plurality of lens groups which constitute the projection optical system 216 are supported so that they can be driven by the corresponding driving elements 242 to 246 formed of a piezoelectric device (piezo crystal element and the like), which are freely expanded and contracted. Each of the driving elements 242 to 246 is composed of three driving elements, which can move the corresponding lens groups 236 to 240 toward the optical axis direction of the projection optical system and incline them relative to a plane perpendicular to the optical axis, whereby the corresponding image formation characteristics vary. When information concerning the correction quantity of the predetermined image formation characteristic from the main control system 234 is supplied to the image formation control section 219, the image formation characteristic control section 219 drives the corresponding driving elements 242 to 246 by the quantity corresponding to the correction quantity. Thus, the predetermined image formation characteristic is corrected.

In this case, the two lens groups 236 and 237 on the side of the reticle 214 are constituted so that they are collectively driven, and the three lens groups 238, 239 and 240 on the side of the wafer 220 are separately driven, so that by driving each of the lens groups the distance from this driven lens group to the adjacent lens groups can be simultaneously changed. In this style, there is an advantage that the driving quantities of the lens groups 236 to 240 can be reduced as a whole. In consideration of the relation between the driving quantity of each of the lens group 236 to 240 and the change quantity of the image formation characteristic, instead of the style in which the upper two lens groups 236 and 237 are collectively driven, the style in which the lower two groups, for example, lens groups 239 and 240, are collectively driven may be adopted. Adoption of one of styles should be determined depending on the driving quantity of the lens groups 236 to 240 and the positioning stability precision required to the lens groups 236 to 240, when the correction is performed. Moreover, the plane-parallel plate 241 is provided on the side of the wafer 220 in the projection optical system 216 so that it can be driven by the driving element 247, and the image formation characteristic control section 219 controls inclination angle and the position of the plane-parallel plate 241 in the Z direction, whereby the decentration coma aberration is principally corrected. On the side of the reticle 214 of the projection optical system 216, provided is a plane-parallel plate 235 of which the surface is fine uneven, in order to correct the non-rotational symmetrical component of the distortion among the aberrations of the whole of the projection optical system.

Here, a method for driving the lens group 236 as the representation of the lens groups 236 to 240 will be described with reference to FIG. 9.

Figure 9:
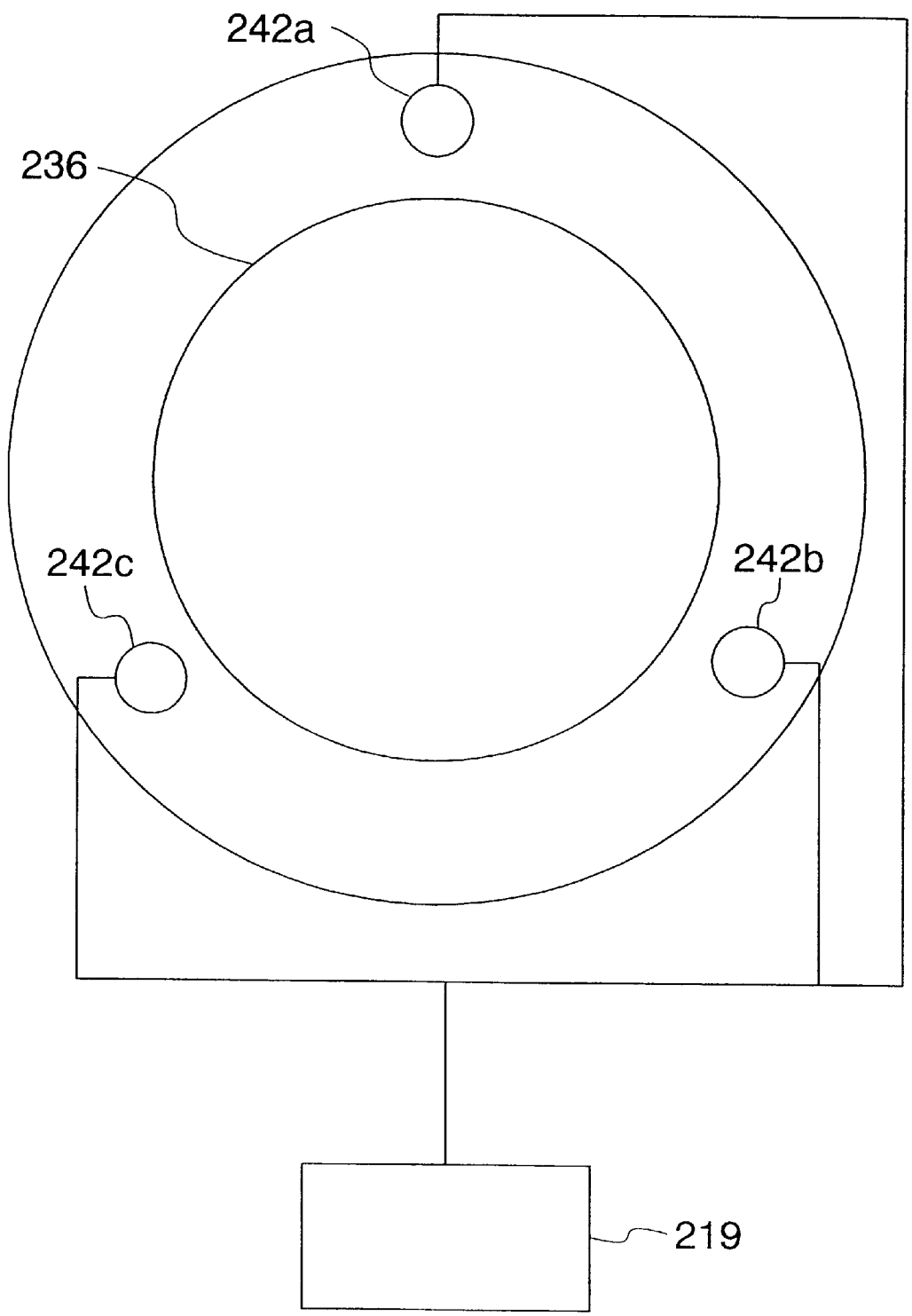
FIG. 9 is a plan view showing a part of a lens group of the projection optical system of FIG. 8.

FIG. 9 is a plane view showing the lens group 236 in the projection optical system 216. Referring to FIG. 9, the lens group 236 is held by a lens frame (not shown) formed of metal, which is mounted on a lens frame of the lens group under the lens group 236, interposing the three driving elements 242a, 242b and 242c. The driving elements 242a to 242c are expressed by one driving element 242 in FIG. 8. In this case, by expanding and contracting the three driving elements 242a to 242c in the Z direction independently, the lens groups 236 is inclined and driven in the Z direction, that is, the optical axis direction.

At the position (driving spot) where the driving elements 242a to 242c are arranged, position sensor (not shown) are disposed, and the information concerning the contraction quantities of the driving elements 242a to 242c detected by these position sensors are supplied to the image formation characteristic control section 219. In the image formation characteristic control section 219, the driving elements 242a to 242c are driven by a closed loop method so that the detected contraction quantities are made to be equal to target values. As the position sensors, a gap sensor of an electrostatic capacitor type, a linear encoder of an optical type or a magnetic type, an interferometer or the like may, for example, be used.

Returning to FIG. 8, by changing the combination of the position of the lens groups 236 to 240, plane-parallel plate 241 and plane-parallel plate 235 of the projection optical system in the Z direction with the inclination angle thereof, various kinds of the image formation characteristics can be corrected to the desired state.

In the case where the plane-parallel plate 235 is provided at a position close to the reticle 214 as in this embodiment, the exposure light passing through the reticle 214 is in a spreded state at the position of the plane-parallel plate 235, unlike its state at the time when it is close to the pupil surface (the optical Fourier transform surface relative to the pattern plane of the reticle). For this reason, when the projection optical system 216 is a reduction projection optical system, there is an advantage that a manufacturing precision can be relaxed. On the contrary, when the projection optical system 216 is an equi-magnification projection optical system, the plane-parallel plate 235 may be disposed on any side of the reticle 214 and wafer 220. When the projection optical system 216 is a magnifying projection optical system, the same effect can be obtained by disposing the plane-parallel plate 235 on the side of the wafer 220.

Although the image formation characteristic is corrected by driving the lens groups 236 to 240 and the plane-parallel plates 235 and 241, a mechanism for correcting the image formation characteristic by sealing a space between the specified lenses in the projection optical system 216 to change the internal pressure may be adopted. Specifically, in FIG. 1, the image formation characteristic such as a magnification may be corrected by controlling a pressure of the gas in the given space 218A in the projection optical system 216 using the image formation characteristic control section 219A. Moreover, the combination of a mechanism for controlling an internal pressure between the lenses with a mechanism for driving the lens or the plane-parallel plate as described above may be used. Moreover, a mechanism for controlling the position of the reticle 214 in the Z direction and the inclination angle thereof may be further combined with them.

[Computing Method of Thermal Deformation Quantity of Reticle] As described above, the measurement mechanism for the irradiation quantity of the exposure light is provided in this embodiment. In order to correct the image formation characteristic in accordance with the measurement results by the measurement mechanism, it is necessary to compute the thermal deformation quantity of the reticle 214 depending on the irradiation quantity of the exposure light and the variation quantity of the image formation characteristic accompanied by the thermal deformation of the reticle 214. Accordingly, a computing method of the thermal deformation quantity of the recticle 214 will be described. The thermal deformation of the reticle 214 is generated depending on the temperature distribution of the reticle 214. Therefore, in order to compute the thermal deformation quantity, the temperature distribution of the reticle 214 at a certain point of time is obtained. As a method to compute this temperature distribution, there has been a method to compute the temperature change in each spot by the calculus of finite difference and the finite element method. In this embodiment, the computation is performed using the calculus of finite difference which is comparatively simple.

Figure 12:
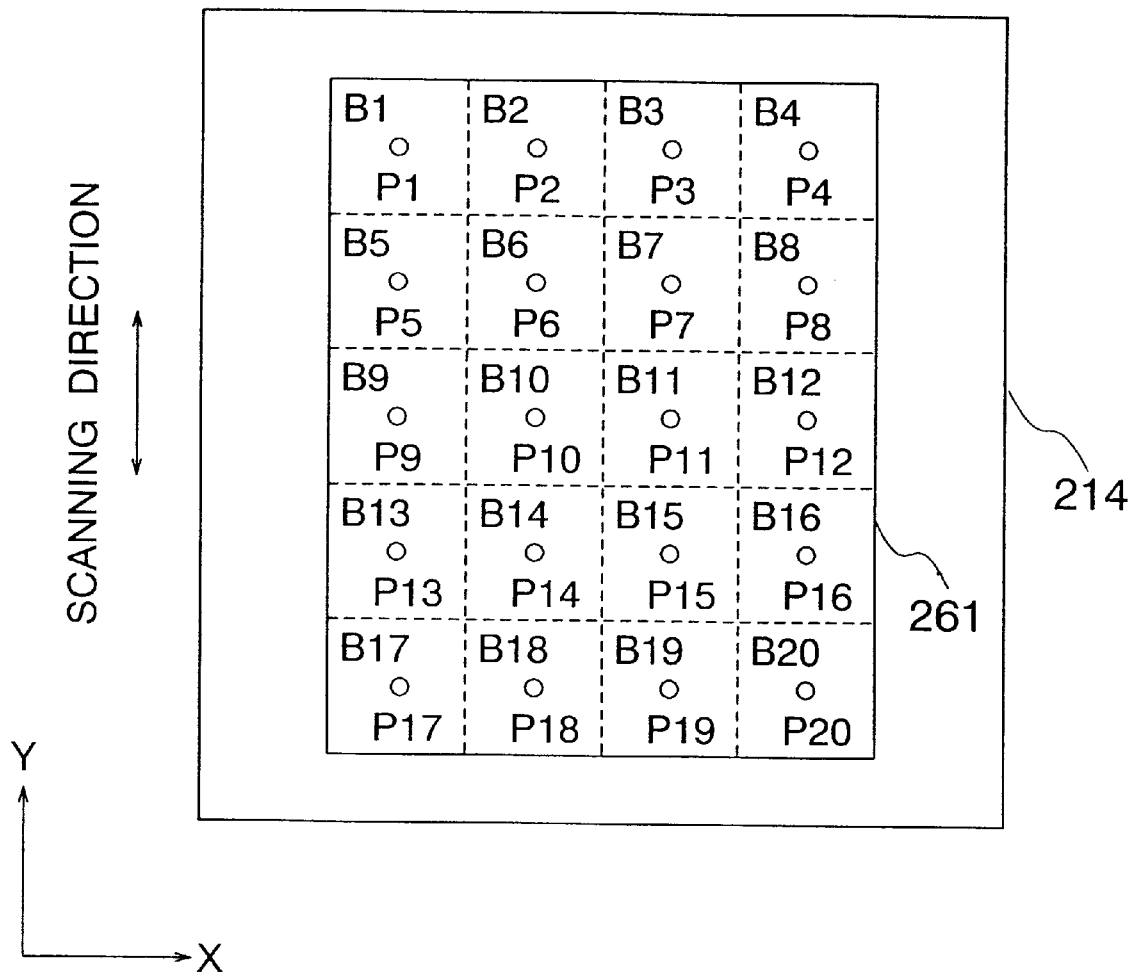
FIG. 12 is a view used for explaining a computing method of the quantity of a thermal deformation of the reticle.

FIG. 12 is the sate where the pattern region 261 of the reticle 214 is divided into five parts in the scanning direction (Y-direction) and into four parts in the non-scanning direction (X-direction), specifically, the state where the pattern region 261 thereof is divided into 20 blocks of 5×4 species. In FIG. 12, the divided blocks are expressed as the block B1 to B20 and the center spots of the blocks B1 to B20 are expressed as P1 to P20. Noted that it is suitable that the number of the divided blocks and the selection of the computing method may finally be determined depending on the required precision, the computing speed of computers and the like. In this embodiment, the division of the pattern region 261 of the reticle 214 into 20 blocks is nothing but for the convenience.

Moreover, even when the blocks B1 to B20 of the reticle 214 is illuminated by the same illuminance, the thermal quantity absorbed in the reticle 214 is different for each of the blocks B1 to B20 due to the distribution of the pattern presence rate. For this reason, it is necessary to obtain the pattern presence rate for each of the blocks B1 to B20 on the reticle 214. However, it is assumed that the absorbed thermal quantities of the blocks are even.

The pattern presence rate of each of the blocks B1 to B20 is obtained from an output ratio of an output of the integrator sensor 208 to that of the irradiation quantity monitor 228 on the sample stage 221 of FIG. 7. To obtain this output ratio, a reticle (test reticle) of the same shape as that of the reticle 214 of FIG. 12, on which no pattern is drawn, is first positioned so that the center of the blocks B1 to B20 in the scanning direction approximately coincides with the center of the illumination region of the exposure light IL (the center of the blocks B1 to B20 being the optical axis AX of the projection optical system 216). Subsequently, the wafer stage 222 of FIG. 7 is made to move, whereby the center of the irradiation quantity monitor 228 is sent to approximately the center of the illumination region by the projection optical system 216. Since the irradiation quantity monitor 228 is required to receive all of the exposure light irradiated onto the wafer 220 and to perform a photoelectric detection, the light receiving plane of the irradiation quantity monitor 228 is formed to be somewhat larger than the exposure region of the projection optical system 216. The irradiation quantity of the exposure light which reaches onto the sample stage 221 through the test reticle and the like is measured.

Thereafter, the shape of the aperture portion of the reticle blind 210 is changed through the driving system 211 so as to illuminate only the block B1 so that the output of the irradiation quantity monitor 228 is measured. At the same time, the output of the integrator sensor 208 is also measured. Then, the shape of the aperture portion of the reticle blind 210 is changed, and the blocks B2 to B4 are sequentially illuminated. At this situation where each of the blocks B2 to B4 is illuminated, the outputs of the irradiation quantity monitor 228 and integrator sensor 208 are measured. Thereafter, the reticle stage 215 is driven, whereby the centers of the blocks B5 to B8 on the subsequent column of FIG. 12 are positioned near the center of the illumination region of the exposure light. Thus, the blocks B5 to B8 are sequentially illuminated through the reticle blind 210, and the outputs of the irradiation quantity monitor 228 and integrator sensor 208 are measured. Moreover, the same measurement operations is executed also for the blocks B9 to B12, the blocks B13 to B16 and the blocks B11 to B20, which are disposed after the subsequent columns.

Next, for the reticle 214 on which a pattern for an actual exposure is drawn, the same measurement as those for the foregoing test reticle is repeated, and the outputs of the irradiation quantity monitor 228 and integrator sensor 208 are measured for each of the blocks B1 to B20. Then, based on the ratio of the output of the irradiation quantity monitor 228 with that of the integrator sensor 208 when the test reticle on which no pattern is drawn is used as well as the ratio of the output of the irradiation quantity monitor 228 with that of the integrator sensor 208 when the reticle 214 on which the pattern is drawn is used, the pattern presence rate on the reticle 214 is obtained for each of the blocks B1 to B20.

Though the test reticle on which no pattern is drawn is used in the measurement of the pattern presence rated in this embodiment, the ratio of the output of the irradiation quantity monitor 228 with that of the integrator sensor 208 may be obtained in the state where the reticle 214 is not present on the reticle stage 215. In this case, since it is unnecessary to prepare the test reticle, a throughput of the manufacturing steps enhances and a manufacturing cost reduces.

Moreover, in this embodiment, the measurements are performed after adjusting the width of the aperture portion of the reticle blind 210 with the sizes of the blocks B1 to B20, respectively. However, if the irradiation quantity monitor 228 is previously divided into four parts so that each part is equal to the sizes of the blocks B1 to B4, the irradiation quantity monitor 228 can monitor the light quantity independently. It is satisfactory that the aperture portion of the reticle blind 210 is widened to a size so as to be able to illuminate all of the blocks B1 to B4, and the light quantities of the four blocks B1 to B4 are simultaneously measured by using the four-divided irradiation monitor. The integrator sensor 208 is disposed more closely to the exposure light source than the reticle 214, and the integrator sensor 208 is not influences by the pattern of the reticle 214. Therefore, there is no problem when the same value is used for the outputs of the integrator sensor 208 for the blocks B1 to B4.

Moreover, by disposing the light receiving plane of the integrator sensor 208 at the position conjugated with the pupil surface of the projection optical system 216, it is possible to make the integrator sensor 208 less prone to be influenced by the pattern of the reticle 214. In this case, it is not required for the light receiving plane of the integrator sensor 208 to secure the size so as to be able to receive all of the exposure light, so that the total size of the illumination optical system can be reduced.

The pattern presence rate of the reticle 214 may be measured every replacement of the reticle 214 with new one. Alternatively, the pattern presence rate of the reticle 214 may be previously measured at the time of manufacturing the reticle 214, and it may be stored in the main control system 234. In this case, it is possible to prevent the reduction of the throughput at the time of the exposure. In the case where the area of each of the blocks B1 to B20 which divide the reticle 214 is equal, the area of the light receiving plane of the irradiation quantity monitor 228 is made to be a size corresponding to that of each block, and the irradiation quantity monitor 228 is made to perform a stepping movement by the wafer stage 222, whereby the transmitting light quantity on the entire surface of the reticle 214 may be measured. In this method, there is an advantage that the wafer stage 222 can be manufactured to be small-sized.

Subsequently, the thermal absorption quantity of each of the blocks B1 to B20 is computed based on the pattern presence rate of each block. Each block absorbs in proportion to the illuminance of the exposure light IL, which is in proportion to the power of the exposure light source 201, as well as the pattern presence rate. The heat absorbed moves to the air or the reticle stage 214 by radiation or diffusion. In addition, the thermal transfer occurs also between the blocks. The thermal transfer between two bodies is first considered. The thermal transfer in this case is principally in proportion to a temperature difference between the two bodies. Moreover, the changing rate of the temperature change accompanied by the thermal transfer is in proportion to the transfer quantity of the heat. These physical quantities are expressed as follows by the equations.

$$\Delta Q = k_1 \cdot (T_1 - T_2)$$

$$(dT_1)/(dt) = -k_2 \cdot \Delta Q,$$

$$(dT_2)/(dt) = k_3 \cdot \Delta Q \tag{Equ. 1}$$

where $\Delta Q$ is the thermal quantity, $T_1$ and $T_2$ are a temperature of each of the bodies, t is a time, $k_1$, $k_2$ and $k_3$ are a proportion coefficient. From the above-described equations, the following equation are established, $$(dT_1)/(dt) = -k_4 \cdot (T_1 - T_2),$$

$$(dT_2)/(dt) = k_5 \cdot (T_1 - T_2) \tag{Equ. 2}$$

where $k_4$ and $k_5$ are a proportion coefficient. The above-described equations shows a first-order lag system. When there is a temperature difference between $T_1$ and $T_2$, both reach the predetermined temperature while drawing an exponential curve. Based on the above-described equations, the temperature distribution of the reticle 214 is computed.

First, when attention is paid to the block B1 of FIG. 12, the block B1 performs a heat exchange with the blocks B2 and B5 (thermal conduction). Block B1 performs the heat exchange also with the air and the reticle stage 215. For the simplicity, it is assumed that the change quantities of the temperatures of the air and reticle stage 215 are very small compared to that of each of the blocks B1 to B20, and the temperatures of the air and reticle stage 215 are always constant. When the temperatures of the blocks B1 to B20 are expressed as $T_1$ to $T_{20}$; the temperature of the air, $T_0$; and the temperature of the reticle stage 215, $T_H$, the following equation is established as to the block B1, $$(dT_1)/(dt) = k_{12} \cdot (T_2 - T_1) + k_{15} \cdot (T_5 - T_1)$$

$$+ k_H \cdot (T_H - T_1) + k_0 \cdot (T_0 - T_1)$$

$$+ k_P \cdot \eta_1 \cdot P \cdot D_1 \tag{Equ. 3}$$

where $k_{12}$ and $k_{15}$ are coefficients showing the heat conduction between the blocks B1 and B2 and between the blocks B1 and B5; reference symbol $k_H$, a coefficient showing the heat conduction between the block B1 and the reticle stage 215; and reference symbol $k_0$, a coefficient showing the heat conduction between each of the blocks B1 to B20 and the air. Moreover, reference symbol $\eta_1$ is the pattern presence rate of the block B1 and P is the power of the exposure light source 201, which corresponds to the output of the integrator sensor 208. Reference symbol $D_1$ is a coefficient showing a rate of the portion of the block B1 illuminated by the illumination light, which takes the value of 0 to 1. When the illumination light is irradiated onto the whole of the block B1 $D_1$ is equal to one, and then $D_1$ gradually reduces in accordance with the rate area of the illuminated area on the block B1 as the position of the reticle 214 shifts depending on the exposure. When the block B1 is outside the illumination region, D1 becomes equal to zero. As a matter of course, when the illumination is not performed, D1 becomes Zero. The value of D1 can be obtained by the computation based on the position of the reticle stage 215 and an aperture area of the reticle blind 210. Reference symbol $k_P$ is a coefficient relating the heat quantity absorbed by each of the block to value $\eta$ and P. The final term of the above-described equation expresses the heat quantity absorbed from the illumination light, and other terms express the heat quantum dispersed.

Here, $T_H$ and $T_0$ are constant. When $T_H = T_0$, the temperature of each of the blocks B1 to B20 can be expressed in the form $T_0 + \Delta T_1$ to $T_0 + \Delta T_{20}$. Moreover, since each of the blocks on the reticle 214 is formed of the same substance (usually, quartz is often adopted), considering that all of the coefficients such as $k_{12}$ and $k_{15}$, which express the heat conduction between the adjacent blocks, are equal, the Equation (3) is expressed by the following equation.

$$(d\Delta T_1)/(dt) = k_R \cdot (\Delta T_2 - \Delta T_1) + k_R \cdot (\Delta T_5 - \Delta T_1)$$

$$+ k_H \cdot (-\Delta T_1) + k_0 \cdot (-\Delta T_1) + k_P \cdot \eta_1 \cdot P \cdot D_1$$

$$= (-2 \cdot k_R - k_H - k_0) \cdot \Delta T_1 + k_R \cdot \Delta T_2$$

$$+ k_R \cdot \Delta T_5 + k_P \cdot \eta_1 \cdot P \cdot D_1 \tag{Equ. 4}$$

The above-described equation is obtained for each of the blocks B1 to B20, the solutions are expressed by the matrix as follows. In the following equation, P1 to P20 are a power of the exposure light source 201 for the blocks B1 to B20, and $\Delta T_1$ to $\Delta T_{20}$ are a temperature change quantity of the blocks B1 to B20.

$$\begin{bmatrix} \frac{d\Delta T_1}{dt} \\ \frac{d\Delta T_2}{dt} \\ \cdot \\ \cdot \\ \cdot \\ \frac{d\Delta T_{20}}{dt} \end{bmatrix} = \begin{bmatrix} -2 \cdot k_R - k_H - k_0 & k_R & 0 & 0 & k_R & 0 & 0 & \ldots & 0 \\ k_R & -3 \cdot k_R - k_0 & k_R & 0 & 0 & k_R & 0 & \ldots & 0 \\ \cdot & & & & & & & & \cdot \\ \cdot & & & & & & & & \cdot \\ \cdot & & & & & & & & \cdot \\ 0 & & & \ldots & & & -2 \cdot k_R - k_H - k_0 \end{bmatrix} \begin{bmatrix} \Delta T_1 \\ \Delta T_2 \\ \cdot \\ \cdot \\ \cdot \\ \Delta T_{20} \end{bmatrix} + k_P \cdot \begin{bmatrix} \eta_1 \cdot P_1 \cdot D_1 \\ \eta_2 \cdot P_2 \cdot D_2 \\ \cdot \\ \cdot \\ \cdot \\ \eta_{20} \cdot P_{20} \cdot D_{20} \end{bmatrix}$$

(Equ. 5)

This is a twenty dimensional simultaneous equation system of the first-order differential equation, which can be solved by a numerical analysis. This can be solved also by expressing the differential form as a value of the minute time (the computation period of the computer) in the finite difference style. It is suitable that the computation period is determined from the capability of the computer and the required precision. When the computation period is coarse for the required precision, the coefficients $P_1$ to $P_{20}$ and the coefficients $D_1$ to $D_{20}$ must be stored as an average value during the computation period. When the coefficients P1 to P20 are computed, by sequentially measuring the output of the integrator sensor 208, the power variation of the exposure light source 201 is measured, whereby the computation precision can be enhanced. Moreover, when the computation period is sufficiently fine for the required precision, an instantaneous value computed may be used as the coefficients $P_1$ to $P_{20}$ and the coefficients $D_1$ to $D_{20}$. In this case, since it is unnecessary to store these coefficients as the average value of the computed period, the program can be simplified, and the memory of the computer can be saved.

Moreover, since the term related to the external effect (the heat quantity absorbed from the exposure light) is the final term, from the value of the coefficient of each of the blocks B1 to B20 every unit time, e.g., from the values of η1, P2, D2, . . . , η20, P20, D20, the values of ΔT1 to ΔT20 for each time can be obtained. The values of the pattern presence rate η1 to η20 can be obtained by actual measurements, and the incidence light quantity P1 to P20 can be obtained using the integrator sensor 208 and the irradiation quantity monitor 228. Moreover, the coefficients $k_R$, $k_0$, $k_H$ and $k_P$ can be obtained by computations from physical properties of the reticle 214, physical properties of the air, a flow rate of the air and the like. Alternatively, experiments are conducted as to various kinds of reticles, and hence coefficients may be determined so as to best fit actualities.

By the obtained temperature distributions $\Delta T_1$, to $\Delta T_{20}$ of the reticle 214 and the expansion coefficient of the reticle 214 (quartz glass), the mutual distance between the center spots P1 to P20 of each of the blocks B1 to B20 can be obtained, and the displacement of each spot on the reticle 214 can be determined. Based on the obtained results, the variation of the image formation characteristic, for example, the distortion of the image projected onto the wafer 220, can be computed.

Among the reticles, coefficients expressing the heat conduction between the air and them differ. This is because there may be a change of a heat movement originating from the properties such as reflection coefficient, and thermal transfer coefficient of the thin film in the surface of the reticle and a percale (dust preventing film) fitted thereto for dust prevention and a material of the reticle may sometimes differs. Therefore, when coefficients expressing the same heat conduction among the plurality of reticles can not be used, several kinds of the coefficients expressing the heat conduction are previously stored, and they may be selectively used depending on the reticle.

In this embodiment, the computations are conducted assuming that the periphery of the reticle 214 is surrounded by the air. However, the same method can be applicable to another fluid. In the case where nitrogen is used as another fluid, occurrence of ozone can be prevented in the case where the exposure light source 201 is an ArF excimer laser light source and the like. Specifically, there is an advantage that absorption of the exposure light by oxygen is removed. Moreover, when helium is used as another fluid, the effect of a reduction in the change quantity of the image formation characteristic of the projection optical system 216 with the change of the air pressure is exhibited in addition to the effect of preventing the occurrence of ozone, because of a smaller refractive index of helium compared to those of the air and oxygen. Therefore, the driving quantity of the image formation correction section 218 can be reduced.

Moreover, in this embodiment, the method is employed, in which after obtaining the temperature distribution ΔT of the reticle 214, the movement of the center spot P of each of the blocks is obtained, and the image distortion is obtained. However, the image distortion (the image formation characteristic such as the distortion and the field curvature) can be directly computed instead of the temperature distortion ΔT. In this case, in order to obtain each of the coefficients $k_R$, $k_0$, $k_H$ and $k_P$ by experiments, also the deformation due to the deflection of the reticle 214 is included in the computation. Even when the reticle 21 exhibits a very excellent heat conduction and the pattern is only at a part of the reticle 214 or the irradiation of the exposure light is limited to the part of the reticle 214, the complicated computations as described above are unnecessary as long as no problem of precision occurs on the assumption that the reticle 214 uniformly expands. Thus, the image distortion may also be computed by more simplified computations.

[Resolution of Thermal Deformation Quantity of Reticle to Each Component]

Next, the movement quantities of the center spots P1 to P20 of the blocks B1 to B20 of the reticle 214 are resolved into each component.

Figure 13:
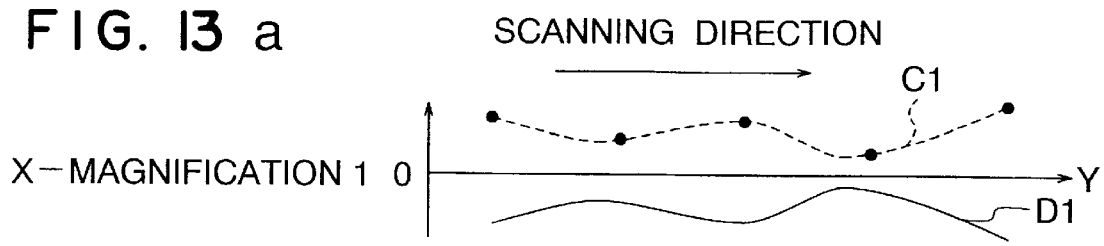
FIGS. 13a to 13g are a view showing the relation between components obtained by dissolving the quantity of a thermal deformation of the reticle and the quantity of a correction of an image formation characteristic corresponding thereto.
Figure 13:
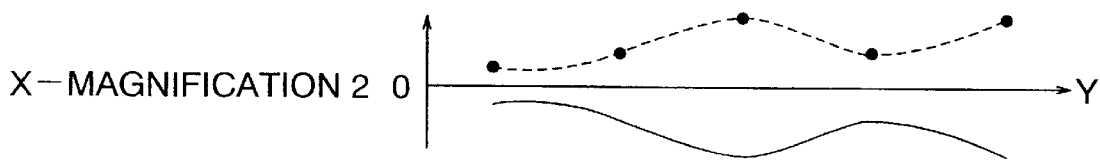
Figure 13:
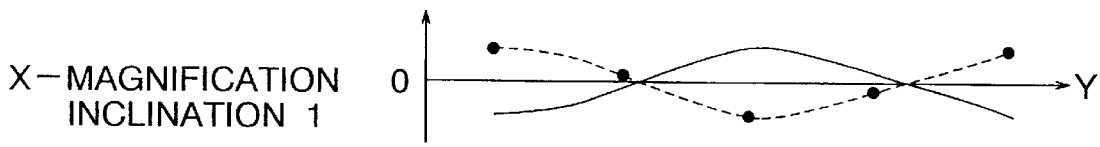
Figure 13:
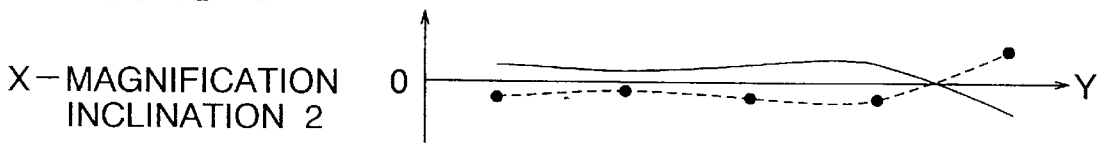
Figure 13:
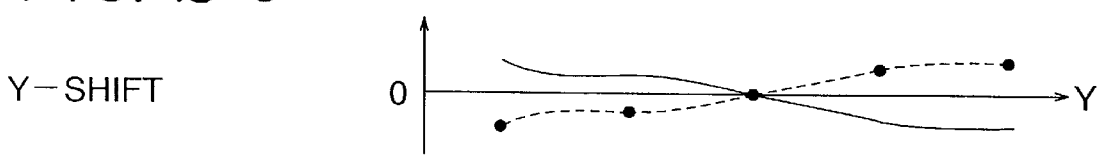
Figure 13:
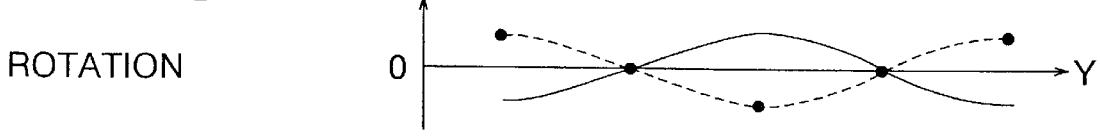
Figure 13:
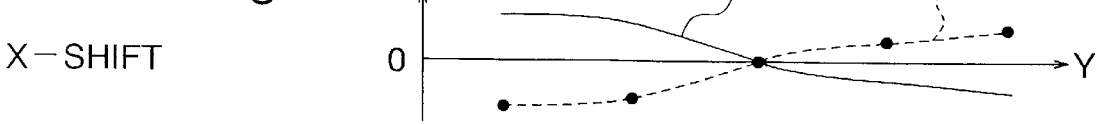

FIG. 13a to FIG. 13g show an example of the relation between the Y coordinate of the reticle 214 and each component of the thermal deformation quantity and the correction quantity corresponding to it. In FIGS. 13a to 13g, the abscissa shows the position (Y coordinate) of the reticle 214 in the scanning direction and the ordinate shows the thermal deformation quantity of the recticle 214 corresponding to the Y coordinate or the correction quantity, in which the curves C1 to C7 illustrated by the dotted lines show the computation value of the deformation quantity, and the curves D1 to D7 illustrated by the solid lines show the correction quantity corresponding thereto. The X-magnification 1 of FIG. 13a is the magnification change quantity computed from the movement quantity of the outside center spots P1 and P4 of FIG. 12 toward the X-direction, and the X-magnification 2 of FIG. 13b is the magnification change quantity computed from the movement quantity of the inside center spots P2 and P3 of FIG. 12 toward the X-direction. Moreover, the X-magnification inclination 1 of FIG. 13c is the value computed from the difference between the movement quantities of the outside center spots P1 and P4 in the X-direction, and the X-magnification inclination 2 of FIG. 13d is the value computed from the difference between the movement quantities of the inside center spots P2 and P3 in the X-direction.

If there is a deviation in the pattern presence rate of the reticle 213, for example, when the pattern presence rate is large in the blocks B1 and B2 and it is small in the blocks B3 and B4, the thermal deformation quantity of the reticle 214 becomes larger in the blocks B3 and B4, and a deviation in the magnification in the X-direction appears. Moreover, The Y shift of FIG. 13e shows the average movement quantity of the center spots P1 to P4 of FIG. 12 in the Y-direction, the rotation of FIG. 13f shows the rotation angle obtained by performing a linear approximation for the relation between the average movement quantity of the center spots P1 to P4 in the Y-direction and the image height, and the X shift of FIG. 13g shows the average movement quantity of the center spots P1 to P4 in the X-direction. Each of the above-described components is computed every time when the reticle 214 is sequentially moved in the Y-direction by a predetermined step quantity on computation.

[Conversion to Function in Accordance with Position of Each Component in Scanning Direction]

Figure 14:
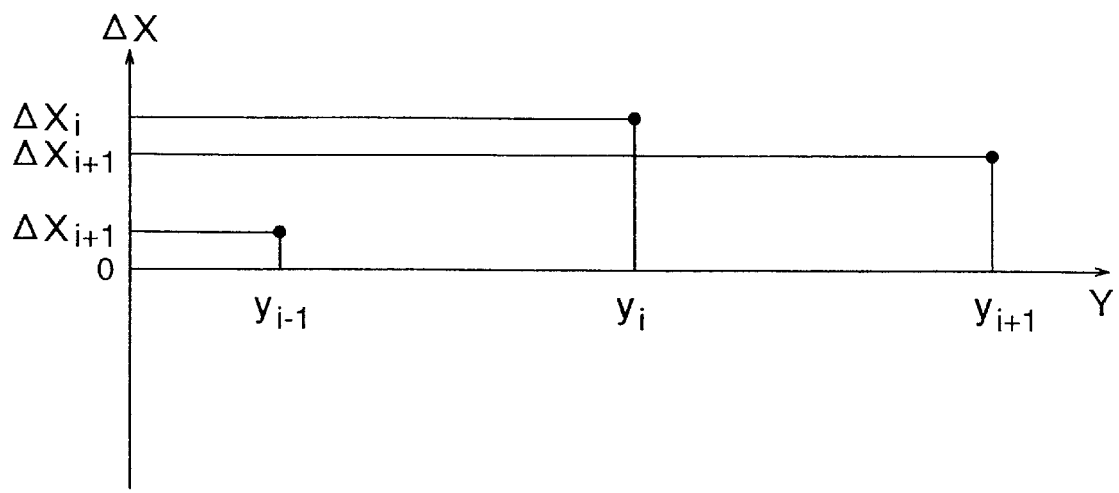
FIG. 14 is a view used for explaining a method to relating the components of the quantity of the thermal deformation with the coordinates in a scanning direction as a function thereof.

Next, the obtained components are approximated by the function of the Y coordinate. Here, for the simplicity the description only for the X-magnification 1 of FIG. 13a will be made. FIG. 14 shows an example of the value ΔX of the X-magnification 1 obtained for each position of the Y coordinate. In FIG. 14, the number of the measurement spots in the Y-direction is expressed by n (n: integer equal 2 or more, in this embodiment, n=5), the Y coordinate of the i-th measurement spot is expressed by $y_1$ (i=1 to 5), and the X-magnification 1 in the position yi is expressed by Δxi. At this time, the value of the X-magnification 1 corresponding to the Y coordinate is defined as f(y) when the value of the Y coordinate is set to y. The value f(y) of the X-magnification 1 is expressed by the (n−1) order function of the value y of the Y coordinate using of the coefficient $a_1$ of n species (i=0 to n−1), the values of the coefficient $a_1$ is determined using the computed n-sets of values $(y_j, \Delta x_j)$.

$$f(y) = \sum_{i=0}^{n-1} (a_i \times y^i) \quad \text{(Equ. 6)}$$

Specifically, in the Equation (6), the computation condition is as follows.

$\Delta x_j = f(y_j)$ (j=1 to n)

In this embodiment, as shown in FIG. 12, since the reticle 214 is divided into five species when it is divided into a plurality of blocks, the value of n becomes 5, and the Equation (6) is a quaternary function. The fourth degree function can be determined univocally from the conditions at the five spots.

Moreover, as another mode function used instead of the Equation (6), the following function may be used, in which differential coefficients for the three spots except for the end spots among the five spots are added as the computation condition.

$$f(y) = \sum_{i=0}^{2 \times n-3} (a_i \times y^i) \quad \text{(Equ. 7)}$$

In this case, the computation condition is as follows.

$\Delta X_j = f(y_j)$ (j=1~n), $(df(y_j))/dy = (\Delta X_{j+1} - \Delta X_{j-1})/(y_{j+1} - y_{j-1})$ (j=2~n−1) (Equ. 8)

Also in this case, n is equal to 5. The equation 7 is a seventh degree function passing through the five spots, and the seventh degree function can be obtained univocally from the information of eight species in total including the condition passing through the five spots and the three differential coefficients. This function is smooth in each spot from the quaternary function passing through the foregoing five spots. Moreover, in order to more enhance the computation precision of the thermal deformation quantity, it is desirable that also the deformation outside the pattern region of the reticle 214 is considered.

Figure 15:
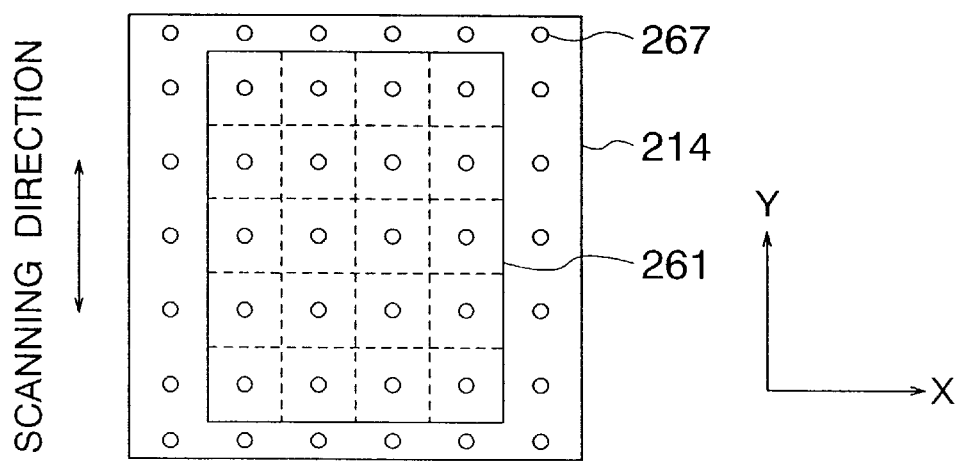
FIG. 15 is a view showing an example of a distribution of computation points of the quantity of the thermal deformation of the reticle in the case where a heat movement outside an exposure region is taken into consideration.

FIG. 15 shows the model of the computation by providing the computation spot also outside the pattern region 261 of the reticle 214. In FIG. 15, the computation spot 267 is provided also the periphery of the pattern region 261. In this case, the model function expressing the value f(y) of the X-magnification 1 is as follows similarly to the Equation (7).

$$f(y) = \sum_{i=0}^{2 \times n-3} (a_i \times y^i) \quad \text{(Equ. 9)}$$

In FIG. 15, since the measurement spots (the center spot of each block in the pattern region 261) in the scanning direction are seven species, n is 7. This function becomes smooth also in the two spots on both ends in the pattern region 261.

Also other components shown in FIGS. 13b to 13g are expressed similarly as function of the Y coordinate. Each of the components of the image formation characteristic converted to the form of the function is stored in the memory section in the main control section 234 of FIG. 7, and the main control section 234 corrects the respective image formation characteristics so as to cancel the stored components, for example. As described above, in this embodiment, each component of the thermal deformation quantity of the reticle 214 is expressed as the function for the Y coordinate. However, when the severe correction precision is not required, the thermal deformation quantity of the reticle 214 may be discontinuously corrected for each compute coordinate. Moreover, each component may be converted to a function form by a linear interpolation more simply.

In the case where only a part of the pattern region of the reticle is exposed for example, thermal deformation data only for that exposed region may be used.

Figure 16:
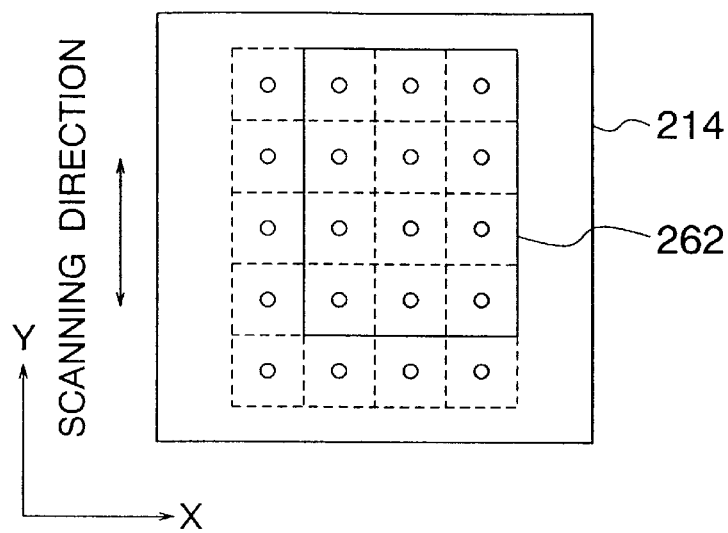
FIG. 16 is a view used for explaining a computing method of the quantity of a thermal deformation of the reticle in the case where only a part of the reticle is an exposure region.

FIG. 16 shows a model in the case where a part of the pattern region of the reticle is exposed without using the whole of it. In FIG. 16, it is assumed that only the region 262 in the pattern region of the reticle 214 is exposed. In this case, the computation is executed for the measurement spots including the entire surface of the pattern region 261 of the FIG. 12 or FIG. 16. However, it is assumed that the thermal deformation data used for resolving into each component of FIGS. 13a to 13g is the one of the measurement spot (center spot of each block) in the region 262. Thus, the computation precision of the changing quantity of the image formation characteristic increases. In other words, since there is a heat conduction also outside the region 262 to be exposed, by computing the thermal deformation quantity in the region including the entire surface of the pattern region, the computation precision of the thermal deformation quantity becomes high. Next, by obtaining each component of the image formation characteristic only from the computation value in the exposure region 262, a high precision component resolution is possible, so that the correction can be performed with a high precision.

Figures 17A, 17B:
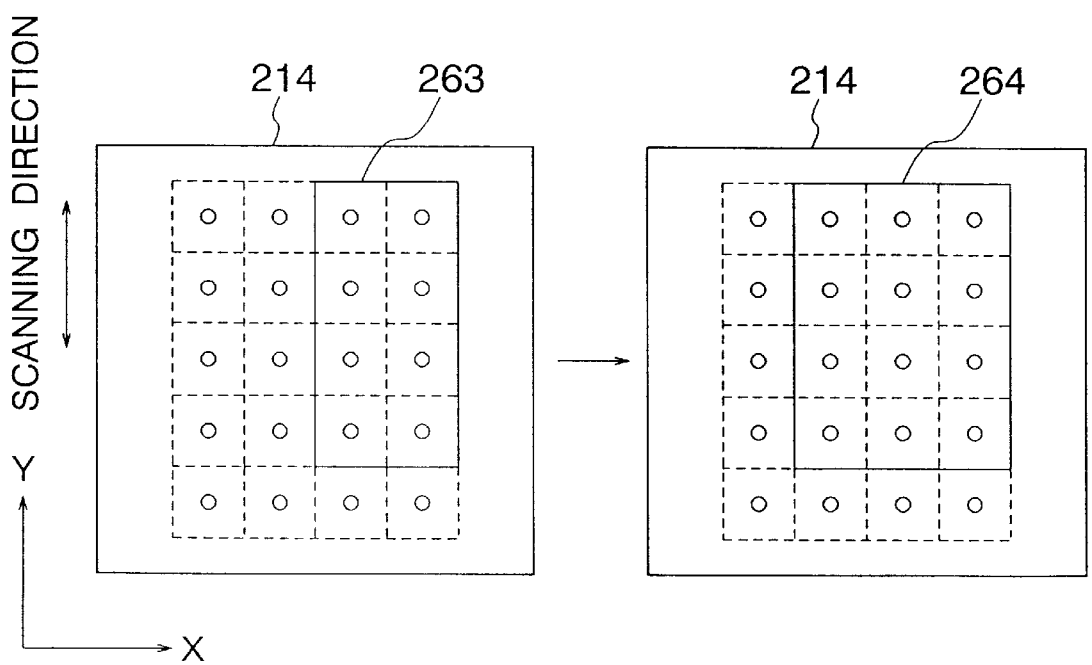
FIGS. 17a and 17b are a view used for explaining a computing method of the quantity of the thermal deformation of the reticle in which a heat movement outside an exposure region is taken into consideration, in the case where only a part of the reticle is the exposure region.
Figures 18A, 18B:
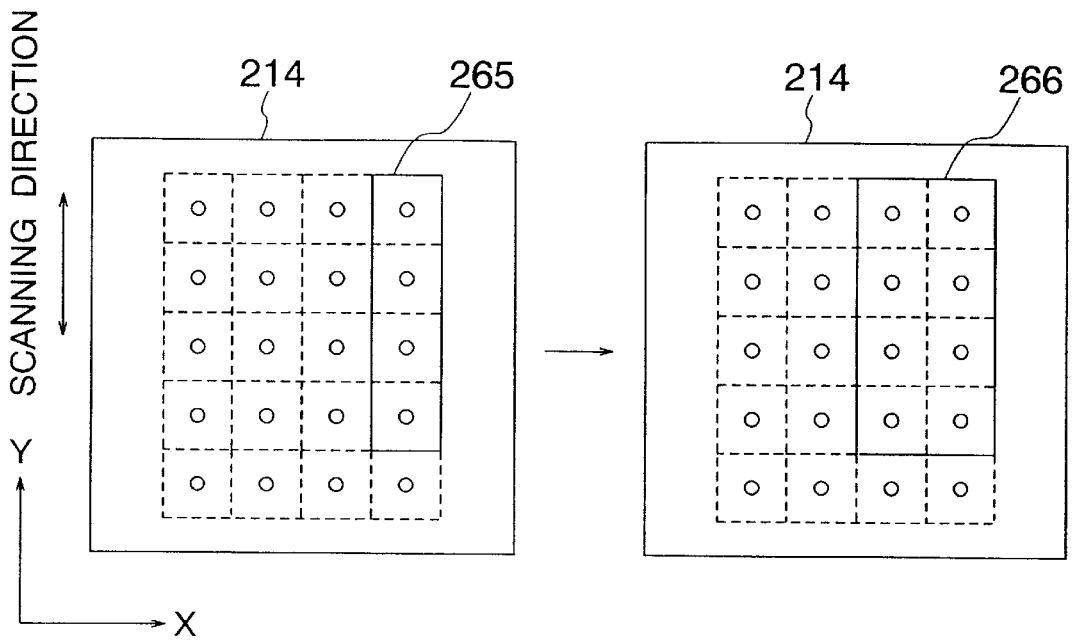
FIGS. 18a and 18b are a view used for explaining another computing method of the quantity of the thermal deformation of the reticle in which a heat movement outside an exposure region is taken into consideration, in the case where only a part of the reticle is the exposure region.

Moreover, in the case where the region on the reticle 214 to be exposed is the region 263 which is long in the Y-direction of FIG. 17a, the computation spot of the thermal deformation quantity of the reticle 214 is the region 264 which is the region 264 widened by one block in the X-direction as shown in FIG. 17b, and the measurement data in the region 263 at the time when each component is obtained may be used. Moreover, in the case where the region to be exposed is the region 265 disposed in the end of the pattern region as shown in FIG. 18a, the computation spot of the thermal deformation may be the region 266 obtained by widening the region by one block toward the inside. Thus, when the exposure area is small, the computation quantity can be reduced, almost without lowering the precision of the change quantity of the obtained image formation characteristic. It should be noted that in the case of FIG. 18b, the computation spot may be provided outside the pattern region.

Ordinarily, in order to increase the throughput in the scanning exposure apparatus, the scanning direction of the reticle 214 is inverted from the +Y-direction to −Y-direction and vice versa, every time when the transition of the exposure to the next shot region is performed. At this time, since the function expressing the foregoing image formation characteristic is a function corresponding to the Y coordinate, the function is applicable as it is even when the scanning direction is switched. Moreover, when the computation is performed using computers, a method may be also adopted, in which the values of the foregoing function is stored in the memory every a certain interval of the Y coordinate and the value of the Y coordinate is not stored. In this case, there is an advantage that the capacitance of the memory can be saved. In the case where the scanning is performed in the reverse direction, it is satisfactory that the order of reading out the address is reversed to the positive direction scanning, and each component of the image formation characteristic is read out from the memory.

Next, a correction method every each component of the image formation characteristic will be described.

[Correction Method of X-Magnification 1 and X-Magnification 2]

The X-magnification 1 and the magnification 2 of FIGS. 13a and 13b can be changed by driving the five lens groups 236 to 240 of the projection optical system 216 of FIG. 8 in the optical axis direction. Ordinarily, since the ratio of the X-magnification 1 of the reticle 214 to the magnification 2 thereof is not agreement with the ratio of the X-magnification 1 and the X-magnification 2 to the magnification change quantity at the same image height at the time when a certain part of the lens groups is driven, at least two lens groups which are simultaneously combined must be driven, in order to correct the X-magnification 1 and the X-magnification 2 simultaneously. At this time, since also other image formation characteristics (field curvature, coma aberration and spherical aberration) change, further other three lens groups are also driven, so that the lens groups 236 to 240 of five in total are driven. Thus, the X-magnification 1 and the X-magnification 2 are changed to predetermined values, whereby the changes of the field curvature, the coma aberration and the spherical aberration can be suppressed. In the case where the coma aberration and the spherical aberration generated by driving the lens groups 236 and 240 when the X-magnification 1 and the X-magnification 2 are corrected are small and they can be neglected, the number of the lens groups 236 to 240 to be driven may be reduced. In the case where the magnification change at the intermediate image height between the corrected X-magnifications 1 and 2 can not be neglected, it is suitable that one lens group to be driven is further added and the correction is performed by driving the lens groups of six in total.

When the lens groups 236 to 240 are driven in accordance with the Y coordinate in order to correct the X-magnification 1 and the X-magnification 2, the position (best focus position) of the image surface changes. When the best focus position changes as described above, it is satisfactory that based on the detection result of the focus position from the AF sensors 226 and 227 of FIG. 7, the target value at the time when the sample stage 221 is driven in the Z direction may be corrected. In this case, the target value of the Z coordinate of the sample stage 221 sometimes changes in accordance with the Y coordinate. It should be noted that as the correction method of the focus position, the correction may be performed by adding a function to move the reticle 214 upward and downward. In this case, when a reduction projection optical system is used as the projection optical system 216, there is an advantage that a positioning precision in the optical axis direction may be somewhat coarse.

Although it is ideal that each of the lens groups 236 to 240 should be driven in parallel with the optical axis in the correction of the X-magnification 1 and the X-magnification 2, the parallelism of them with the optical axis is somewhat shifted due to manufacturing errors ordinarily. Moreover, also the lens surface involves the manufacturing error, and the lens surface is not necessarily always in a perfect ideal state. Therefore, sometimes, the position of the projection image of the pattern image of the reticle 214 onto the wafer 220 somewhat shifts by driving each of the lens groups 236 to 240. In this case, it is necessary that the relation between the driving quantity of the lens groups 236 to 240 and the shift quantity of the image position is previously experimentally obtained in the reticle and stored. In the case where the lens groups 236 to 240 are driven to correct the X-magnification 1 and the magnification 2, the total shift quantity is obtained from the stored relation, and the correction may be performed by adding the total shit quantity to the later described X shift correction quantity and the Y shift correction quantity.

[Correction Method of X-Magnification Inclination 1 and Magnification Inclination 2]

The X-magnification inclination 1 and the X-magnification inclination 2 of FIGS. 13c and 13d are corrected by inclining the five lens groups 236 to 240 of FIG. 8 relative to the optical axis in the X-direction (around the axis parallel to the Y-axis). Since the ratio of the X-magnification inclination 1 to the X-magnification inclination 2 of the reticle 214 is not ordinarily in agreement with the ratio of the X-magnifications 1 and 2 at the time when a part of the lens groups is inclined to the change quantity of the magnification inclination at the same image height, it is necessary to simultaneously inclination at least two lens groups in the optical axis direction, in order to simultaneously correct the X-magnification inclination 1 and the X-magnification inclination 2. At this time, since other image formation characteristics (field inclination, coma inclination, and inclination of spherical surface) change by the inclination of the lens groups 236 to 240, further three lens groups are simultaneously driven, so that the lens groups 236 to 240 of five in total are inclined, whereby the X-magnification inclination 1 and the X-magnification inclination 2 are previously made to be predetermined values. Thus, the changes of the field inclination, inclination of the coma aberration and inclination of the spherical aberration are suppressed.

In the case where the inclination of the coma aberration and the spherical aberration generated by inclining the lens groups 236 and 240 when the X-magnification inclination 1 and the X-magnification inclination 2 are corrected are small and they can be neglected, the number of the lens groups inclined may be reduced. In the case where the magnification change of the intermediate image height between the corrected X-magnifications inclinations 1 and 2 can not be neglected, it is suitable that one lens group to be inclined is further added and the correction of the image formation characteristic is performed by inclining the lens groups of six in total.

For the inclination of the coma aberration, the correction may be performed by inclining the plane-parallel plate 241 on the tip of the projection optical system 216. In this case, since the inclination of the coma aberration occupies a great part of the change of the image formation characteristic generated by inclining the plane-parallel plate 241 on the tip of the projection optical system 216, it is possible to perform the correction having a high independence. There is an advantage that the inclination quantity of the lens groups 236 to 240 can be reduced.

The image surface inclination generated when the lens groups 236 to 240 are inclined simultaneously causes the inclination of the astigmatic aberration. When the generation quantity of the inclination of the astigmatic aberration is small, the correction may be performed by changing the relative parallelism of the reticle 214 and the wafer 220. Particularly, in the case of the reduction magnification projection optical system, when the wafer 220 is inclined, there is an advantage that the inclination quantity is small, and in the case where the reticle 214 is inclined, there is an advantage that the positioning precision can be relaxed to a comparatively loose degree. When the wafer 220 and the reticle 214 are combined and they are inclined together, the inclination quantity of the wafer 220 can be reduced and the position of the reticle 214 can be decided finely.

The correction of the image surface inclination is performed by inclining the lens groups 236 to 240 in this embodiment, and this correction method can be applied to the case where the image surface inclination occurs by an irradiation of the exposure light onto the projection optical system 216. Moreover, this correction method can be applied to the correction of the image inclination generated when the parallelism of the wafer 220 and the reticle 214 is bad, as well as the correction image inclination generated by changing the illumination conditions (sorts of the aperture diaphragm of the illumination system, the aperture shape of the reticle blind 210, the pattern of the reticle 214, the aperture shape of the aperture diaphragm 217 of the projection optical system 216 and so on).

By inclining the lens groups 236 to 240 and the plane-parallel plate 241, the position of the projection image of the pattern image of the recticle 214 onto the wafer 220 somewhat shifts. In this case, it is necessary to store the relation between the inclination angle of the lens groups 236 to 240 and the shift quantity of the image position, after previously obtaining it by an experiment. In the case where the lens groups 236 to 240 are inclined based on the corrections of the X-magnification inclination 1 and the X-magnification inclination 2, it is suitable that the total shift quantity is obtained from the stored relation and then the correction is performed by adding the obtained shift quantity to the later described X shift correction quantity and the Y shift correction quantity.

[Correction Method of Y shift]

The Y shift of FIG. 13e is corrected by shifting the relative position of the reticle 214 and the wafer 220 in the Y-direction. Usually, since the reticle 214 changes in a direction to increase the magnification by exposure light absorption, the relative speed of the reticle 214 and the wafer 220 may be resultingly changed in accordance with the Y coordinate of the reticle 214. Concretely, the Y shift quantity is obtained in accordance with the Y coordinate, and the correction is performed by changing the scanning speed of the reticle 214 so as to cancel the Y shift quantity in accordance with the Y coordinate. At the time of the correction, the correction including the Y shift quantity generated by the driving and inclination of the lens groups 236 to 240 of FIG. 8 is performed.

When the Y shift in which the reticle 214 expands in the Y-direction by the exposure light absorption occurs, the scanning speed of the reticle 214 is made to be fast. On the contrary, when Y shift in which the reticle 214 contracts in the Y-direction, the scanning speed of the reticle 214 is made to be slow. It should be noted that the Y shift may be corrected by the wafer stage 222. In this case, when Y shift in which the reticle 214 expands in the Y-direction occurs, the scanning speed of the wafer stage 222 is made to be slow. On the contrary, when Y shift in which the reticle 214 contracts occurs, the scanning speed of the wafer stage 222 is made to be fast.

[Correction Method of Rotation]

The component of the rotation of FIG. 13f is corrected by changing the relative rotation quantity of the reticle 214 and the wafer 220. Specifically, it is suitable that the reticle 214 is made to rotate by the rotation mechanism 249 on the reticle stage 215 of FIG. 11. At this time, when the blocks B1 to B4 of the reticle 214 is illuminated in FIG. 12, the rotation quantity is controlled in accordance with the Y coordinate so that the center spots P1 to P4 of the blocks B1 to B4 are made to be perpendicular to the scanning direction relative to the illumination region. It should be noted that the rotation may be corrected on the side of the wafer 222. In this case, a rotation mechanism (not shown) is previously provided on the side of the wafer stage 222, and the wafer 220 is rotated by the rotation mechanism.

[Correction Method of X Shift]

The X shift of FIG. 13g is corrected by shifting the reticle stage 215 in the X-direction. At the time of the correction, the X shift quantity generated by driving and inclining the lens groups 236 to 240 is also corrected. At this time, when the blocks B1 to B4 of the reticle 214 are illuminated, concerning the illumination region, the X shift quantity is controlled in accordance with the Y coordinate so that the X shift quantity of the center spots P1 to P4 of the blocks B1 to B4 becomes a shift quantity at the center of the illumination region. The X shift may be corrected on the side of the wafer 220. In this case, the wafer 220 may be shifted in the X-direction by the same quantity as the X shift.

[Computation Method of Changing Quantity of Image Formation Characteristic of Projection Optical System]

Next, the measurement of the image formation characteristic of the projection optical system 216 of FIG. 7 and the computation method thereof will be described. For the preparation for this, the reflectance R of the wafer 20 is obtained. Two reflection plates (not shown) of a size to cover the rectangular exposure region, which respectively exhibit the reflectance equal to RH and RL (RH>RL), are provided on the sample stage 221 on the wafer stage 222. In the state where the reticle 214 is provided on the reticle stage 215, the reflection plate exhibiting the reflectance of RH is moved to the exposure region of the projection optical system 216 by driving the wafer stage 222. Subsequently, the illumination conditions (the sorts of the aperture diaphragm of the illumination system, the aperture shape of the reticle blind 210, the pattern of the reticle 214, and the aperture shape of the aperture diaphragm 217 of the projection optical system 216) are set to a predetermined state, and then the output VH of the reflection sensor 209 is measured, while moving the reticle 214 in the Y-direction by a predetermined distance. Next, by driving the wafer stage 222, the reflection plate exhibiting the reflectance of RL is moved to the exposure region of the projection optical system 216. The output VL of the reflectance sensor 209 is measured while moving the reticle 214 in the Y-direction by a predetermined distance.

Figure 19:
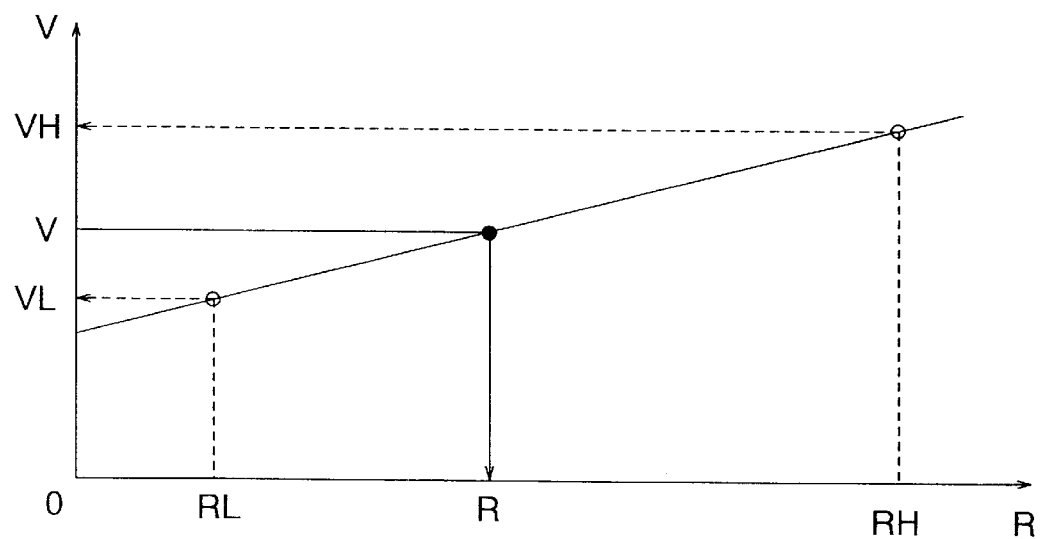
FIG. 19 is a view showing a relation between a reflectance of a wafer and an output of a reflectance sensor.

FIG. 19 shows the relation between the reflectance of the wafer 220 measured and the output of the reflectance sensor 209. In FIG. 19, the abscissa shows the reflectance R measured and the ordinate shows the output V of the reflectance sensor 209. As shown in FIG. 19, by connecting the measurement results (RH, VH) and (RL, VL) of the reflectance obtained by the twice measurement operations with the straight line, it is possible to illustrate the relation between the reflectance R and the output V of the reflectance sensor 209 with the straight line (first degree function) every Y coordinate of the reticle 214. Thereafter, when the wafer 220 is exposed, using the output V of the reflectance sensor 209, the reflectance R of the wafer 220 is computed in response to the Y coordinate of the reticle 214 from the following equation corresponding to the straight line of FIG. 19.

$$V = \frac{VH - VL}{RH - RL} \times R + \frac{VL \times RH - VH \times RL}{RH - RL} \quad \text{(Equ. 10)}$$

Although the reflectance R is obtained in response to the Y coordinate from the individual straight line relation in this embodiment, when the computation precision which is so high is not required, it is unnecessary to compute the reflectance R in response to the Y coordinate of the reticle 214, and a method to compute an average reflectance during the scanning may be adopted. Specifically, when the reflectances of the two reflection plate are measured, the relation between the reflectance and the output of the reflectance sensor 209 is not obtained every Y coordinate, but the average reflectance during the scanning is obtained, whereby a relation independent from the Y coordinate can be obtained. In this case, there is an advantage that it is unnecessary to previously store the output of the reflectance sensor 209 in response to the Y coordinate.

Subsequently, the change of the image formation characteristic of the projection optical system 216 due to the exposure light absorption is obtained. First, by driving the wafer stage 222 of FIG. 7, the irradiation quantity monitor 228 is moved to the exposure region of the projection optical system 216. The reticle 214 is provided on the reticle stage 215, and the illumination conditions (the sorts of the aperture diaphragm of the illumination system, the aperture shape of the reticle blind 210, the pattern of the reticle 214, and aperture shape of the aperture diaphragm 217 of the projection optical system 216) are made to be predetermined state. At the same time, the irradiation quantity monitor 228 is illuminated, and the output Pow of the irradiation quantity monitor 228 and the output $I_o$ of the integrator sensor 820 are stored. When the exposure is performed, it is satisfactory that the computation is performed from the following equation, using the output I of the integrator sensor 208 and the reflectance R obtained from the reflectance sensor 209.

$$M_h = P_{ow} \times (1 + R) \times K_m \times \left\{1 - \exp\left(-\frac{T_m}{t}\right)\right\} \times \frac{I}{I_0} \quad \text{(Equ. 11)}$$

In the Equation 11, $M_h$, $K_m$ and $T_m$ are a magnification change quantity, magnification change coefficient, and time constant of the projection optical system 216 by the exposure light absorption, respectively.

The output of the integrator sensor 208 has two roles, one is for measuring the change of the irradiation quantity of the exposure light source 201 with the passage of time and the other is for determining whether the exposure light is incident onto the projection optical system 216 or not. In order to measure the change of the irradiation quantity of the exposure light source 201 with the passage of time, it is suitable that using the light transmission windows 255 and 256 on the reticle stage 215 of FIG. 11, any of the light transmission windows 255 and 256 is moved into the illumination region by driving the reticle stage 215 every the exposure by one shot, the irradiation quantity monitor 228 is moved to the exposure region by driving the wafer stage 222, and the irradiation quantity of the exposure light source 201 is measured by the irradiation quantity monitor 228. In this case, since the light transmission windows 255 and 256 are on both sides of the reticle 214 in the Y-direction, the light transmission windows 255 and 256 can be moved into the illumination region while performing the scanning continuously after the scanning and exposure, regardless to which direction along the Y-axis the reticle 214 is scanned at the time of the exposure. Therefore, an advantage that a time from completion of the exposure by one shot to the irradiation quantity measurement of the exposure light source 201 is shortened is brought about. Moreover, since the irradiation quantity is measured at the same position as the exposure surface of the wafer 220, the change of an energy arrival rate from the exposure light source 201 to the wafer 220 resulting from the change of the transmittance and the reflectance of the projection optical system 216 and the optical system from the beam splitter 207 to the condenser lens 213 can be measured with a high precision.

When the change time of the exposure light source 201 is fully long compared to the exposure time of one shot, assuming that the light transmittance window is one of the light transmittance windows 255 and 256, a method to measure the transmittance only after the scanning exposure of the reticle 214 is conducted toward this one may be adopted, or a method to measure the transmittance only at the time of replacing of the reticle 214 with new one may be adopted. In this case, since the reticle stage 215 can be formed to be small-sized, an advantage that a drivability and positioning precision of the reticle stage 215 increase is brought about. When one of the light transmission windows 255 and 256 is used without changing the size of the reticle stage 215, the number of the aperture portions is reduced, so that a rigidity of the reticle stage 215 is increased as a whole.

As for the change coefficient and time constant of the image formation characteristic, they may be previously obtained by experiments, or they may be obtained by computing based on a simulation of the thermal conduction.

Furthermore, the change coefficient and time constant of the image formation characteristic may be changed in accordance with the change of the illumination conditions (the sort of the aperture diaphragm of the illumination system, the aperture shape of the reticle blind 210, the pattern of the reticle 214, and the aperture shape of the aperture diaphragm 217 of the projection optical system 216). In this case, it is possible to high-precisely compute the subtle change of the image formation characteristic due to the difference of the aperture diaphragms 205a to 205d of the illumination system of FIG. 10. It should be noted that though the change of the image formation characteristic due to the irradiation heat absorption is considered to be a first-order lag system in this embodiment, a second-order system, a dead time system, and a transfer function obtained by combining these may be introduced in order to perform a high precision computation.

Subsequently, an air pressure, a temperature, and a humidity around the projection optical system 216 are measured through the temperature sensor 230 to a humidity sensor 232, an air pressure within the projection optical system 216 is measured through the air pressure sensor 229. The magnification change quantity of the projection optical system 216 is computed based on these measurement results, and the change quantity of the image formation characteristic is obtained from the following equation as a whole.

$$M = K_{mp1} \times P1 + K_{mp2} \times P_2 + K_{mt} \times T + K_{mh} \times H + M_h \qquad \text{(Equ. 12)}$$

In the Equation 12, M is the total magnification change quantity obtained by totaling the magnification change quantity by the irradiation of the projection optical system 216 and the magnification change quantity by an environment change, $P_1$ is an air pressure around the projection optical system 216, $P_2$ is an air pressure inside the projection optical system 216, T is a temperature around the projection optical system 216 (this can be considered to be a temperature of the projection optical system 216), and H is a humidity around the projection optical system 216. Furthermore, $K_{mp1}$ is a magnification change coefficient for an air pressure change around the projection optical system 216, $K_{mp2}$ is a magnification change coefficient for an air pressure change inside the projection optical system 216, $K_{mt}$ is a magnification change coefficient for a temperature change of the projection optical system 216, and $K_{mh}$ is a magnification change coefficient for a humidity change around the projection optical system 216.

Fluid such as dried nitrogen gas is sometimes made to flow within the projection optical system 216 to prevent the lens surface from being blurred by mixing of impurities into the projection optical system 216. In this case, since an air pressure difference occurs between the inside of the projection optical system 216 and the periphery thereof, the two air pressure sensors 229 and 231 are disposed within the projection optical apparatus 216 and at the periphery thereof as in this embodiment. It is satisfactory that the measurement value of the air pressure sensor 231 disposed at the periphery of the projection optical system 216 is used as to the lens surfaces closest to the reticle 214 and wafer 220 of the projection optical system 216 and the magnification change quantity due to the air pressure change is computed. At the same time, it is satisfactory that the measurement value of the air pressure sensor 229 disposed within the projection optical system 216 is used as to the lens surface other than that lens surfaces of the projection optical system 216 and the magnification change quantity due to the air pressure change is computed.

As the fluid flowing within the projection optical system 216, air, nitrogen, helium and the like are selected. Air is selected to principally prevent the mix of impurities. Nitrogen is selected to avoid the occurrence of ozone by a reaction of oxygen when a short wave light source, for example, an ArF exicimer laser light source, is used as the exposure light source 201. Helium is selected to principally suppress the image formation characteristic change of the projection optical system 216 due to the air pressure change. AS a matter of course, the magnification change coefficient for the air pressure change is changed in accordance with the selected fluid.

It is suitable that by adjusting the pressure of a predetermined sealed space (an airtight chamber) among a plurality of lenses, the image formation characteristic is changed. In this case, the field curvature incapable of being corrected by driving the lens groups 236 to 240 can be corrected by adjusting the pressure of the predetermined sealed space (the airtight chamber) among the lens groups 236 to 240.

In the case where no problem occurs from viewpoint of the precision when the air pressure at the periphery of the projection optical system 216 is considered to be the same as that within the projection optical system 216, the number of the air pressure sensors 229 and 231 may be one. Moreover, when the difference between the air pressure at the periphery of the projection optical system 216 and that within the projection optical system 215 causes a problem from viewpoint of the precision, the same sensor as the temperature sensor 230 and the humidity sensor 232 is provided also in the projection optical system 216, and the terms concerning the temperature and humidity in the above equation may be computed using the two sensors within the projection optical system 216 and in the periphery of it, similarly to the term concerning the air pressure.

In this embodiment, the change quantity of the image formation characteristic is obtained assuming that it is proportional to the change quantity of each environment. In order to obtain the image formation characteristic more precisely, it is satisfactory that a first-order lag system, a dead time system considering the thermal conduction, or a transfer function obtained by combining them may be adopted for a temperature, for example. Any model is satisfactory as long as it is capable of computing the change quantity of the image formation character due to changes of temperature, humidity and humidity.

In the manner described above, the magnification change quantity of the projection optical system 216 is obtained. Moreover, the changes of other image formation system characteristic can be obtained by the similar manner. In this embodiment, the magnification change quantities $C_1$ and $C_2$ at the two image heights, the change quantity $C_3$ of the coma aberration, the change quantity $C_4$ of the spherical aberration, and the change quantity $C_5$ of the field curvature are computed as the image formation characteristic. It should be noted that when the illumination conditions are changed, the magnification change quantity and the time constant in the computation of the quantity of the change of the image formation characteristic of the projection optical system 216 due to the irradiation, and hence the magnification change quantity and the time constant are previously stored in accordance with each of the illumination conditions, after obtaining them experimentally. It is suitable that at the time of the exposure, the computation is performed by changing the magnification change quantity and the time constant in accordance with the change of the illumination conditions. Furthermore, since also the offset of the change quantities $C_1$ to $C_5$ of the image formation characteristics changes by the change of the illumination conditions, the offset of the change quantities $C_1$ to $C_5$ of the image formation characteristics in the illumination conditions are previously obtained experimentally, and they are stored. At the time of the exposure, the correction is performed by adding the offset of the change quantity of each image formation characteristic to the change quantity $C_1$ to $C_5$ of the image formation characteristic in accordance with the illumination conditions. As to the correction of the best focus position, it is satisfactory that the correction is performed after adding the offset by an auto-focus mechanism including the AF sensors 226 and 227 as described above.

When the illumination conditions are changed, there are sometimes factors incapable of being corrected by the correction of the image formation characteristic. These are, for example, a comparatively high order or a randomly shaped distortion which occurs by a manufacturing errors of the projection optical system 216 and the like. This can be corrected by switching the plane-parallel plate 235 of which the surface is uneven and located close to the reticle 214 of the projection optical system 216, in accordance with the change of the illumination condition. For this reason, it is advantageous that the plane-parallel plate 235 of the projection optical system 216 is switched by a plurality of kinds like the aperture diaphragms 205a to 205d of the illumination system. Although it is desirable that the plane-parallel plate 235 should be disposed closely to the reticle 214 to correct this distortion, the position of the plane-parallel plate 235 is not limited to that close to the reticle 214. The plane-parallel plate 235 may be disposed on the side of the wafer 220 or near the pupil surface of the projection optical system 216, as long as it is between the reticle 214 and the wafer 220. The image formation characteristic to be corrected can be changed depending on the place where the plane-parallel plate 235 is disposed.

[Driving Method of Each Lens Group for Correcting Image Formation Characteristic]

Next, the following simultaneous equation is solved from the quantity $C_i$ of the change of each image formation characteristic by driving the lens groups 236 to 240, and the driving quantity $L_i$ of each of the lens groups 236 to 240 needed for the correction is obtained.

$$\begin{bmatrix} L_1 \\ L_2 \\ L_3 \\ L_4 \\ L_5 \end{bmatrix} = - \begin{bmatrix} b_{11} & b_{12} & b_{13} & b_{14} & b_{15} \\ b_{21} & b_{22} & b_{23} & b_{24} & b_{25} \\ b_{31} & b_{32} & b_{33} & b_{34} & b_{35} \\ b_{41} & b_{42} & b_{43} & b_{44} & b_{45} \\ b_{51} & b_{52} & b_{53} & b_{54} & b_{55} \end{bmatrix}^{-1} \begin{bmatrix} C_1 \\ C_2 \\ C_3 \\ C_4 \\ C_5 \end{bmatrix} \quad \text{(Equ. 13)}$$

In the above simultaneous equation, $b_{ij}$ (i,j=1 to 5)is a coefficient expressing the change quantity of the image formation characteristic when each of the lens groups is driven. An optical computation value may be used for these coefficients, or these coefficients may be obtained experimentally. Each of the lens groups is driven so as to cancel the change quantity of the image formation characteristic.

In the case where one of the change quantities of the image formation characteristics of the projection optical system 216 is small, so that it needs not to be corrected, the computation may be performed after reducing the matrix of the Equation (13) to four columns and four rows. Next, in this embodiment, the change quantity of the distortion is suppressed by computing the magnification change quantity at the two image heights. It is satisfactory that the image height for the correction is further increased and the distortion is corrected more finely. When the magnification change quantity at the image height of three in total is, for example, corrected, the matrix of the Equation (13) is expanded to six columns and six rows.

Moreover, in this embodiment, the image formation characteristic, which exhibits a rotational symmetry, is corrected. Since each of the lens groups 136 to 240 is constituted such that it is freely inclined relative to the direction of the optical axis AX, the image formation characteristic, which exhibits a non-rotational symmetry, can also be corrected. In this case, when the change quantity of the image formation characteristic of the projection optical system 216 is measured and computed, the inclination components in the X and Y-directions as to the image formation characteristics are also obtained by the similar computation, and the matrix composed of five columns and five rows is solved for each of X and Y-directions in the similar manner to the correction of the change quantity of the image formation characteristic which exhibits the rotational symmetry, from the relation of the inclination angle of each of the lens groups 236 to 240 and the change quantity of the image formation characteristic, and thus the inclination angle of each of the lens groups 236 to 240 is obtained. It should be noted that the matrix may be reduced or expanded in accordance with the change quantity of the image formation characteristic.

[Correction Method of Best Focus Position]

Next, the correction method of the best focus position will be described. As has been partially described, in the factors causing the change of the best focus position (the position of the image surface), there are four kinds of factors, such as the irradiation, the environmental change, the driving of the lens groups 236 to 240, and the change of the illumination condition. The change of the best focus position due to the irradiation heat and the change of the best focus position due to the environmental change may be obtained by the computation, similarly to the magnification change of the foregoing projection optical system 216. Moreover, the change quantity of the best focus position by the driving of the lens groups 236 to 240 can be obtained as the sum in the following manner, when the image formation characteristic is corrected. The driving quantity of each of the lens groups 236 to 240 and the focus change coefficient for the corresponding one of the driving quantities of the lens groups 236 to 240 are multiplied, and the multiplied results are added. It is necessary to previously obtained the relation experimentally as to the change of the focus position due to the change of the illumination condition. The combination of the change quantities of the foregoing four kinds of best focus positions will be the change quantity of the total best focus position. This change quantity is transmitted to the auto-focus mechanism including the AF sensors 226 and 227. The relation between the driving quantity of each of the lens groups 236 to 240 and the change quantity of the beat focus position may be obtained by the optical computation value or the experimental method, similarly to other image formation characteristics.

[Correction Method for Process Deformation of Wafer]

Next, the correction method of the image formation characteristic at the time when the wafer 220 is deformed will be described. The wafer 220 may deforms isotropically or anisotropically by process treatments such as developing and etching after the exposure. In this case, it is necessary to correct the image formation characteristic by making it in agreement with the wafer 220. If the deformation quantity of the wafer 220 is obtained, the image formation characteristic maybe corrected in agreement with the deformation quantity of the wafer 220, similarly to the correction that has been described. Moreover, when the deformation quantity of the wafer 220 differs depending its position, the target value of the correction of the image formation characteristic may be changed in accordance with the deformation quantity of the wafer 220.

Here, the method to obtain the deformation quantity of the wafer 220 of FIG. 7 will be described. As the most familiar method, there is the method, in which the shift quantity of the alignment mark (wafer mark) on the wafer 220 from the target position is measured and the distribution of the deformation quantity of the wafer is obtained. As the mark detection sensor, it is possible to apply a sensor which detects a diffraction light obtained by allowing a He-Ne laser beam onto a detected mark on the wafer 220 via the projection optical system 216, and a sensor which detects the mark by an image processing of an off-access type via an optical system other than the projection optical system 216. A method may be used, in which the position of the detected mark on the wafer 220 is detected by a perfectly different measurement machine from the exposure apparatus to transmit the measurement data to the exposure apparatus and the correction is performed. When the deformation quantity of the wafer 220 owing to the process treatment is previously found, it is unnecessary to measure the deformation quantity of the wafer 220.

Since the thermal deformation quantity of the wafer 220 due to the process treatment is generally large in the isotropic component, the correction may be performed by computing only the isotropic magnification of the wafer 220. In this case, since the component of the deformation quantity of the wafer 220 to be computed is only the magnification, the number of the detected mark on the wafer 220 can be reduced, and the measurement time can be shortened. Moreover, considering the deformation quantity of the wafer 220, the exposure position of the wafer stage 222 is determined, whereby an increase in a superposition precision can be achieved. Furthermore, in the case where the thermal deformation of the wafer 220 due to the exposure is corrected, the relation between the reflectance of the wafer 220 and the measurement value of the irradiation quantity monitor 228 is previously obtained experimentally, and the irradiation change quantity may be computed based on this relation.

(Third Embodiment)

Next, the third embodiment of the present invention will be described. In the second embodiment, as shown in FIG. 12, the change quantity of the image formation characteristic is computed, for example, for each of the blocks B1 to B20 of the reticle 214. Considering the rotation angle of the reticle 214 the correction of the image formation characteristic is implemented. Therefore, as shown in FIG. 11, it is provide the rotation mechanism 249 on the reticle stage 215, so that the whole of the reticle stage 215 is heavy. Contrary to this, when a throughput is seriously considered, a reduction in a weight of the reticle stage 215 is sometimes desired. Accordingly, in this embodiment, the image formation characteristic in accordance with the thermal deformation quantity of the reticle 214 is corrected by a simpler mechanism.

First, the pattern presence rate of the reticle 214 is measured. Therefore, in FIG. 7, in the state where a test reticle on the reticle stage 215 is provided, which has a region including the illumination region on which the pattern is not drawn, the illumination conditions (the sort of the aperture diaphragm of the illumination system, the aperture shape of the reticle blind 210, and the aperture shape of the aperture diaphragm 217 of the projection optical system 216) are set to a predetermined state. Next, the irradiation quantity monitor 228 is moved to the exposure region side of the projection optical system 216 by driving the wafer stage 222, and the position of the irradiation quantity monitor 228 is determined so that the effective light receiving region of the irradiation quantity monitor 216 covers its exposure region. Then, the output $I_0$ of the integrator sensor 208 and the output $P_0$ of the irradiation quantity monitor 228 are measured and stored. Subsequently, the reticle 214 on which the pattern for the actual exposure is drawn is provided on the reticle stage 215, and the light emission of the exposure light source 201 is started. The output $I_1$ of the integrator sensor 208 and the output $P_1$ of the irradiation quantity monitor 228 are measured. Then, the pattern presence rate $\eta$ is computed according to the following equation.

$$\eta = 1 - (P_1/I_1)/(P_0/I_0) \qquad \text{(Equ. 14)}$$

Also in this embodiment, the integrator sensor 208 is used also for monitoring the variation of the power of the exposure light source 201. When the illumination condition at the time of the measurement with the test reticle on which the pattern is not drawn differs from that at the time of the measurement with the reticle 214 on which the pattern is drawn, the pattern presence rate is obtained by converting to the respective illumination condition. For example, concerning the recticle blind 210 shown in FIG. 20a1 to 20a3, as shown by the aperture portions 210a and 210b illustrated in FIG. 20a2 and 20a3, when the width of the aperture portion of the reticle blind 210 in the direction corresponding to the scanning direction (used as the Y-direction) differs, the value of the output Po of the irradiation quantity monitor 228 is converted proportionally to the value of the ratio of the area of the aperture portion of the test reticle 214 at the time of the measurement, on which the pattern is drawn, to that of the aperture portion of the test reticle at the time of the measurement, on which no pattern is drawn. Moreover, the relation between the output of the integrator sensor 208 and the output of the irradiation quantity monitor 228 are previously may be measured and stored, in the plural cases where the aperture diaphragms 205a to 205d of the illumination system shown in FIG. 10 and the aperture diaphragm 217 of the projection optical system 216 are different. It should be noted that although in this embodiment, the test reticle, on which no pattern is drawn, is used, the measurement may be performed in the state where the reticle 214 is not present.

[Illuminance Measurement Method on Pattern Surface of Reticle]

Next, the illuminance measurement method on the pattern surface (reticle surface) of the reticle 214 will be described. For this, by driving the reticle stage 215 of FIG. 11, the illuminance sensor 257 on the reticle stage 215 is moved almost to the center of the illumination region, whereby the output W of the illiminance sensor 257 is measured. It should be noted that the illuminance may be measured by the irradiation quantity monitor 228 via either the light transmission window 255 or the light transmission window 256. In the case of the latter, the relation between the output of the irradiation quantity monitor 228 and the transmittance of the projection optical system 216 is previously stored, and by dividing the output of the irradiation quantity monitor 228 with the transmittance of the projection optical system 216, the illuminance on the reticle surface can be computed. Moreover, in the reduction projection system and the magnification projection system, the illuminance on the reticle surface is computed in consideration of the projection magnification.

Moreover, the relation between the output of the integrator sensor 208 and the illuminance on the reticle surface is experimentally obtained previously, and at the time of the exposure the illuminance on the reticle surface may be computed from the output of the integrator sensor 208. In this case, since the it is unnecessary to move the illuminance sensor 257 and the irradiation quantity monitor 228 into the illumination region, there is an advantage that a throughput increases. Moreover, since it is unnecessary on the reticle stage 215 to provide the illuminance sensor 257 that is a heat generation body, it is possible to enhance a thermal stability of the reticle stage 215.

[Measuring Method for Reflectance of Reticle]

Next, the reflectance of reticle 214 is measured. For this purpose, the same method as the measurement of the reflectance of wafer 220 is applied to this case. First, two reference reflection plates (not shown) having the known reflectance are provided on the reticle stage 215. These reference reflection plates are moved into the illumination region sequentially so as to measure the output of the reflectance sensor 209 of FIG. 7. Thus, the relationship between the reflectance on the reticle surface and the output of the reflectance sensor 209 can be obtained as a linear relationship (linear function). Thereafter, the reticle 214 to be used in an actual exposure is placed on the reticle stage 215, the portion where the pattern is drawn is moved to the illumination area, and the output of the reflectance sensor 209 is measured. Then, the reflectance of the reticle 214 having the pattern drawn can be computed from the measuring result and the above-obtained linear relationship between the reflectance and the output of the reflectance sensor 209. Generally, since the outermost peripheral portion of the reticle 214 is covered with the chrome pattern, the reflectance measurement may be performed using this portion. If the reflectance of the reticle 214 is predetermined, the reflectance of the reticle 214 is only stored. In this case, there is an advantage in which the throughput can be improved without requiring the measurement of the reflectance.

[Computing Method of Thermal Deformation Quantity of Reticle]

Next, the quantity of the thermal deformation of the reticle 214 can be computed using the above-measured parameters from the following equations.

$$M_x(t) = M_x(t - \Delta t) \cdot \exp\left(-\frac{\Delta t}{T_x}\right) + K_x \cdot \left\{1 - \exp\left(-\frac{\Delta t}{T_x}\right)\right\} \quad \text{(Equ. 15)}$$

$$M_y(t) = M_y(t - \Delta t) \cdot \exp\left(-\frac{\Delta t}{T_y}\right) + K_y \cdot \left\{1 - \exp\left(-\frac{\Delta t}{T_y}\right)\right\} \quad \text{(Equ. 16)}$$

where $\Delta t$ is the computing cycle of the computer, $M_x(t-\Delta t)$ is a change in magnification in an X-direction at time of one previous computing cycle, $K_x$ is a saturation value showing a variation in magnification in an X-direction with respect to irradiation, and TX is a time constant of a variation in magnification in the X-direction caused by irradiation. Characters with subscript Y relate to the magnification in the Y-direction. It is assumed that the saturation value and the time constant are obtained previously by an experiment. Similar to the equation of the change in the magnification in the projection optical system 216 of the first embodiment, the above equations are expressed in a time series by solving the first-order differential equation. It should be noted that the equation to be used in the calculation is not limited to the above-mentioned equation. For example, a transfer function in which the time constant component is expanded to two or a transfer function of a dead time system may be introduced.

[Correcting Method of Change in Magnification in X and Y-directions]

Next, similar to the correction of the image formation characteristic in the projection system 216 of the first embodiment, the respective lens groups 236 to 240 of FIG. 8 are driven to correct the variation in magnification in the X-direction caused by the thermal deformation of the reticle 214. If the variation of the other image formation characteristics is small, the number of lens groups to be driven may be one. Also, if the variation of the other image formation characteristics using the drive of the lens groups 236 to 240 reaches a value that is not ignored, the number of lens groups may be increased.

The variation in magnification in the Y-direction is corrected by changing the relative scanning speed of the reticle 214 and the wafer 220. Since the reticle 214 is thermally deformed every time when exposure is performed, the relative scanning speed is changed in accordance with the quantity of the thermal deformation of the reticle 214 every one shot. If the change of the reticle 214 is gentle, the interval at which the change of the relative scanning speed is performed may be changed every time when one wafer 220 is exposed, several wafers 220 are exposed, a lot processing comes its head, or the quantity of the thermal deformation of the reticle 214 exceeds a predetermined threshold.

If the variation of the magnification in the X-direction and that of the magnification in the Y-direction are the same, the projection image is in a predetermined state by each correction in the X and Y-directions, and the relative scanning speed of the reticle 214 and the wafer 220 is unchanged. However, if a difference between the variation of the magnification in the X-direction and the variation of the magnification in the Y-direction occurs, the contract of the projection image decreases. This correcting method will be explained with reference to FIGS. 20a1 to 20a3, and FIGS. 20b1 to 20b3.

Figure 3:
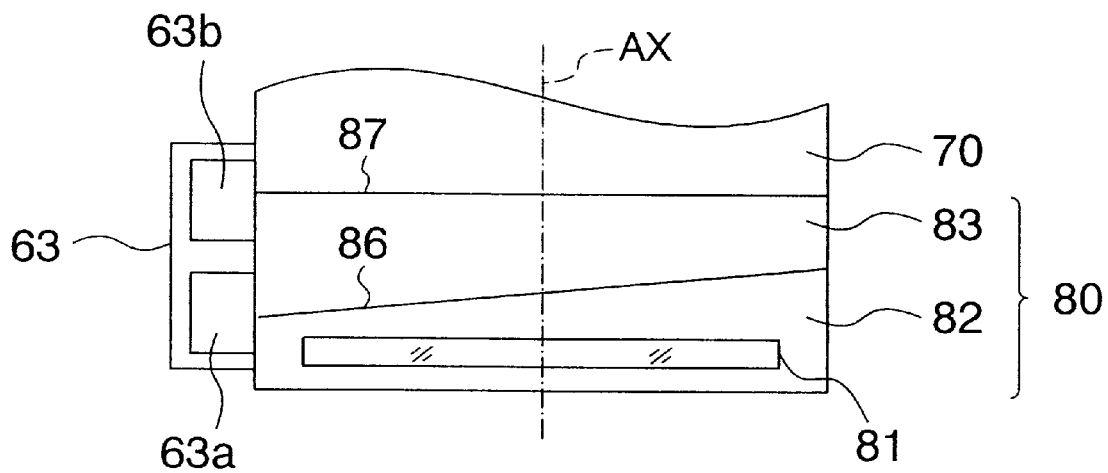
Figure 3:
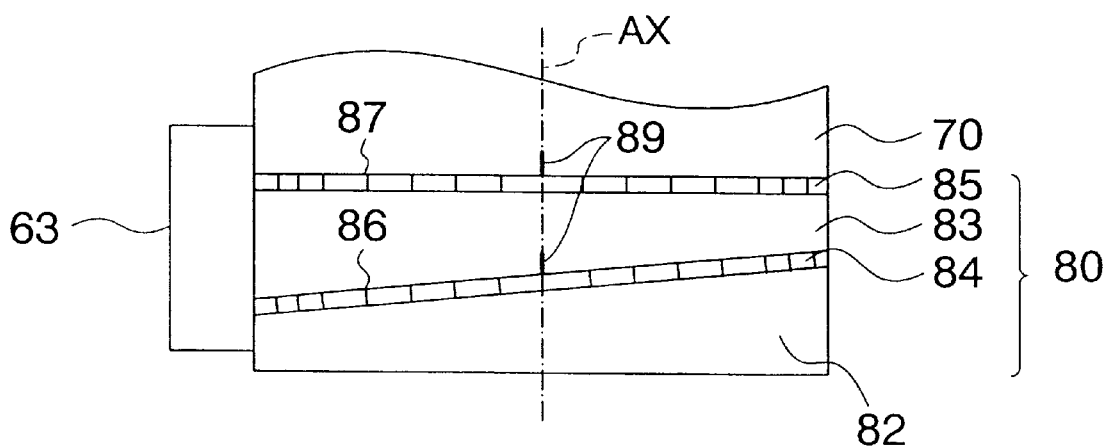

FIGS. 20a1 to 20a3 and FIGS. 20b1 to 20b3 show the relationship between the width of the reticle blind 210 and the contrast of the projection image. The widths of the reticle blind 210 are shown in FIGS. 20a1 to 20a3, respectively, and corresponding illuminance distributions of the projection image on the wafer 220 are shown in FIGS. 20b1 to 20b3, respectively. If the width of the aperture portion of the reticle blind 220 is set to a predetermined width as shown in FIG. 20a1 in a state in which the difference between the variation of the magnification in the X-direction and that of the magnification in the Y-direction occurs and the scanning exposure is performed, the positional shift is generated at the position of the projection image in accordance with the aforementioned difference. At this time, resist applied on the wafer 220 is photosensitized in accordance with the totaling value of the width in the Y-direction of the aperture portion of the reticle blind 210. This results in reduction of the contrast corresponding to the quantity of the projection image shifted in the Y-direction. However, as shown in FIG. 20a2, if the width of an aperture portion 210a of the reticle blind 210 is narrowed and the scanning exposure is performed, the shift quantity of the projection image in the Y-direction becomes small in proportion to the width of the aperture portion 210a in the Y-direction. Also, as shown in FIG. 20a3, if the width of an aperture portion 210b of the reticle blind 210 is further narrowed, the contrast of the projection image can be more improved. The relationship between the width of the aperture portion of the reticle blind 210 in the Y-direction and the contrast of the projection image may be obtained in advance by e.g., simulation. At this time, a plurality of patterns is simulated separately, and stored, so that the width of the aperture portion of the reticle blind 210 can be suitably set, depending on the difference in kinds of patterns. For example, it is better to narrow the width of the aperture portion of the reticle blind 210 in the Y-direction in a case of the pattern having a thin line width as compared with a case of the pattern having a thick line width.

However, if the width of the aperture portion of the reticle blind in the Y-direction is narrowed without changing the scanning speed of the reticle 214 and the wafer 220, a shortage of exposure quantity on the wafer 220 is caused. In this case, the scanning speed of the reticle 214 and the wafer 220 is reduced with a constant speed ratio (projection magnification), depending on how much the width of the aperture portion of the reticle blind 210 in the Y-direction is narrowed, whereby the exposure quantity can be maintain constant. If power of the exposure light source 201 is increased, or oscillation frequency of the exposure light source 201 is increased in the case where the light source 201 is the pulse laser light source of e.g., KrF excimer laser light or ArF excimer laser as in this embodiment, the similar effect can be obtained. In this case, since a reduction in the scanning speed is not needed, the deterioration of the throughput can be prevented.

As described above, according to this embodiment, one kind of the quantity of the thermal deformation of the reticle 214 is computed with respect to each of the X and Y-directions. However, in a case where the quantity of the thermal deformation is large against the necessary accuracy, the magnification may be computed with a plurality of image heights in each of the X and Y-directions. In this case, at least two lens groups, which are driven to correct the image formation characteristic, are needed. Also, it is possible to increase the number of lens groups to be driven, depending on the kinds of image formation characteristics changing by the drive of the lens groups 236 to 240 of FIG. 8.

The above embodiment explained the exposure quantity control in accordance with the variation in magnification in the X-direction of the reticle 214 and the variation in magnification in the Y-direction. The similar method, however, can be applied to the correction of the image formation characteristic of the projection optical system 216. In this case, similar to the computation of the thermal deformation quantity of the reticle 214, the variation in magnification of the optical system 216 is computed in each of the X and Y-directions. Then, similar to the case of the reticle 214, the width of the aperture portion of the reticle blind 210 in the Y-direction and the scanning speed are changed, depending on the residue after correcting the difference between the variation in magnification in the X-direction and the variation in magnification in the Y-direction, whereby the exposure quantity can be maintained constant. The relationship between the variation in magnification in the X-direction and the variation in magnification in the Y-direction, which are caused by irradiation of the projection optical system 216, may be obtained by the experiment.

[Discontinuity of Computation]

Also, in the correction in this embodiment, the computer computes the quantity of the thermal deformation of the reticle 214 and the variation in the image formation characteristic caused by the irradiation of the projection optical system 216. In some cases, a discrete error occurs by a computing interval of the computer. In this case, it is the most common that the high speed computer, which can deal with the computing interval required for the necessary accuracy, is adopted so as to perform a continuous control. Therefore, the necessary accuracy and the quantity of computation must be considered in selecting the computer. At the time of the actual rotation of the reticle 214 or the drive of the lens groups 236 to 240, if the need for the continuous change of a control target is not so high in view of the variation in the image formation characteristic and the necessary accuracy, there may be used a method for changing the control target value discontinuously. In this case, though the correction error becomes somewhat rough, the same effect so far can be obtained. In other words, if the quantity of correction is small, it can be said that the computing interval or the changing interval of the control target value may be roughly set. This can be applied to the corrections of the variations in the other various kinds of image formation characteristics computed in this embodiment. If the quantity of correction concerning the necessary accuracy is small, the computing interval or the changing interval of the control target value may be roughly set to provide allowance to the capability of the computer.

Namely, if the quantity of the thermal deformation of the reticle 214 is large (the pattern existing rate is high and the quantity of the heat absorption is large), the quantity of exposure light directing to the projection optical system 216 reduces. Then, the variation in the image formation characteristic of the projection optical system 216, which is caused by irradiation of the exposure light (variation in irradiation) becomes small. Due to this, there is established the relationship in which one of the thermal deformation quantity of the reticle 214 and the variation in irradiation of the projection optical system 216 is large and the other becomes small. Therefore, the computing interval of the thermal deformation quantity of the reticle 214 or the changing interval of the control target value and the variation in irradiation of the projection optical system 216 or the changing interval of the control target valve may be changed in accordance with the pattern existing rate of the reticle 214. For example, if the reticle 214 is for the contact hole pattern fine contact holes are only scattered in the reticle 214, and almost the entire pattern region of the reticle 214 is covered with the chrome film so that the pattern existing rate is near 100%.

In such a case, the computing interval of the variation in irradiation of the projection optical system 216 is set to 10 msec in a state that the computing interval of the thermal deformation quantity of the reticle 214 is maintained 1 msec. As a result, the correction of the small computing error can be performed even by such a computer, which is incapable of processing when the computing interval of the quantity of the thermal deformation of the reticle 214 and the variation in the irradiation of the projection optical system 216 are set to 1 msec, respectively. The same effect can be, of course, obtained by roughening the changing interval of the control target value. It is needless to say that the computing interval is not limited to the foregoing numeral value. The above describes only the case of the computing error. It can be said that this can be applied to the correction interval. In addition, unlike the computing error, the correcting interval may be determined from guidelines for controlling to avoid resonance in selecting the correcting interval, e.g., control stability, response speed, etc.

[More Specific Correcting Method]

Next, the following will show an example of the correction of the thermal deformation quantity close to the reticle actually exposed. The same method can be applied to the correction of the distortion of the wafer 220 and the distortion aberration of the projection optical system 216. First, the quantity of the thermal deformation of the above reticle 214 is resolved into each component by a method of least square method using the following equation.

$$Dx = k1 + k3 \cdot x + k5 \cdot y + k7 \cdot x^2 + k9 \cdot x \cdot y$$

$$+ k11 \cdot y^2 + k13 \cdot x^3 + k15 \cdot x^2 \cdot y$$

$$+ k17 \cdot x \cdot y^2 + k19 \cdot y^3,$$

$$Dy = k2 + k4 \cdot y + k6 \cdot x + k8 \cdot y^2 + k10 \cdot y \cdot x$$
$$+ k12 \cdot x^2 \cdot k14 \cdot y^3 + k16 \cdot x \cdot y^2$$
$$+ k18 \cdot x^2 \cdot y + k20 \cdot x^3 \quad \text{(Equ. 17)}$$

where Dx, Dy are variations in distortion in each of the X and Y-directions at each computing image height, k1 to k20 are coefficients each showing the variation for each component, and x and y denote coordinates of the respective computing image heights. This embodiment showed the model up to the third components. However, if the more accurate correction is needed, the degree may be expanded to be higher as required.

FIGS. 21a to 21f, FIGS. 22a to 22f, FIGS. 23a to 23f, and FIGS. 24a and 24b are examples each showing the distribution of the thermal deformation quantity of the reticle corresponding to coefficients k1 to k20 for each component of the deformation quantity of the reticle. In FIGS. 21a to 21f, FIGS. 22a to 22f, FIGS. 23a to 23f, and FIGS. 24a and 24b, the state before the thermal deformation of the reticle 214 is expressed by white circled lattice points 269, and the state after the thermal deformation of the reticle 214 is expressed by black circled lattice points 268. The following will explain the example of the thermal deformation quantity of the reticle 214 and its correcting method for each of coefficients k1 to k20 with reference to FIGS. 21a to 21f, FIGS. 22a to 22f, FIGS. 23a to 23f, and FIGS. 24a and 24b.

FIG. 21a shows the deformation of the reticle corresponding to coefficient k1, and a case in which the X shift is generated in a fixed quantity at any position of the Y coordinate. This deformation can be corrected by shifting the reticle 214 in the fixed quantity in the X-direction at the scanning exposure time. The relative position between the reticle 214 and the wafer 220 in the X-direction may be shifted. Due to this, in consideration of the projection magnification, the wafer 220 is shifted in a fixed quantity and the scanning exposure may be performed. Also, both the reticle 214 and the wafer 220 are shifted and the scanning exposure may be performed.

FIG. 21b shows the deformation corresponding to coefficient k2, and a case in which the Y shift is generated in a fixed quantity independent of the Y coordinate. This deformation can be corrected by shifting the reticle 214 in a fixed quantity in the Y-direction at the scanning exposure time. Similar to the case of FIG. 21a, the relative position between the reticle 214 and the wafer 220 in the X-direction may be shifted. The correction may be carried out on the side of the wafer 220 or both sides of the reticle 214 and the wafer 220.

FIG. 21c shows the deformation (=k3·x) corresponding to coefficient k3, and a case in which a change in magnification, which is proportional to the image height, is generated in the X-direction. This means that the X-magnification 1 and X-magnification 2 of FIGS. 13a to 13g are generated in proportion to each computing image height. This deformation is corrected by performing the scanning exposure after combining the drive of the lens groups 236 to 240 to the direction of the optical axis and adjusting the change in the magnification. The change in magnification is also generated in the Y-direction by the drive of the lens groups 236 to 240 to the direction of the optical axis, and the contrast of the projection image is reduced. If this causes some trouble, the width of the aperture portion of the reticle blind 210 in the Y-direction or the quantity of exposure is changed before the scanning exposure is performed so as to adjust the contrast of the projection image.

FIG. 21d shows the deformation (=k4·y) corresponding to coefficient k4, and a case in which a change in magnification, which is proportional to the image height, is generated in the Y-direction. This means that the Y shift is generated in proportion to the Y coordinates. Therefore, the deformation can be corrected by changing the scanning speed in the Y-direction from a predetermined value in a fixed quantity. For example, if the Y shift quantity increases in accordance with the position of the Y-direction, that is, the magnification in the Y-direction increases, the scanning speed of the reticle 214 is made faster. Since the relative speed of the reticle 214 and the wafer 220 may be changed, the speed of the wafer 220 side may be low. Also, the speed of both the reticle 214 and the wafer 220 may be changed.

FIG. 21e shows the deformation (=k5·y) corresponding to coefficient k5, and a case in which the reticle 214 is deformed to a parallelogram in which the X-direction is a base. This means that the X shift changes in accordance with the coordinate (Y-coordinate) of the scanning direction. Therefore, this deformation can be corrected by inclining the scanning axes of the reticle 214 and the wafer 220 relatively. At the correction on the side of the reticle 214, if the laser interferometer on the X-axis of the reticle stage 215 is structured to view the illumination area of the reticle 214 at all time, the offset in the X-direction may be linearly changed in accordance with the scanning position of the Y-direction. It should be noted that the correction is carried out on sides of the wafer 220 or both sides of the reticle 214 and the wafer 220.

FIG. 21f shows the deformation (=k6·x) corresponding to coefficient k6, and a case in which the reticle 214 is deformed to a parallelogram in which the Y-direction is a base. The deformation can be corrected by inclining the scanning axes of the reticle 214 and the wafer 220 relatively as rotating the reticle 214 in a predetermined quantity. Also, if the laser interferometer on the X-axis of the reticle stage 215 is structured to view the illumination area of the reticle 214, the moving mirror 253 (FIG. 11) on the reticle stage 215 rotates together with the reticle 214 at the time of rotating the reticle 214. Due to this, servo control is carried out such that a measuring value of the laser interferometer reaches a predetermined value, and the scanning is performed, whereby the reticle 214 is gradually shifted in the X-direction automatically so that the scanning axis is inclined. If the rotation mechanism 249 of the reticle 214 and the moving mirror 253 on the reticle stage 215 are not moved together, the reticle 214 is rotated in a predetermined quantity to be shifted in the X-direction in according with the scanning, whereby the similar effect can be obtained.

Figure 22:
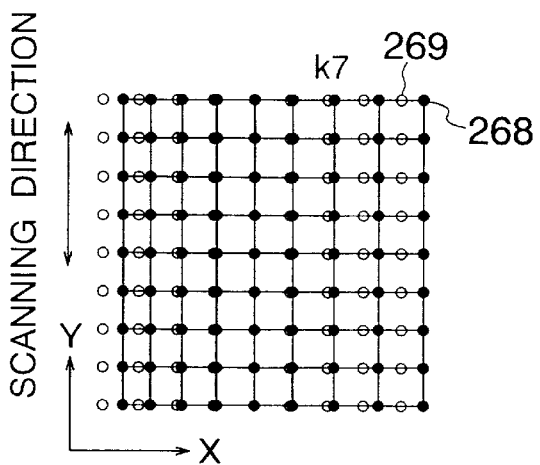
FIGS. 22a to 22f are a view showing an example of a thermal deformation of the reticle corresponding to coefficients k7 to k12.
Figure 22:
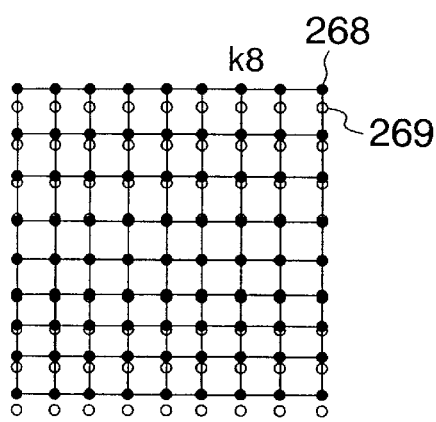
Figure 22:
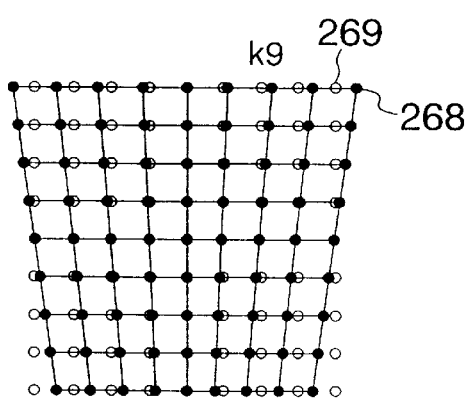
Figure 22:
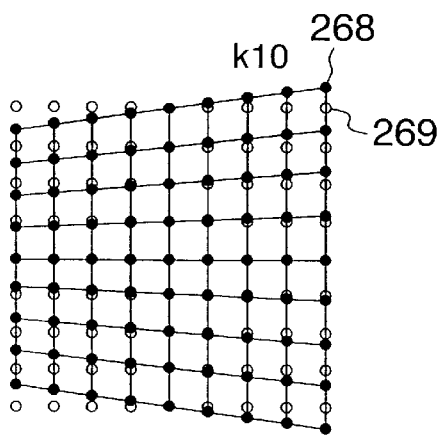
Figure 22:
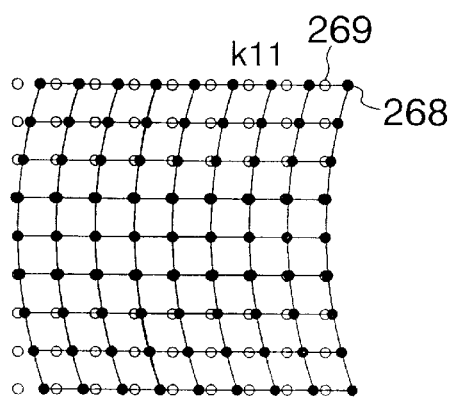
Figure 22:
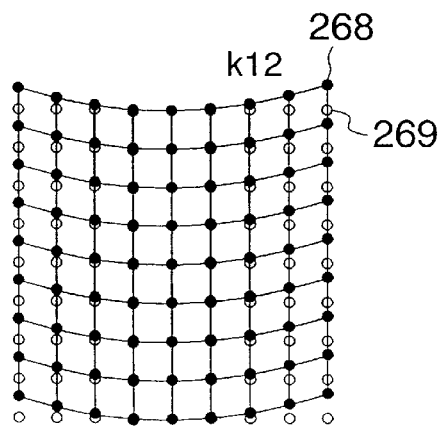

FIG. 22a shows the deformation (=k7·x²) corresponding to coefficient k7, and a change in an eccentric magnification in the X-direction. This means that the X-magnification tilt 1 and X-magnification tilt 2 of FIGS. 13a to 13g are generated in a fixed quantity. Therefore, the deformation can be corrected by performing the scanning exposure after combining the lens groups 236 to 240 and inclining them with respect to the optical axis. If the lens groups 236 to 240 are inclined to generate the magnification tilt, the magnification in the Y-direction increases on the side where the magnification is made larger and the magnification in the Y-direction decreases on the side where the magnification is made smaller. Due to this, the shift of the projection image is directed in an opposite direction, depending on the X coordinate, so that the contrast of the projection image reduces. In this case, the correction may be carried out by combining the change of the width of the aperture portion of the reticle blind 210 in the Y-direction and the change of the quantity of exposure with each other.

FIG. 22b shows the deformation (=k8·y²) corresponding to coefficient k8 and a change in an eccentric magnification in the Y-direction. This means that the Y shift changes in accordance with the Y coordinate. Therefore, the deformation can be corrected by changing the relative speed of the reticle 214 and the wafer 220 in accordance with the scanning position. More specifically, the reticle 214 may be shifted in the Y-direction to correct the Y shift in accordance with the Y coordinate as performing the scanning exposure. In this embodiment, it should be noted that the correction is carried out by changing the scanning speed linearly in accordance with the scanning position. The scanning speed may be, of course, changed arbitrarily in accordance with the using model. Also, the correction may be performed by changing the speed of both the wafer 220 and the reticle 214.

FIG. 22c shows the deformation ($=k9 \cdot x \cdot y$) corresponding to coefficient k9, and a case in which the reticle 214 is deformed to a trapezoid in which the X-direction is a base. This means that the X-magnification 1 and the X-magnification 2 change in accordance with the Y coordinate. Therefore, the correction may be carried out by changing the projection magnification in accordance with the scanning position. More specifically, this deformation can be corrected by driving the lens groups 236 to 240 in the direction of the optical axis in accordance with the scanning position.

FIG. 22d shows the deformation ($=k10 \cdot y \cdot x$) corresponding to coefficient k10, and a case in which the reticle 214 is deformed to a trapezoid in which the Y-direction is a base. This means that the reticle 214 rotates in accordance with the Y coordinate. Therefore, this deformation can be corrected by changing a relative parallelism between the reticle 214 and the wafer 220 in accordance with the scanning position.

FIG. 22e shows the deformation ($=k11 \cdot y^2$) corresponding to coefficient k11. This means that the X shift changes in accordance with the Y coordinate. Therefore, this deformation can be corrected by shifting the relative position between the reticle 214 and the wafer 220 in the X-direction in accordance with the scanning position.

FIG. 22f shows the deformation ($=k12 \cdot x^2$) corresponding to coefficient k12. This cannot be expressed by the resolution of each component of the first embodiment. To correct this deformation, as one example, the other components are combined with each other to reduce the error as possible. For example, the error can be reduced by correcting the component of coefficient k2 and that of coefficient k8. In this case, the term of the coefficient k12 is deleted from equation (17) and the computation is performed by the method of least square, whereby the component of coefficient k12 is automatically distributed to the other components.

Also, the deformation of FIG. 22f shows a case in which the reticle 214 is deformed in the specific Y-direction (+direction or−direction) as an quantity of deviation of the X coordinate from the center of the reticle increases. Then, as another correction method, the scanning exposure may be performed in a state in which the part of lens, constituting the projection optical system 216, is inclined around the axis parallel to the X-axis (non-scanning direction), that is, in the Y-direction (scanning direction).

Figure 23A:
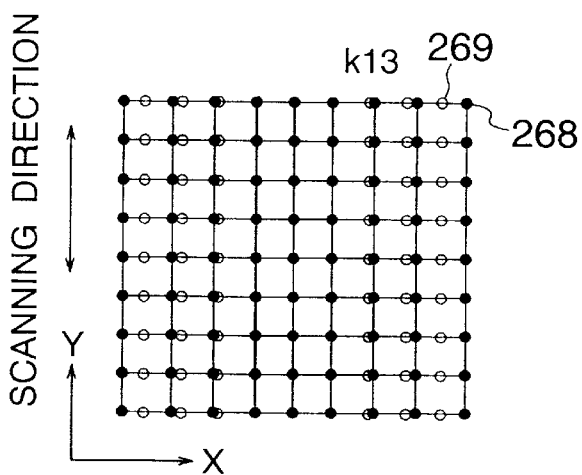
FIGS. 23a to 23f are a view showing an example of a thermal deformation of the reticle corresponding to coefficients k13 to k18.

FIG. 23a shows the deformation ($=k13 \cdot x^3$) corresponding to coefficient k13, and a change in magnification in the X-direction. This is different from the case of coefficient k3 in the point that the X-magnification 1 and X-magnification 2 are not proportional to each computing image height. This deformation can be corrected by performing the scanning exposure after driving the lens groups 236 to 240 to the direction of the optical axis and correcting each of the X-magnification 1 and X-magnification 2. The change in magnification is also generated in the Y-direction by the drive of the lens groups 236 to 240 to the direction of the optical axis, so that the contrast of the projection image is reduced. If this causes some trouble, it is better to start the exposure after changing the width of the aperture of the reticle blind 210 in the Y-direction and the quantity of exposure before the scanning exposure.

Figure 23B:
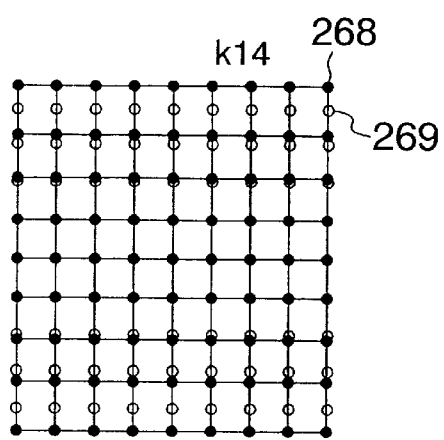

FIG. 23b shows the deformation ($=k14 \cdot y^3$) corresponding to coefficient k14, and a change in magnification in the Y-direction. This is different from the case of coefficient k4 in the point that the Y shift is not proportional to the Y coordinate. This deformation can be corrected by changing the scanning speed of the reticle 214 and the wafer 220 in accordance with the scanning position.

Figure 23C:
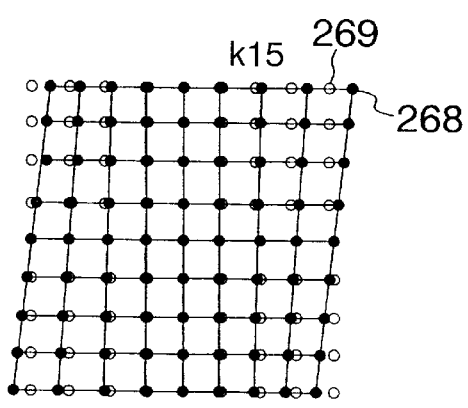

FIG. 23c shows the deformation ($=k15 \cdot x^2 \cdot y$) corresponding to coefficient k15. This is different from the case of coefficient k5 in the point that the X-magnification tilt 1 and X-magnification tilt 2 change. This deformation can be corrected by changing the tilt angle of each of the lens groups 236 to 240 to correct the X-magnification tilt 1 and X-magnification tilt 2 in accordance with the scanning position.

Figure 23D:
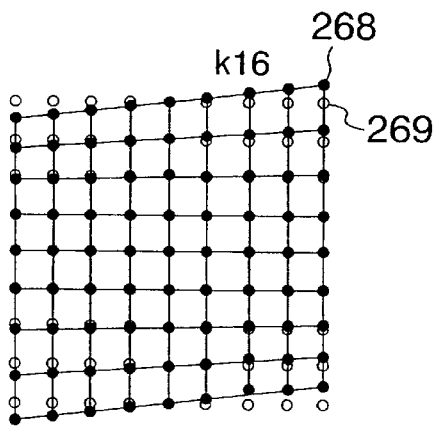

FIG. 23d shows the deformation ($=k16 \cdot y^2 \cdot x$) corresponding to coefficient k16. This is different from the case of coefficient k6 in the point that the quantity of rotation is not fixed. This deformation can be corrected by changing the relative parallelism between the reticle 214 and the wafer 220 in accordance with the scanning position.

Figure 23E:
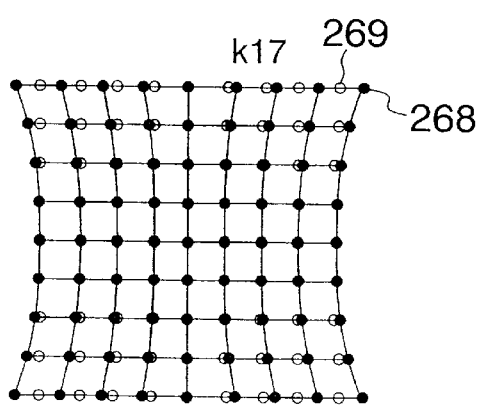

FIG. 23e shows the deformation ($=k17 \cdot x \cdot y^2$) corresponding to coefficient k17, and a pincushion distortion in the X-direction. This means that the X-magnification 1 and X-magnification 2 change in accordance with the Y coordinate. Therefore, this distortion can be corrected by driving the lens groups 236 to 240 in the direction of the optical axis to correct the magnification 1 and X-magnification 2 in accordance with the scanning position. The change in magnification is also generated in the Y-direction by the drive of the lens groups 236 to 240 to the direction of the optical axis, so that the contrast of the projection image is reduced. If this causes some trouble, it is better to start the exposure after changing the width of the aperture of the reticle blind 210 in the Y-direction and the quantity of exposure before the scanning exposure.

Figure 23F:
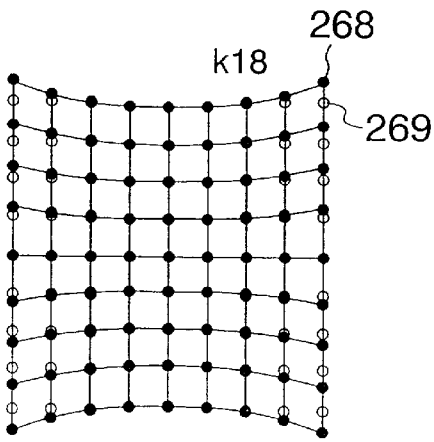

FIG. 23f shows the deformation ($=k18 \cdot y \cdot x^2$) corresponding to coefficient k18, and a pincushion distortion in the Y-direction. This cannot be expressed by the resolution of each component of the first embodiment. To correct this deformation, as one example, the other components are combined with each other to reduce the error as possible. For example, the error can be reduced by correcting the component of coefficient k4 and that of coefficient k14. In this case, the term of the coefficient k18 is deleted from equation (17) and the computation is performed by the method of least square, whereby the component of coefficient k18 is automatically distributed to the other components.

Also, the deformation of FIG. 23f shows a case in which the magnification in the Y-direction (scanning direction) enlarges as the quantity of deviation of the X coordinate from the center of the reticle increases. Then, as another correction method, the correction method of FIG. 22f is applied. Specifically, this the method in which the scanning exposure are performed while the tilt angle of the part of lens, constituting the projection optical system 216, to the Y-direction is continuously changed in accordance with the position of the reticle in the scanning direction. If the tilt angle of the lens is continuously changed, the position of the projection image on the wafer also changes. For this reason, it is preferable that the relative position between the reticle and the wafer be corrected in accordance with the position of the reticle in the scanning direction.

FIG. 24a shows the deformation (=k19·y$^3$) corresponding to coefficient k19, and a case in which the X shift is generated relatively at random in accordance with the scanning position. This deformation can be corrected by changing the relative position between the reticle 214 and the wafer 220 in the X-direction in accordance with the scanning position.

FIG. 24b shows the deformation (=k20·x$^3$) corresponding to coefficient k20, and a form such that the coefficient k19 is rotated at 90°. This cannot be expressed by the resolution of each component of the first embodiment. To correct this deformation, the other components are combined with each other to reduce the error as possible. For example, the error can be reduced by correcting the component of coefficient k5 and that of coefficient k16. In this case, the term of the coefficient k20 is deleted from equation (17) and the computation is performed by the method of least square, whereby the component of coefficient k20 is automatically distributed to the other components.

In the above embodiment, to correct a predetermined image formation characteristic of the projection optical system 216, the plane-parallel plates 235 and 241 are provided on the side of the reticle 214 and the side of the wafer 220 in the projection optical system 216, so that they can control the position in the Z direction (direction of the optical axis) and the tilt angle as shown in FIG. 8. The plane-parallel plates include a plate on which the surface is uneven. For this reason, the plane-parallel plate-like optical member, which is used to correct the image formation characteristic, that is, the plane-parallel plate-like optical member, having a microscopic asperity distribution (phase distribution) on its surfaces, apartially different index distribution, or some degree of local refraction power, is referred to as plane plate.

The use of the plane plate can correct the random variation (irregular variation) of the image formation characteristic as shown in the following points (a) to (j). The random variation of the image formation characteristic means the variation of the image formation characteristic, which is partially (locally) generated in the projection image. Actually, a plurality of kinds of plane plates is provided to be changeable. Then, the plane plate, which is suitable for canceling the variation of the image formation characteristic generated in accordance with the state of the thermal deformation state of the reticle, may be appropriately placed on the optical path of the light beam of the image formation. This can correct the variation of the image formation characteristic gradually changing.

(a) Partial Shift of Focal Position

This variation can be corrected by providing the plane plate having a partial refraction power at the outside of the projection optical system 216, for example, a portion between the projection optical system 216 and the reticle, or the wafer 220.

(b) Partial Horizontal Shift of Image

Formation Point (the same as substantially partial distortion)

This variation can be corrected by providing one plane plate or a plurality of plane plates whose tilt angle partially change at the outside of the projection optical system 216. In the case of using the plurality of plane plates, the deterioration of a telecentric property of the projection optical system 216 can be prevented.

(c) Partially Spherical Aberration

This variation can be corrected by providing the plane plate, which has a asperity distribution (namely, a shape imparting a phase difference) such as partially cancels the delay (or advance) of the wave surface of the illumination light, in the vicinity of the optical Fouier-transform surface (namely, pupil plane) with respect to the pattern surface of the reticle in the projection optical system 216. This variation can be also corrected by performing the processing for providing such a asperity distribution to the lens surface close to the pupil plane.

(d) Partially Coma Aberration

This variation can be corrected by providing the plane plate, which has a asperity distribution (namely, a shape imparting a phase difference) such as partially cancels the delay (or advance) of the wave surface of the illumination light, at the position away from the pupil plane in the projection optical system 216. This variation can be also corrected by performing the processing for providing such a microscopic asperity distribution to the lens surface close to the pupil plane.

(e) Image Surface Curvature at Sagital Image Surface

This variation can be corrected by providing the plane plate, which has partially the refraction power distribution to the sagital direction, at the outside of the projection optical system 216.

(f) Image Surface Curvature at Meridional (Tangential) Image Surface

This variation can be corrected by providing the plane plate, which has partially the refraction power distribution to the meridional (tangential) direction, at the outside of the projection optical system 216.

(g) Partial Distortion

This variation can be corrected by providing one plane plate or the plurality of plane plates whose tilt angle partially change at the outside of the projection optical system 216. In the case of using the plurality of plane plates, the deterioration of the telecentric property of the projection optical system 215 can be prevented.

(h) Partially Vertical Color Aberration

This variation can be corrected by using optical material (glass material) having a partially different dispersion (Abbe number) or providing the plane plate manufactured using optical material having a partially different refraction power distribution at the outside of the projection optical system 216.

(i) Partially Horizontal Color Aberration

This variation can be corrected by using optical material having a partially different dispersion (Abbe number) or providing the plane plate manufactured using optical material having a partially different refraction power distribution in the outside of the projection optical system 216.

(j) Partial collapse of Telecentric Property

This variation can be corrected by providing one plane plate or the plurality of plane plate whose tilt angle partially change plates at the outside of the projection optical system 216. In the case of using the plurality of plane plates, it is possible to have no unfavorable influence upon the distortion of the projection image (horizontal shift of the image formation point).

The aforementioned embodiment explained the thermal deformation of the reticle 214. However, the present invention may be applied to a case in which the wafer 220 is distorted, and a case in which the distortion characteristic of the previous exposure apparatus is distorted at a superposing exposure time. Also, the present invention may be applied to a case in which an anisotropic distortion is generated in the projection optical system 216. In this case, the correction may be carried out such that the error is totally reduced in view of the quantity of the thermal deformation of the reticle

214, the variation in the irradiation of the projection optical system 216, the distortion of the wafer 220, and the distortion characteristic of the previous exposure apparatus.

In the above-mentioned embodiment, the projection exposure apparatus of the step and scan system is used as the exposure apparatus. However, the correction of the image formation characteristic in accordance with the quantity of the thermal deformation of the reticle can be applied to a case in which the full-filed type projection exposure apparatus, that is, steppers, is used as the exposure apparatus.

According to the second and third embodiments, at least one of the positions of at least one of optical elements of the projection optical system in the optical axis direction, the tilt angle of at least one of the optical elements thereof in the optical axis direction, the relative scanning speed of the mask and substrate, and the parallelism of the mask and the substrate in the scanning direction is adjusted, and this brings about an advantage in which the image characteristic can be corrected with a high precision. As a result, the pattern image of the mask can be transferred onto the substrate with a high accuracy.

Also, the variation of the image formation characteristic due to the thermal deformation of the mask is independently corrected with respect to the component in the scanning direction and the component in the non-scanning. The variation of the image formation characteristic due to the thermal deformation of the mask can be corrected with a high precision.

Moreover, the quantity of heat absorption of the mask is obtained based on the thermal deformation of the mask. As a result, the quantity of the thermal deformation of the mask can be correctly obtained. Also, the quantity of the thermal deformation of the mask is obtained in consideration of the thermal movement generated outside the pattern region of the mask. As a result, the quantity of the thermal deformation of the mask, and the change in the image formation characteristic due to the thermal deformation can be obtained with a high precision, and the image formation characteristic can be corrected with a high precision based thereon.

Furthermore, in accordance with the difference in the change of the magnification between the scanning direction of the image of the pattern of the mask formed on the substrate and the non-scanning direction thereof, the blind mechanism is driven so as to adjust the width of the illumination region. As a result, the contrast of the projection image as the image formation characteristic can be corrected with a high accuracy.

Also, the irradiation quantity of the exposure light source is measured through the light transmission window on the mask stage by the irradiation sensor so as to obtain the transmission rate of the projection optical system. For this reason, the change of the image formation characteristic of the projection optical system due to the exposure light absorption can be obtained without being influenced by the mask, so that the image formation characteristic can be corrected with a high precision.

Further, in a case where two light transmission windows are located interposing the mask therebetween to be separate from each other in the moving direction of the mask, the light transmission windows can be moved into the illumination region as continuing the scanning even if the mask is scanned in either of the normal and opposite directions of the scanning direction. As a result, the throughput is not reduced.

Furthermore, the plurality of optical elements of the projection optical system is independently driven, so that the image formation characteristic of the projection optical system can be corrected. Also, the first plane-parallel plate, provided on the substrate side of the projection optical system, is driven, so that a predetermined image formation characteristic can be corrected with a high precision.

Also, when the second plane-parallel plate, provided on the mask side of the projection optical system, is given unevenness by a predetermined processing, the distortion generated by the manufacture error of the optical elements of the projection optical system can be corrected with a high accuracy.

Moreover, by driving the first plane-parallel plate every time when at least one of the size and shape of the secondary light source is changed, the decentration coma aberration of the projection optical system can corrected according to the size and shape of the secondary light source.

Furthermore, in a case where the ArF excimer laser is used as the exposure light source and the atmosphere within the projection optical system is substituted with nitrogen gas or inert gas, ozone can be prevented from being generated by the reaction of oxygen. Also, the transmission rate to the exposure light can be improved.

Also, in the case of measuring the atmosphere within the projection optical system, the image formation characteristic of the projection optical system can be corrected at a higher precision based on the measuring result.

Next, according to the projection exposure apparatus of the second and third embodiment, the first plane-parallel plate is moved, so that the decentration coma aberration of the projection optical system can be adjusted. Also, at least one of the plurality of optical elements is moved without moving the second plane-parallel plate toward the mask, whereby at least one of the aberration of the projection optical system other than the decentration coma aberration, the projection magnification and the focal position can be adjusted.

Moreover, in the case of moving at least three to five optical elements of the projection optical system, three to five image formation characteristics of the projection optical system can be corrected, respectively.

Further, by the adjusting apparatus for changing the refractive index at least one of the plurality of spaces formed by the mask and the plurality of optical elements, the predetermined image formation characteristic can be corrected by a simple control.

Also, the illumination optical system can change at least one of the shape and size of the secondary light source in accordance with the mask pattern. Then, when at least one of the plurality of optical elements and the first plane-parallel plate is driven for each change, the image formation characteristic can be corrected according to the illumination condition.

Moreover, if the atmosphere within the projection optical system is measured and at least one of the plurality of optical elements and the first plane-parallel plate is moved according to the change in the atmosphere, the image formation characteristic of the projection optical system can be corrected at a higher precision.

Furthermore, the decentration coma aberration of the projection optical system or the asymmetrical aberration can be adjusted by the first plane-parallel plate or the second plane-parallel plate.

In the aforementioned embodiment, ultraviolet rays whose wavelength is more than 100 nm, far ultraviolet rays (DUV) such as g rays, i rays, and a KrF excimer laser, and vacuum ultraviolet rays (VUV) such as an ArF excimer laser and an $F_2$ laser (wavelength of 157 nm) may be used as illumination light for exposure. It should be noted that a high harmonic wave of a YAG laser is used.

Moreover, there may used a harmonic wave in which a single wavelength laser of an infrared area or a visible area, which is generated from a DFB semiconductor laser or a fiber laser, is amplified by a fiber amplifier doped with erbium (or both erbium and yttrium) and wavelength converted to ultraviolet rays using non-linear optical crystal.

For example, if the oscillation wavelength of the single wave laser is within the range of 1.51 to 1.59 μm, an eight-times high harmonic wave whose generated wavelength ranges from 189 to 199 nm, or a ten-times high harmonic wave whose generated wavelength ranges from 151 to 159 nm is output. Particularly, if the oscillation wavelength of the single wave laser is within the range of 1.544 to 1.553 μm, the eight-times high harmonic wave whose generated wavelength ranges from 193 to 194 nm, that is, the ultraviolet rays having substantially the same wavelength as the ArF excimer laser can be obtained. Then, if the oscillation wavelength of the single wave laser is within the range of 1.57 to 1.58 μm, the ten-times high harmonic wave whose generated wavelength ranges from 157 to 158 nm, that is, the ultraviolet rays having substantially the same wavelength as the $F_2$ laser can be obtained.

Moreover, if the oscillation wavelength of the single wave laser is within the range of 1.03 to 1.12 μm, a seven-times high harmonic wave whose generated wavelength ranges from 147 to 160 nm is output. Particularly, if the oscillation wavelength of the single wave laser is within the range of 1.099 to 1.106 μm, the seven-times high harmonic wave whose generated wavelength ranges from 157 to 158 nm, that is, the ultraviolet rays having substantially the same wavelength as the $F_2$ laser can be obtained. It should be noted that ytterbium doped fiber laser is used as the single wavelength oscillation laser.

It is of course that the wavelength of illumination light for exposure of the above embodiment is not limited to more than 100 nm. For example, in order to expose the pattern of less than 70 nm, SOR or the plasma laser is used as a light source and an EUV (Extreme Ultra Violet) of a soft X-ray area (e.g., wavelength area of 5 to 15 nm) is generated. Also, there has been developed an EUV exposure apparatus using an all reflection reduction optical system, which is designed based on the exposure wavelength (e.g., 13.5 nm), and a reflection typed mask. In this apparatus, since the structure in which the mask and the wafer are synchronously scanned using a circular illumination to perform the scanning exposure can be taken into consideration, such an apparatus is also included in the range to which the present invention is applied.

Also, the present invention can be also applied to an exposure apparatus using electron beams or charged particle beams such as ion beams. In an electron beam exposure apparatus, lanthanum hexaborate of a thermal electron radiation type ($LaB_6$) and tantalum (Ta) can be used as an electron gun. It should be noted that any of a pencil beam system, a variable form beam system, a cell projection system, a blanking aperture array system and a mask projection system may be used as the electron beam exposure apparatus. The mask projection system will be explained as follows. Specifically, a circuit pattern is resolved and formed on a large number of sub-fields of about 250 nm square separated from each other on the mask. Then, the electron beams are sequentially shifted in the first direction, and the wafer is relatively moved to the electron optical system for reduction projecting the resolved pattern in synchronous with the movement of the mask in the second direction perpendicular to the first direction. Then, reduced images of the resolved pattern are combined with each other on the wafer so as to form a combined pattern.

In the aforementioned embodiment, the reduction projection exposure apparatus (scanning stepper) of the step and scan type was used. However, there may be used a reduction projection exposure apparatus (stepper) of a step and repeat type in which the operation of transferring the pattern of the reticle onto the wafer through the projection optical system is repeated in a state that the reticle and the wafer remain at rest. Or, the present invention can be applied to a mirror projection aligner.

Also, not only the reduction system but also an equivalent system, or an enlargement system (e.g., exposure apparatus for a liquid crystal display manufacture, etc.) may be used as the projection optical system. Further, any of a dioptric system, a reflecting optical system, and a cata-dioptric system may be used as the projection optical system. It should be noted that kinds of glass material usable as the optical element (refraction element) and coating material are limited by the wavelength of the illumination light for exposure, and that the manufacturable maximum diameter differs for each glass material. Due to this, the exposure wavelength decided from the specification of the exposure apparatus, its wavelength width (narrow-band width), the field size of the projection optical system, and the number of apertures are taken into consideration, and any one of the dioptric system, reflecting optical system, and cata-dioptric system is selected.

Generally, if the exposure wavelength is more than about 190 nm, synthetic quartz and fluorite can be used as glass material. Therefore, the dioptric system can be relatively easily adopted, to say nothing of reflecting optical system and cata-dioptric system. Also, in the vacuum ultraviolet rays whose wavelength is less than about 200 nm, the dioptric system can be used, depending on the wavelength width implemented in a narrow-band form. However, in the case of the wavelength of less than about 190 nm, there is no suitable glass material other than fluorite and it is difficult for the wavelength to be implemented in a narrow-band form. For this reason, it is advantageous to use the reflecting optical system and the cata-dioptric system. Moreover, in the EUV rays, the catoptric system comprising only a plurality of reflection elements (e.g., about 3 to 6) is adopted. It should be noted that an electron optical system, comprising an electron lens and a deflector, is used in the electron beam exposure apparatus. Also, in the illumination light for exposure, the optical path is filled with gas (inert gas such as nitrogen, helium) reducing its damping. Or the optical path is vacuumized. In the EUV rays or the electron beams, its optical path is vacuumized.

Moreover, the present invention can be applied to the exposure apparatus, which is used in the manufacture of a display including a liquid crystal display device, for transferring a device pattern onto a glass plate. Also, the present invention can be applied to the exposure apparatus, which is used in the manufacture of a thin film magnetic head, for transferring the device pattern onto a ceramic wafer, and the exposure apparatus, which is used in the manufacture of a charge-coupled device (CCD).

Furthermore, the present invention can be applied to the exposure apparatus for transferring a circuit pattern onto a glass substrate or a silicon wafer to manufacture the reticle or the mask. Here, in the exposure apparatus, which is used in the DUV rays and the VUV rays, a transmission type reticle is generally used, and quartz glass, quartz glass doped with fluorine, fluorite or quartz crystal is used as a reticle substrate. Also, in the EUV exposure apparatus, the reflection type mask is used. In the X-ray exposure apparatus of a proximity system or the electron beam exposure apparatus of the mask projection system, a transmission type mask (stencil mask, membrane mask) is used. As a mask substrate, a silicon wafer is used.

The illumination optical system, comprising a plurality of lenses and the projection optical system are incorporated into the main body of the exposure apparatus so as to perform the optical adjustment. Then, the reticle stage, comprising a large number of mechanical parts, and the wafer stage are attached to the main body of the exposure apparatus so that the connection of the wiring and that of the piping are established. Then, the total adjustment (electrical adjustment, operation confirmation, etc.) is further performed. As a result, the exposure apparatus of the aforementioned embodiments can be manufactured. The manufacture of the exposure apparatus is desirably carried out in a clean room where the temperature and the degree of cleanness are controlled.

Moreover, the semiconductor device is manufactured through the step of performing the function and performance design of the device, the step of manufacturing the reticle based on the design step, the step of preparing the wafer from silicon material, the step of exposing the pattern of the reticle onto the wafer by the exposure apparatus of the above-mentioned embodiment, the step of assembling the device (including dicing process, bonding process, packaging process), and the inspection step.

Thus, the present invention is not limited to the aforementioned embodiments, and various modifications can be made without departing form the scope of the general inventive concept as defined by the appended claims and their equivalents.

What is claimed is:

1. An exposure method which projects a pattern formed on a mask on a substrate via a projection lens system including plural optical elements to expose the substrate, comprising:
   changing an exposure condition at a time when exposure of said pattern onto said substrate is effected;
   moving a predetermined plane-parallel plate according to said changed exposure condition to correct a decentration coma aberration of said projection lens system.

2. A method according to claim 1, wherein said predetermined plane-parallel plate is moved in a direction parallel to an optical axis of said projection lens system and/or is inclined to a plane perpendicular to the optical axis.

3. A method according to claim 1, wherein said projection lens system is provided between said mask and said substrate and said predetermined plane-parallel plate is disposed on a substrate side of said projection lens system.

4. A method according to claim 1, wherein said predetermined plane-parallel plate is provided in a projection optical unit having said projection lens system.

5. A method according to claim 2, wherein when said plane-parallel plate is inclined to the plane perpendicular to the optical axis of said projection lens system, inclination angle and/or inclination direction is adjusted.

6. A method according to claim 1, wherein the exposure condition includes at least one of an illumination condition for illuminating the substrate, a sort of pattern on the mask, and a numerical aperture of said projection lens system.

7. A method according to claim 1, wherein the change of exposure condition includes a change of light intensity distribution on a pupil plane of said projection lens system.

8. A method according to claim 7, wherein said light intensity distribution is changed by changing a size or shape of a secondary light source.

9. A method according to claim 1, further comprising:
   correcting an image characteristic different from said decentration coma aberration by moving at least one of the plural optical elements of said projection lens system.

10. A method according to claim 9, wherein said at least one of the plural optical elements is shifted in a direction parallel to the optical axis of said projection lens system and/or inclined to a plane perpendicular to the optical axis.

11. A method according to claim 1, further comprising:
    correcting an image characteristic different from said decentration coma aberration by moving a second plane-parallel plate provided in addition to said predetermined plane-parallel plate.

12. A method according to claim 11, wherein said second plane-parallel plate has a partially different optical characteristic.

13. A method according to claim 12, wherein said second plane-parallel plate includes plural plane-parallel plates each having a different optical characteristic, and said plural plane-parallel plates are interchanged in response to a change of illumination condition.

14. A method according to claim 12, wherein said second plane-parallel plate is provided with unevenness on a surface thereof.

15. A method according to claim 11, wherein a position of said second plane-parallel plate changes in accordance with projection magnification.

16. A method according to claim 15, wherein said second plane-parallel plate is disposed on a mask side of said projection lens system when said projection lens system exhibits reducing projection, and said second plane-parallel plate is disposed on a substrate side of said projection lens system when said projection lens system exhibits magnifying projection.

17. A method according to claim 12, wherein said second plane-parallel plate is provided inside said projection lens system and includes at least one of a plate having a form giving partially different phase distribution, a plate having partially different dispersion power, and a plate having partially different index distribution.

18. A method according to claim 17, wherein said plate having a form giving partially different phase distribution is disposed adjacent to said projection lens system.

19. A method according to claim 12, wherein said second plane-parallel plate is provided outside said projection lens system.

20. A method according to claim 19, wherein said second plane-parallel plate includes at least one of a plate having partial refraction power distribution, a plate having partially changed inclination angle, a plate having partial refraction power distribution regarding a meridional direction, a plate having partially different dispersion, and a plate having partially different refractive index distribution.

21. A method according to claim 19, wherein said second plane-parallel plate is disposed between said mask and said projection lens system, or disposed between said projection lens system and said substrate.

22. A method according to claim 1, further comprising:
    obtaining a change in image characteristic based on a detection result from an environmental sensor detecting temperature, humidity, and pressure, and
    obtaining a correction quantity to correct the obtained change.

23. A method according to claim 1, further comprising:
    adjusting a pressure within said projection lens system, thereby correcting an image characteristic different from the decentration coma aberration corrected by said predetermined plane-parallel plate.

24. A method according to claim 1, further comprising:
correcting an image characteristic different from the decentration coma aberration corrected by said predetermined plane-parallel plate by movement of said mask.

25. A method according to claim 24, wherein said mask is shifted to a direction parallel to the optical axis of said projection lens system and/or is inclined to a plane perpendicular to the optical axis.

26. A method according to claim 1, wherein said pattern is projected on said substrate to expose said substrate while simultaneously moving said mask and said substrate.

27. A method for manufacturing a micro-device that includes transferring said pattern on said substrate in accordance with the exposure method of claim 1.

28. An exposure method which projects a pattern formed on a mask on a substrate via a projection optical system to expose the substrate, comprising:
changing light intensity distribution on a pupil plane of said projection lens system; and
moving a plane-parallel plate in response to the change of said light intensity distribution.

29. A method according to claim 28, wherein said changing of said light intensity distribution is performed by changing at least one of a size and shape of a secondary light source.

30. A method according to claim 29, wherein the changing of said secondary light source is performed in accordance with said pattern on said mask.

31. A method according to claim 29, wherein the moving of said plane-parallel plate includes inclining said plane-parallel plate relative to an optical axis of said projection optical system without substantially rotating said plane-parallel plate.

32. A method according to claim 28, wherein said pattern is projected to expose said substrate while synchronously driving said mask and said substrate simultaneously.

33. A method for manufacturing a micro-device including transferring said pattern on said substrate in accordance with the exposure method of claim 28.

34. An exposure method which projects a pattern formed on a mask on a substrate to expose said substrate by relatively scanning said mask and said substrate, characterized by
obtaining a change by heat in an image of said pattern formed on said substrate, and
controlling relative speed during relative scan of said mask and said substrate, relative position of said mask and said substrate on a scanning plane of said substrate which plane is a conjugate plane of a scanning plane of said mask, and relative rotation quantity of said mask and said substrate, based on said change in the image.

35. A method according to claim 34, wherein plural shot regions on said substrate are sequentially exposed and
said relative speed, said relative position, and said relative rotation quantity are controlled at each shot region based on said change of the image.

36. A method according to claim 34, wherein said change of the image includes a change in a scanning direction in case of the relative scan.

37. A method according to claim 34, wherein said relative position includes a relative position in a non-scanning direction approximately perpendicular to a scanning direction of said substrate on the scanning plane.

38. A method according to claim 37, wherein the control of said relative position includes adjustment of said relative position in said non-scanning direction by predetermined amount.

39. A method according to claim 34, wherein said relative position includes a relative position in a scanning direction of said substrate on the scanning plane.

40. A method according to claim 39, wherein the controlling operation of said relative position includes adjustment of said relative position of said mask and said substrate in said scanning direction of said substrate on the scanning plane by a predetermined amount.

41. A method according to claim 34, wherein the controlling includes adjustment of relative parallelism of said mask and said substrate.

42. A method according to claim 34, wherein the controlling includes relative inclination regarding a scanning axis of said mask and a scanning axis of said substrate.

43. A method according to claim 34, wherein the controlling is performed in accordance with a position in a scanning direction of said relative scan.

44. A method according to claim 43, wherein a position in said scanning direction includes a scanning position of said mask.

45. A method according to claim 34, wherein the pattern on said mask is projected by a projection optical system, said change in the image includes a change in the image in a non-scanning direction approximately perpendicular to a scanning direction of said relative scan, and further comprising:
changing relative distance between an image plane of said projection optical system and said substrate so as to correct said change of the image in said non-scanning direction.

46. A method according to claim 45, wherein the changing of said relative distance is performed by moving at least one of optical elements of said projection optical system.

47. A method according to claim 46, wherein the moving includes movement of at least one of the optical elements in a direction parallel to an optical axis of said projection optical system.

48. A method according to claim 46, wherein the moving includes inclination of the at least one of the optical elements to a plane perpendicular to an optical axis of said projection optical system.

49. A method according to claim 48, further comprising
controlling an illumination region illuminated on said mask; and
controlling exposure quantity on said substrate during said relative scan.

50. A method according to claim 49, wherein width of said illumination region in said scanning direction is controlled in accordance with the pattern formed on said mask.

51. A method according to claim 49, wherein the controlling of the exposure quantity includes reduction of scanning speed of said mask and said substrate while keeping a predetermined speed ratio.

52. A method according to claim 49, wherein the controlling of the exposure quantity includes control of an illumination source emitting a illumination beam illuminating said mask.

53. A method according to claim 52, wherein said illumination source includes a pulse light source emitting pulse light and the control of the illumination source includes control of an oscillating frequency of said pulse light.

54. A method according to claim 48, further comprising:
inclining a plane-parallel plate disposed on a substrate side of said projection optical system to correct a coma aberration.

55. A method according to claim 48, further comprising:
changing relative parallelism of said mask and said substrate to correct astigmatism.

56. A method according to claim 45, wherein the changing of relative distance is performed in accordance with a position in said scanning direction.

57. A method according to claim 56, wherein said position in said scanning direction includes scanning position in said scanning direction.

58. A method according to claim 34, wherein timing to obtain the change of said image and/or timing of said controlling depends on a presence rate of the pattern formed on said mask.

59. A method for manufacturing a device including transferring said pattern on said substrate in accordance with the exposure method of claim 34.

60. An exposure method which projects a pattern formed on a mask on a substrate by a projection optical system, characterized by:
sensing an illumination beam through said projection optical system and an illumination transmission part formed on a mask stage holding said mask and formed on a different area from an area corresponding to a pattern area of the mask;
sensing an illumination beam irradiating said mask stage; and
obtaining a characteristic of said projection optical system based on a result of both said sensing.

61. A method according to claim 60, wherein said characteristic includes transmittance.

62. A method according to claim 60, further comprising:
moving said mask and said substrate synchronously to scan expose said substrate by said illumination beam irradiating said mask.

63. A method according to claim 57, wherein said illumination transmission part includes apertures disposed along a scanning direction of said mask.

64. A method for manufacturing a micro-device by transferring said pattern on said substrate in accordance with the exposure method of claim 60.

65. A method according to claim 60, characterized by detecting a characteristic of said illumination beam passing through said projecting optical system without being influenced by a transmittance of said mask by detecting said illumination beam through said illumination transmission part.

66. A method according to claim 65, characterized by detecting a change of image forming characteristic of said projection optical system based on a characteristic of said illumination beam detected.

67. An exposure method which projects a pattern on a mask on a substrate through a projection optical unit including a projection lens system, comprising:
sensing environmental conditions inside and outside the said projection optical unit by sensors provided inside and outside said projection optical unit; and
obtaining a change in an image formation characteristic of said projection lens system based on said environmental conditions sensed.

68. A method according to claim 67, wherein
said projection lens system includes plural optical elements and
regarding optical elements out of said plural optical elements, which is disposed on edge portions, said image formation characteristic is obtained based on an output of said outside sensor, and regarding other optical elements, said image formation characteristic is obtained based on an output of said inside sensor.

69. A method according to claim 67, wherein said environmental condition includes atmospheric pressure, temperature, and humidity.

70. A method according to claim 67, wherein at least a portion of said projection lens system is moved so as to cancel the obtained change in the image formation characteristic.

71. A method according to claim 67, wherein said pattern is projected on said substrate to expose said substrate while synchronously moving said mask and said substrate.

72. A method for manufacturing a micro-device by transferring said pattern on said substrate in accordance with the exposure method of claim 67.

73. A projection exposure method which transfers an image of a pattern on a mask to a substrate through a projection optical system while synchronously moving said mask and said substrate, comprising
driving a variable field diaphragm which defines an illumination region of said mask, in accordance with a difference of a magnification change between said pattern image of said mask in a scanning direction and that in a non-scanning direction, and thereby correcting a contrast of said pattern image; and
scanning to expose said substrate by illumination light irradiated on said mask.

74. A projection exposure method which transfers a pattern on a mask to a substrate through a projection optical system, comprising
driving a plurality of optical elements of said projection optical system independently from each other, thereby correcting an image formation characteristic of said projection optical system; and
driving a first plane-parallel plate in an optical axis direction, which is disposed on a substrate side of said projection optical system, thereby correcting a predetermined image formation characteristic.

75. A method according to claim 74, wherein said projection optical system comprises a second plane-parallel plate on a mask side of said projection optical system, the second plane-parallel plate having a surface subjected to a roughening treatment and serving to correct a residual component of an aberration of said projection optical system.

76. A method according to claim 74, wherein said mask is illuminated by a light beam from a secondary light source, and a decentration coma aberration of said projection optical system is corrected by driving said first plane-parallel plate every time when at least one of a size and shape of said secondary light source is changed.

77. A method according to claim 74, wherein said mask is illuminated by illumination light of a wavelength of 200 nm or less, and inert gas or nitrogen gas is supplied into said projection optical system.

78. A method according to claim 77, wherein said illumination light is an ArF excimer laser beam or an $F_2$ laser beam.

79. A method according to claim 74, wherein an ambient pressure within said projection optical system is measured, and an image formation characteristic of said pattern image is adjusted based on a measurement result.

80. An exposure method which illuminates a mask by a beam from a illumination system and forms an image of a pattern formed on the mask on a photosensitive substrate to transfer the pattern to said photosensitive substrate, comprising:

receiving a beam from said illumination system by a sensor provided on a mask stage holding said mask, said sensor generating a signal according to a characteristic of said beam on said photosensitive substrate in response to receipt of said beam; and detecting information relating to a deformation of said image of the pattern formed on said photosensitive substrate based on said signal according to said characteristic of said beam.

81. A method according to claim 80, further comprising:

deforming said image of the pattern on said photosensitive substrate based on said information relating to the deformation of said image of the pattern formed on said photosensitive substrate.

82. A method according to claim 81, wherein said information relating to the deformation of said image of the pattern formed on said photosensitive substrate is information relating to a thermal deformation quantity.

83. A method according to claim 82, further comprising:

obtaining information relating to a presence rate of the pattern on said mask; and deforming said image of the pattern formed on said photosensitive substrate based on the obtained information relating to the presence rate of the pattern on said mask and the information relating to a thermal deformation quantity.

84. A method according to claim 82, further comprising:

obtaining information relating to a reflectance of said mask; and deforming said image of the pattern formed on said photosensitive substrate based on the obtained information relating to the reflectance of said mask and the information relating to a thermal deformation quantity.

85. A method according to claim 80, wherein said sensor is an illuminance sensor generating a signal according to an illuminance of the beam from said illumination system on said mask stage.

86. An exposure method according to claim 34, wherein the pattern formed on said mask is exposed onto said substrate by relatively scanning said mask and said substrate in synchronization with respect to an exposure beam, being characterized in that:

said heat is generated by said exposure beam.

87. An exposure method according to claim 34, wherein said change of said pattern image is generated by thermal deformation of said mask.

88. An exposure method which transfers a pattern in which a mask and a substrate are relatively scanned and said mask is illuminated under a predetermined illumination condition, whereby the pattern formed on said mask is transferred onto said substrate, comprising:

obtaining a change in an image of said pattern on said substrate in accordance with said illumination condition; and controlling relative speed of said mask and said substrate during relative scanning of said mask and said substrate, relative position of said mask and said substrate on a scanning plane of said substrate that is a conjugate plane of a scanning plane of said mask, and relative rotation quantity of said mask and said substrate, based on said change in the image.

89. An exposure method according to claim 88, wherein the change in the image of said pattern is obtained, based on said illumination condition and an existence ratio of the pattern on said mask.

90. An exposure method according to claim 89, wherein an amount of thermal deformation of said mask is obtained, based on said illumination condition and said pattern existence ratio on said mask; and the change in the image of said pattern is obtained, based on the amount of the thermal deformation of said mask.

91. An exposure method according to claim 90, wherein the amount of the thermal deformation of said mask is obtained, based on said illumination condition, said pattern existence ratio on said mask and a reflective index of said mask.

* * * * *